United States Patent
Fukui et al.

[11] Patent Number: 5,943,486
[45] Date of Patent: Aug. 24, 1999

[54] COMPACTION METHOD, COMPACTION APPARATUS, ROUTING METHOD AND ROUTING APPARATUS

[75] Inventors: Masahiro Fukui; Noriko Shinomiya, both of Osaka, Japan

[73] Assignee: Matsushita Electric Industrial Co.,Ltd., Osaka, Japan

[21] Appl. No.: 08/752,413

[22] Filed: Nov. 19, 1996

[30] Foreign Application Priority Data

Nov. 21, 1995 [JP] Japan ..................................... 7-302897
Mar. 6, 1996 [JP] Japan ..................................... 8-048585
Apr. 19, 1996 [JP] Japan ..................................... 8-098213

[51] Int. Cl.$^6$ .................................................. H01L 21/98
[52] U.S. Cl. .................................. 395/500.1; 395/500.13
[58] Field of Search .................................. 364/488, 489, 364/490, 491

[56] References Cited

U.S. PATENT DOCUMENTS 4,630,219  12/1986  DiGiacomo et al. ................... 364/488
5,363,313  11/1994  Lee ......................................... 364/491
5,598,344   1/1997  Dangelo et al. ........................ 364/489
5,625,568   4/1997  Edwards et al . ...................... 364/491

FOREIGN PATENT DOCUMENTS 63-66675  3/1988  Japan .

OTHER PUBLICATIONS

H. Shin et al., "Two–Dimensional Compaction By 'Zone Refining'", 23rd Design Automation Conference, paper 7.3, pp. 115–122.

*Primary Examiner*—Kevin J. Teska
*Assistant Examiner*—Thuan Do
*Attorney, Agent, or Firm*—McDermott, Will & Emery

[57] ABSTRACT

Elements such as a transistor having a terminal corresponding to a wire junction are abstracted by using rectangles, and a spit penetrating these rectangles is introduced in a layout area where the rectangles are disposed. On the spit, a wire junction for allocating a wire is provided. The terminals of the rectangles corresponding to the wire junctions and the wire junctions on the spit are set as net targets, and connection information on these net targets is generated. A scan line for scanning the layout area from its left end to its right end and a front for tracing the net targets are introduced. While conducting rightward scanning by the scan line, the front is proceeded from one net target to the other net target. The trace of the front is provided as a wire element.

22 Claims, 41 Drawing Sheets

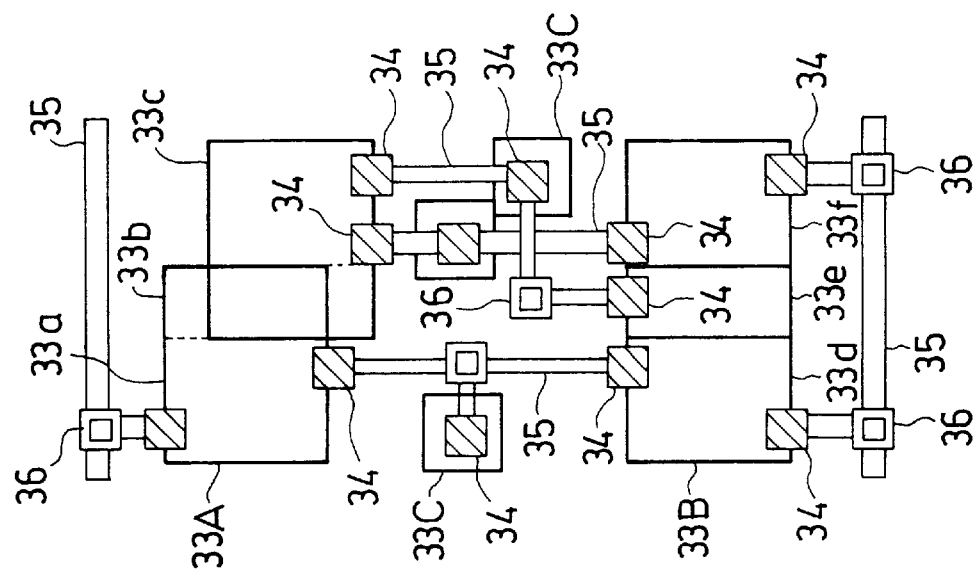
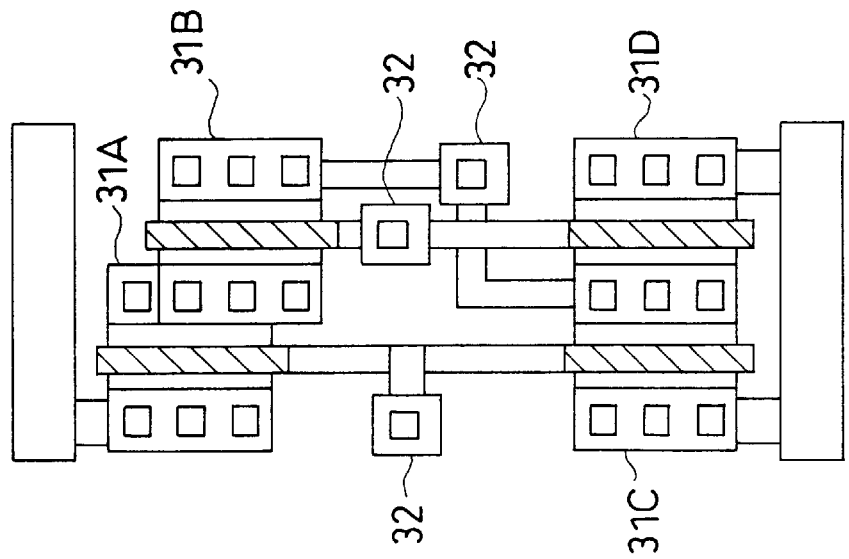

Fig. 13(a)      Fig. 13(b)
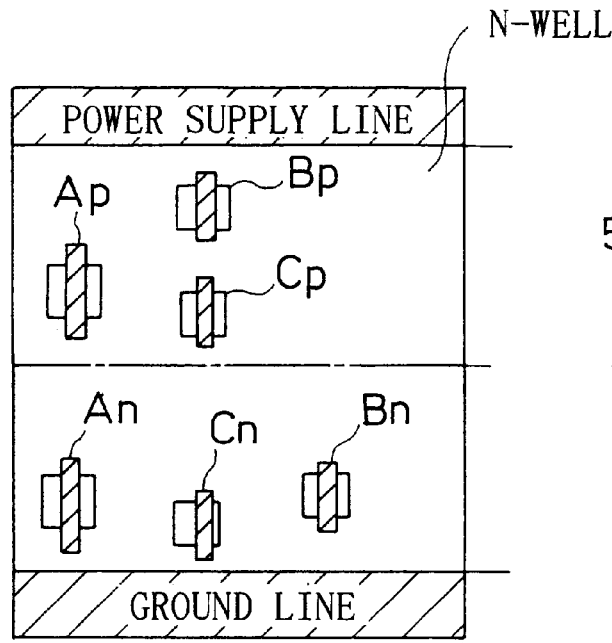
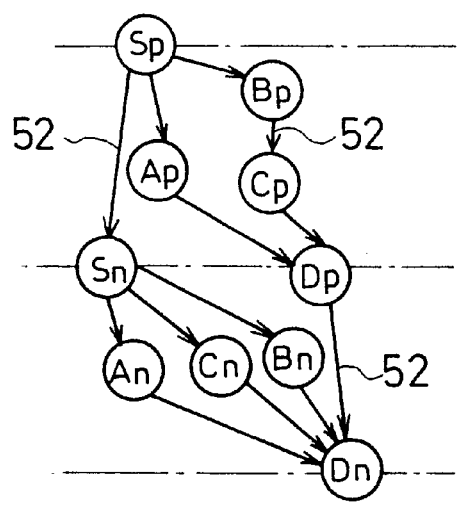
Fig. 13(c)
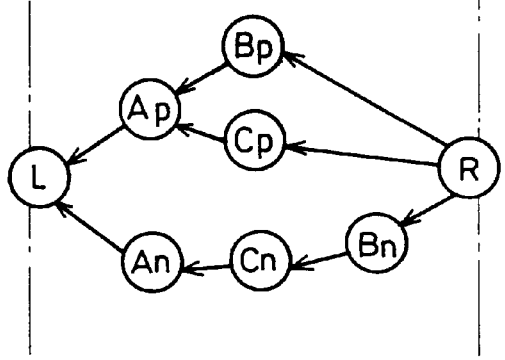

Fig. 26

| No. | TYPE | DEFORMABILITY | FIGURE TYPE |
|---|---|---|---|
| 1 | DIFFUSION LEFT END | DEFORMABLE | LINE |
| 2 | DIFFUSION RIGHT END | DEFORMABLE | LINE |
| 3 | GATE LEFT END | DEFORMABLE | LINE |
| 4 | GATE RIGTH END | DEFORMABLE | LINE |
| 5 | DIFFUSION CONTACT | UNDEFORMABLE | RECTANGLE |
| 6 | UPPER LAYER WIRE | UNDEFORMABLE | RECTANGLE |

COMPACTION METHOD, COMPACTION APPARATUS, ROUTING METHOD AND ROUTING APPARATUS

BACKGROUND OF THE INVENTION

The present invention relates to layout compaction method and apparatus for a leaf cell of an LSI, such as a standard cell and a cell for a data path module, for use in an LSI such as a CMOS LSI.

Recent development of automated manufacturing system for semiconductor LSIs has provided system designers with freedom in selecting a manufacturing foundry, namely, a system designer or a design vendor can select a manufacturing foundry which provides a process technique with highest performance at a lowest cost on the basis of common design data. Accordingly, a difference in the process techniques between the foundries is directly linked with an order-receiving competition for LSIs, and hence the open competition in the process techniques has become more and more intensified.

Such an intensified competition in the process techniques accelerates the development of the process techniques, and in addition, high performance system design can be developed aiming at a process technique which is being put to practical use in the near future. Moreover, design rules have been more and more complicated since the start of a deep-submicron age, so that the necessary number of design rules was approximately 30 five year ago but now is 100 or more, and each of such many rules affects the manufacturing cost and yield. Therefore, it has become more and more difficult to determine design rules at an initial stage of the manufacture. These facts affect the development of a leaf cell of an LSI such as a standard cell and a cell for a data path module as follows:

1) As a result of intensified change of the process techniques, a frequency of designing cell libraries is remarkably increased. Five years ago, one series of libraries is developed per two years, but recently the frequency is increased so that one series of libraries is developed per half a year. In addition, the number of cells included in each library has substantially doubled as compared with that of five years ago.

2) In order to develop and provide a cell in a short period of time, it is necessary to start cell design before defining design rules and ultimately modify the layout when the design rules are defined at the final stage.

3) Abstraction in the design has been shifted from a mask layout and circuit design toward system design, and hence, the number of engineers for the mask layout and the circuit design has been greatly decreased.

Accordingly, techniques of cell synthesis and cell compaction has been regarded largely significant. Moreover, since the area of a leaf cell directly affects not only the area of a chip but also a cost of the chip, the cell area is required to be integrated similarly to or more highly than that attained by human design.

Conventional compaction methods are classified into one-dimensional compaction and two-dimensional compaction. In the one-dimensional compaction, merely one direction, that is, the parallel direction or the vertical direction, against one side of a layout area where objects of the compaction are disposed is taken into consideration at one time. Specifically, an allocated wire is represented by using a lattice in one method of the one-dimensional compaction, and a linear space area vertical or parallel to the layout area is searched for. Such space areas are repeatedly removed so as to decrease the layout area. In another method, latitudinal or longitudinal position constraint is represented by using a graph, and an actual distance and a minimum distance between elements to be aligned are provided to branches of the graph as data. Then, the elements to be aligned are moved so that the maximum path in the graph can be shortened.

In any of the above-described methods, the movement in one direction alone is taken into consideration at one time, and hence, these methods disadvantageously cannot cope with a case where the entire compaction can be effected by moving a part of the elements to be aligned in another direction. Then, a method for coping with such a case by moving the elements in two directions at one time is proposed as the two-dimensional compaction.

In a typical example of the two-dimensional compaction, as is disclosed in "Two-Dimensional Compaction by 'Zone Refining' by Hyunchul Shin, Alverto L. Sagiovanni-Vincentelli and Carlo H. Sequin", among elements disposed in a cell, a group of elements to be moved which is located at the lowest position is first moved to a further lower position. At this point, the optimal position in the horizontal direction is obtained, so that the group is two-dimensionally moved to the optimal position. A group to be moved is successively shifted to an upper group, and respective groups are repeatedly similarly moved to their lower optimal positions. By adopting this method, the problem occurring in the one-dimensional compaction can be overcome, resulting in attaining better compaction.

However, the conventional two-dimensional compaction has a problem that there is no optimal index regarding a layout position. Furthermore, since an element is simultaneously moved in the two directions, i.e., the parallel and vertical directions to the layout area, even through the layout can be optimized, wires are more frequently bent because of the change of the layout. As a result, the optimality of the layout can be spoiled, thereby disadvantageously increasing the total area. In addition, the two-dimensional compaction has another problem that it is difficult to effectively deal with wires with different widths.

SUMMARY OF THE INVENTION

The present invention was devised to overcome the aforementioned problems. The object is providing two-dimensional compaction which can solve all the conventional problems and can attain a more practical compaction result without spoiling optimality of layout.

In order to achieve the above-described object, all existing wires are eliminated, and compaction is executed at the same time as allocation of new wires in the present invention.

The compaction method of this invention comprises a first abstracting step of abstracting first elements such as a transistor and second elements such as a capacitor and a contact by using rectangles respectively having terminals at peripheral or inner portions, and abstracting the terminals and wires connecting the terminals by using wire junctions and wire elements; a second abstracting step of setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and a routing and compacting step of connecting and compacting the rectangles on the basis of the net targets and the connection information. In this compaction method, the routing and compacting step includes a step of extracting, from the connection information, a net target traced by a front, which is a tip portion of a line where any of the wire elements is allocated, on a scan line parallel to the virtual line in the layout area; a step of generating a scanning point list by sorting positions of the wire junctions, and positions of one side, which is parallel to the scan line, and the other opposing side of each of the rectangles for determining an order of scanning by the scan line; a step of moving the scan line in a direction vertical to the scan line in accordance with the scanning point list, moving the front on the scan line to be closer to the net target extracted from the connection information, compacting a straight line formed between corresponding one of the wire junctions and the moved front in a direction toward a scanning start point which is first scanned by the scan line, and providing the straight line as a wire element; in a case where two fronts on the scan line are to be proceeded to the same direction, a step of merging the two fronts to be connected with each other, compacting, in the direction toward the scanning start point, a straight line formed by connecting the two fronts, and providing the compacted straight line as a wire element; in a case where the scan line scans any of the wire junctions, a step of providing a new front on the wire junction, providing a wire element extending toward a net target traced by the new front, and eliminating the front not requiring any more extension of the wire element; in a case where the scan line scans one of the sides, which is closer to the scanning start point, of any of the rectangles, a step of compacting the rectangle in the direction toward the scanning start point; and in a case where the scan line scans the other side, which is farther from the scanning start point, of any of the rectangles, a step of setting the rectangle as a layout inhibited area.

This compaction method comprises the step of moving the scan line in the vertical direction to the scan line, moving the front on the scan line so as to be closer to the net target extracted from the wire connection information; compacting the straight line formed between the wire junction and the moved front in the direction toward the scanning start point, and providing the compacted straight line as a wire element, and in the case where the scan line scans one side of a rectangle closer to the scanning start point, the step of compacting the rectangle in the direction toward the scanning start point. Accordingly, the layout of the rectangles representing the abstracted elements can be optimized, and the wires can be re-routed while compacting the rectangles. This can decrease the number of unnecessary bent portions of the wires, resulting in decreasing the area occupied by the wires. In addition, even when the layout of the element is changed, the number of the bent portions of the wires can be suppressed as far as possible by re-routing the wires. Furthermore, wires with different widths can be effectively compacted.

In one aspect of the compaction method, the first abstracting step preferably includes, in a case where the first elements are CMOS transistors and each of the CMOS transistors is represented by plural rectangles, a step of relatively moving the plural rectangles in a horizontal or vertical direction. Thus, the plural rectangles representing the CMOS transistors can be relatively moved in the horizontal or vertical direction, and hence, the resultant compaction can be more optimized.

In another aspect of the compaction method, the second elements in the first abstracting step are preferably contacts, and the contacts are preferably represented by plural rectangles on different layers, each rectangle having a terminal in an inner portion, and the wire junctions are preferably connected with the wire elements on the same layer alone. Thus, a contact can be represented by two rectangles disposed on different layers each having a terminal in its inner portion, and hence, multi-layer interconnection can be definitely realized.

In still another aspect of the compaction method, the second abstracting step preferably includes a step of disposing the abstracted wire elements and wire junctions in the layout area, setting the wire junctions corresponding to wire branch points, at which the wire elements are branched, and intersections between the virtual line and the wire elements as further net targets, and defining adjoining relationships among the net targets on the basis of the connection information. Thus, a wire junction corresponding to a branch point at which a wire is branched can be used as a further net target, and hence, even when a wire is branched between terminals, the routing can be definitely attained.

The compaction apparatus of this invention comprises first abstracting means for abstracting first elements such as a transistor and second elements such as a capacitor and a contact by using rectangles respectively having terminals at peripheral or inner portions, and abstracting the terminals and wires connecting the terminals by using wire junctions and wire elements; second abstracting means for setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and routing and compacting means for connecting and compacting the rectangles on the basis of the net targets and the connection information. In this compaction apparatus, the routing and compacting means includes means for extracting, from the connection information, a net target traced by a front, which is a tip portion of a line where any of the wire elements is allocated, on a scan line parallel to the virtual line in the layout area; means for generating a scanning point list by sorting positions of the wire junctions, and positions of one side, which is parallel to the scan line, and the other opposing side of each of the rectangles for determining an order of scanning by the scan line; means for moving the scan line in a direction vertical to the scan line in accordance with the scanning point list, moving the front on the scan line to be closer to the net target extracted from the connection information, compacting a straight line formed between corresponding one of the wire junctions and the moved front in a direction toward a scanning start point which is first scanned by the scan line, and providing the straight line as a wire element; in a case where two fronts on the scan line are to be proceeded to the same direction, means for merging the two fronts to be connected with each other, compacting, in the direction toward the scanning start point, a straight line formed by connecting the two fronts, and providing the compacted straight line as a wire element; in a case where the scan line scans any of the wire junctions, means for providing a new front on the wire junction, providing a wire element extending toward a net target traced by the new front, and eliminating the front not requiring any more extension of the wire element; in a case where the scan line scans one of the sides, which is closer to the scanning start point, of any of the rectangles, means for compacting the rectangle in the direction toward the scanning start point; and in a case where the scan line scans the other side, which is farther from the scanning start point, of any of the rectangles, means for setting the rectangle as a layout inhibited area.

According to this compaction apparatus, the layout of the rectangles representing the abstracted elements can be optimized, and wires can be re-routed while compacting the rectangles. This can decrease the number of unnecessary bent portions of the wires, resulting in decreasing the area occupied by the wires. In addition, even when the layout of the elements is changed, the number of the bent portions of the wires can be suppressed as far as possible by re-routing the wires. Furthermore, wires with different widths can be effectively compacted.

Alternatively, the compaction method of this invention comprises a diffusion island setting step of setting a diffusion shared area formed by sharing a diffused area by plural transistors as a diffusion island; a first abstracting step of abstracting first elements such as the diffusion island, a transistor and a contact provided on the transistor and second elements such as a capacitor and a contact by using rectangles having terminals at peripheral or inner portions, and abstracting the terminals and wires for connecting the terminals by using wire junctions and wire elements; a second abstracting step of setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and a routing and compacting step of connecting and compacting the rectangles on the basis of the net targets and the connection information. In this compaction method, the routing and compacting step includes a connection information search step of extracting, from the connection information, a net target traced by a front, which is a tip portion of a line where any of the wire elements is allocated, on a scan line parallel to the virtual line in the layout area; a scanning point list generating step of generating a scanning point list by sorting positions of the wire junctions, and positions of one side, which is parallel to the scan line, and the other opposing side of each of the rectangles for determining an order of scanning by the scan line; a wire element adding step of moving the scan line in a direction vertical to the scan line in accordance with the scanning point list, moving the front on the scan line to be closer to the net target extracted from the connection information, compacting a straight line formed between corresponding one of the wire junctions and the moved front in a direction toward a scanning start point which is first scanned by the scan line, and providing the straight line as a wire element; in a case where two fronts on the scan line are to be proceeded to the same direction, a front merging step of merging the two fronts to be connected with each other, compacting, in the direction toward the scanning start point, a straight line formed by connecting the two fronts, and providing the compacted straight line as a wire element; in a case where the scan line scans any of the wire junctions, a front eliminating step of providing a new front on the wire junction, providing a wire element extending toward a net target traced by the new front, and eliminating the front not requiring any more extension of the wire element; in a case where the scan line scans one of the sides, which is closer to the scanning start point, of any of the rectangles, the rectangle is included in the diffusion island including plural composing elements, and the side closer to the scanning start point is closer to the scanning start point than other composing elements of the diffusion island, a diffusion island inner layout generating step of generating a layout pattern within the diffusion island; a diffusion island inner compacting step of compacting the layout pattern within the diffusion island in the direction toward the scanning start point; in a case where the scan line scans one of the sides, closer to the scanning start point, of any of the rectangles and the rectangle represents a single transistor or any of the second elements, a rectangle compacting step of compacting the rectangle in the direction toward the scanning start point; and in a case where the scan line scans the other side, which is farther from the scanning start point, of the rectangle, a layout inhibited area setting step of setting the rectangle as a layout inhibited area.

According to this compaction method, the diffusion island in which the impurity diffused area is shared by the transistors is defined. Therefore, since the layout generation within the diffusion island and the entire compaction can be hierarchically dealt with, the compaction method can be applied to a complicated layout such as a bent gate of a transistor and optimization of the position of a diffusion contact. Thus, the resultant compaction can be satisfactory similarly to that attained by human design.

In one aspect of the compaction method, the diffusion island in the diffusion island setting step preferably includes, as the composing elements, a gate, a diffused area, a diffusion contact provided in the diffused area and an upper wire area for a wire on an upper layer, and the diffusion island inner layout generating step preferably includes a step of abstracting the diffusion island by using rectangles formed by abstracting each one side of the gate and the diffused area, each of the other opposing sides of the gate and the diffused area, the diffusion contact, and a vertical component of the upper wire area against the scan line; and a step of successively compacting the composing elements in the direction toward the scanning start point in an order from one composing element closest to the scanning start point in accordance with design rules. Thus, the layout within the diffusion island can be definitely compacted.

In another aspect of the compaction method, the diffusion island in the diffusion island setting step preferably includes, as the composing elements, plural rectangles representing a gate, a diffused area and a diffusion contact provided in the diffused area, and the diffusion island inner layout generating step preferably includes a step of successively compacting the plural rectangles in the direction toward the scanning start point in an order from one rectangle closest to the scanning start point in accordance with design rules; and in a case where the scan line scans any of the rectangles of the diffusion island and a design rule error occurs between the rectangle scanned by the scan line and a wire around the diffusion island, a step of moving the rectangle scanned by the scan line and other rectangles disposed on a side farther from the scanning start point by the same distance in the direction away from the scanning start point, thereby solving the design rule error. Thus, when a design rule error occurs between the layout in the diffusion island scanned by the scan line and a wire around the diffusion island, the rectangle scanned by the scan line and the other rectangles in the diffusion island disposed on the side of the rectangle farther from the scanning start point are moved by the same distance in the direction away from the scanning start point, so as to solve the design rule error. Accordingly, the resultant layout can be more definitely optimized.

In still another aspect of the compaction method, the diffusion island in the diffusion island setting step preferably includes, as the composing elements, plural rectangles representing a gate, a diffused area and a diffusion contact provided in the diffused area, and the routing and compacting step preferably includes a storage step of storing procedures and results of each of the respective steps, and the diffusion island inner layout generating step preferably includes a step of successively compacting the plural rectangles in the direction toward the scanning start point in an order from one rectangle closest to the scanning start point in accordance with design rules; and in a case where the scan line scans any of the rectangles of the diffusion island and a design rule error occurs between the rectangle scanned by the scan line and a wire around the diffusion island, a step of retroacting, on the basis of the procedures and the results stored in the storage step, the storage step to a time point where the design rule error is solved by increasing an area of one rectangle representing the diffused area connected with a power supply line, and moving one rectangle scanned by the scan line at the retroacted time point and other rectangles positioned on a side farther from the scanning start point in a direction away from the scanning start point by the same distance. Thus, when a design rule error occurs between the rectangle in the diffusion island scanned by the scan line and a wire around the diffusion island, the procedure is retroacted to a time point where the design rule error can be solved by increasing the area of a rectangle representing a diffused area connected with a power supply line, and the rectangle scanned by the scan line at the retroacted point and the other rectangles on the side of the scanned rectangle farther from the scanning start point are moved by the same distance in the direction away from the scanning start point, so as to solve the design rule error. Accordingly, the layout can be more definitely optimized without increasing delay time of the transistors.

Alternatively, the compaction apparatus of this invention comprises diffusion island setting means for setting a diffusion shared area formed by sharing a diffused area by plural transistors as a diffusion island; first abstracting means for abstracting first elements such as the diffusion island, a transistor and a contact provided on the transistor and second elements such as a capacitor and a contact by using rectangles having terminals at peripheral or inner portions, and abstracting the terminals and wires for connecting the terminals by using wire junctions and wire elements; second abstracting means for setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and routing and compacting means for connecting and compacting the rectangles on the basis of the net targets and the connection information. In this compaction apparatus, the routing and compacting means includes connection information search means for extracting, from the connection information, a net target traced by a front, which is a tip portion of a line where any of the wire elements is allocated, on a scan line parallel to the virtual line in the layout area; scanning point list generating means for generating a scanning point list by sorting positions of the wire junctions, and positions of one side, which is parallel to the scan line, and the other opposing side of each of the rectangles for determining an order of scanning by the scan line; wire element adding means for moving the scan line in a direction vertical to the scan line in accordance with the scanning point list, moving the front on the scan line to be closer to the net target extracted from the connection information, compacting a straight line formed between corresponding one of the wire junctions and the moved front in a direction toward a scanning start point which is first scanned by the scan line, and providing the straight line as a wire element; in a case where two fronts on the scan line are to be proceeded to the same direction, front merging means for merging the two fronts to be connected with each other, compacting, in the direction toward the scanning start point, a straight line formed by connecting the two fronts, and providing the compacted straight line as a wire element; in a case where the scan line scans any of the wire junctions, front eliminating means for providing a new front on the wire junction, providing a wire element extending toward a net target traced by the new front, and eliminating the front not requiring any more extension of the wire element; in a case where the scan line scans one of the sides, which is closer to the scanning start point, of any of the rectangles, the rectangle is included in the diffusion island including plural composing elements, and the side closer to the scanning start point is closer to the scanning start point than other composing elements of the diffusion island, diffusion island inner layout generating means for generating a layout pattern within the diffusion island; diffusion island inner compacting means for compacting the layout pattern within the diffusion island in the direction toward the scanning start point; in a case where the scan line scans one of the sides, closer to the scanning start point, of any of the rectangles and the rectangle represents a single transistor or any of the second elements, rectangle compacting means for compacting the rectangle in the direction toward the scanning start point; and in a case where the scan line scans the other side, which is farther from the scanning start point, of the rectangle, layout inhibited area setting means for setting the rectangle as a layout inhibited area.

According to this compaction apparatus, the diffusion island in which the impurity diffused area is shared by the transistors is defined. Therefore, since the layout generation within the diffusion island and the entire compaction can be hierarchically dealt with, the compaction apparatus can be applied to a complicated layout such as a bent gate of a transistor and optimization of the position of a diffusion contact. Thus, the resultant compaction can be satisfactory similarly to that attained by human design.

The routing method of this invention comprises a first abstracting step of abstracting first elements such as a transistor and second elements such as a capacitor and a contact by using rectangles respectively having terminals at peripheral or inner portions, and abstracting the terminals and wires connecting the terminals by using wire junctions and wire elements; a second abstracting step of setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and a routing step of connecting the rectangles on the basis of the net targets and the connection information. In this routing method, the routing step includes a step of moving a scan line, which is parallel to the virtual line in the layout area and has a front provided correspondingly to each of the wire junctions, in a direction vertical to the scan line, appropriately moving the front on the scan line, and providing a trace of the front as a wire path.

This routing method comprises the step of abstracting the wire paths on the basis of the connection information on the net targets, and the step of moving the scan line parallel to the virtual line and having the front corresponding to a tip portion of the existing wire in the vertical direction to the scan line, appropriately moving the front on the scan line and providing the trace of the front as the wire path. Accordingly, since the wires are newly re-routed, the number of unnecessary bent portions of the wires can be decreased. As a result, the area occupied by the wires can be decreased.

In one aspect of the routing method, the first abstracting step preferably includes, in a case where the first elements are CMOS transistors and the CMOS transistors are represented by plural rectangles, a step of relatively moving the plural rectangles in a horizontal or vertical direction. Thus, the plural rectangles representing the CMOS transistors can be relatively moved in the horizontal or vertical direction, and hence the more optimal routing can be attained.

In another aspect of the routing method, the second elements in the first abstracting step are preferably contacts, the contacts are preferably represented by plural rectangles on different layers having terminals in inner portions thereof, and the wire junctions are preferably connected with the wire elements on the same layer alone. Thus, the contact is represented by two rectangles on different layers each having a terminal in its inner portion, and hence, multi-layer interconnection can be definitely realized.

In still another aspect of the routing method, the second abstracting step preferably includes a step of disposing the abstracted wire elements and wire junctions in the layout area, setting the wire junctions corresponding to wire branch points, at which the wire elements are branched, and intersections between the virtual line and the wire elements as further net targets, and defining adjoining relationships among the net targets on the basis of the connection information. Thus, a wire junction corresponding to a branch point where the wire is branched is used as a net target, and hence, even when the wire is branched between the terminals, the routing can be definitely realized.

In still another aspect of the routing method, the routing step preferably includes a step of generating a front also on a tip portion of a line where any of the wire elements is allocated, moving the scan line in the direction vertical to the scan line, appropriately moving the generated front on the scan line, and compacting a straight line formed between corresponding one of the wire junctions and the moved front in a direction toward a scanning start point which is first scanned by the scan line; and a step of providing the compacted straight line as a wire element. Thus, the straight line formed between the tip portion of the existing wire and the moved front is compacted in the direction toward the scanning start point which is first scanned by the scan line, and hence, the routing can be definitely conducted.

In still another aspect of the routing method, the scan line is preferably successively moved to positions of the wire junctions, one side parallel to the scan line and the other opposing side of each of the rectangles. Thus, the scan line is successively moved to the positions of the wire junctions, and the vertical side and the other opposing side of each rectangle, the routing can be more definitely conducted.

In still another aspect of the routing method, the routing step preferably includes a step of generating a front on a tip portion of a line where any of the wire elements is allocated and extracting one net target traced by the generated front from the connection information; and a step of moving the scan line in the direction vertical to the scan line, appropriately moving the generated front on the scan line, compacting a straight line formed between corresponding one of the wire junctions and the moved front in a direction toward a scanning start point which is first scanned by the scan line, and providing the compacted straight line as a wire element. Thus, since the net target having the front as the origin is extracted from the connection information, the routing can be definitely conducted.

The routing apparatus of this invention comprises first abstracting means for abstracting first elements such as a transistor and second elements such as a capacitor and a contact by using rectangles respectively having terminals at peripheral or inner portions, and abstracting the terminals and wires connecting the terminals by using wire junctions and wire elements; second abstracting means for setting, in a rectangular layout area where a plurality of the rectangles are disposed, a virtual line vertical to one side of the layout area, abstracting wire paths connecting the first and second elements by using net targets each having a net identifier for identifying a set of the rectangles to be connected at the same potential on the wire junctions and the virtual line and by using connection information regarding which net targets among the net targets are connected with one another; and routing means for connecting the rectangles on the basis of the net targets and the connection information. In this routing apparatus, the routing means includes means for moving a scan line, which is parallel to the virtual line in the layout area and has a front provided correspondingly to each of the wire junctions, in a direction vertical to the scan line, appropriately moving the front on the scan line, and providing a trace of the front as a wire path. Accordingly, the wires can be re-routed. Thus, the number of unnecessary bent portions of the wires can be decreased, resulting in decreasing the area occupied by the wires.

The rough routing method of this invention comprises a step of abstracting first elements such as a transistor and a contact provided on the transistor and second elements such as a capacitor and a contact by using plural rectangles having terminals in periphery or inner portions thereof; a step of setting, in a rectangle layout area where the plural rectangles are disposed, plural virtual lines vertical to one side of the layout area, generating nets each including a set of the rectangles to be connected at the same potential on the terminals and the virtual lines, and generating net targets each having a net identifier for identifying which net each net target belongs to; a step of providing a scan line parallel to the virtual lines in the layout area and having a front corresponding to a tip portion of a wire path, and generating a scanning point list by sorting positions of the terminals and the virtual lines for determining a scanning order by the scan line; a step of moving the scan line in a vertical direction to the scan line in accordance with the scanning point list, and in a case where two fronts on the scan line are to be proceeded in the same direction, connecting net targets corresponding to the two fronts with each other, thereby merging the two fronts; in a case where the scan line scans any of the terminals and at least one front belonging to the same net as the scanned terminal is present on the scan line, a step of selecting one front closest to the scanned terminal and connecting a net target corresponding to the scanned terminal with a net target corresponding to the selected front; in a case where the scan line scans any of the terminals and a front belonging to the same net as scanned the terminal is not present on the scan line, a step of providing a new front on the scan line; in a case where the scan line scans any of the virtual lines, a net target is present on the virtual line scanned by the scan line, and a net including the net target on the virtual line does not include any front on the scan line, a step of providing a new front belonging to the same net on the scan line; in a case where the scan line scans any of the virtual lines, a first net target among the net targets is present on the virtual line scanned by the scan line and a front on the scan line belongs to the same net as the first net target, a step of connecting a second net target corresponding to the front on the scan line with the first net target; and in a case where the scan line scans any of the virtual lines, a front is present on the scan line and a net target belonging to the same net as the front on the scan line is not present on the virtual line, a step of moving the front on the scan line so as to be closer to a net target which is positioned on a side of the virtual line farther from a scanning start point and belongs to the same net, and providing a new net target at the same vertical position as the net target on the virtual line.

According to this rough routing method, the scan line is moved in the vertical direction to the scan line in accordance with the scanning point list, and the net targets and the fronts are dynamically generated or eliminated in accordance with circumstances, so that a straight line formed between the wire junction and the moved front can be provided as a wire element. Accordingly, the number of unnecessary bent portions of the wires can be decreased, resulting in minimizing the area occupied by the wires.

In one aspect of the rough routing method, the rough routing method is preferably applied to plural layers each having plural wires, and the rough routing method is preferably further provided with a cross wire optimizing step of optimizing a number of intersections between the plural wires on one layer to be minimized, by repeating an operation for replacing orders of the net targets on the virtual lines or an operation for moving layer changing points, each of which corresponds to a point where one layer is connected with another layer, on one layer. Thus, the number of intersections between the plural wires on one layer can be minimized, resulting in optimizing the wire layout.

In another aspect of the rough routing method, the cross wire optimizing step preferably includes a step of setting a sum of densities in a rectangle area occupied by the rectangles disposed on each of the virtual lines, a wire area occupied by the wires corresponding to the net targets disposed on each of the virtual lines and a wire contact area which is adjacent to each of the virtual lines and is formed by the intersections between the wires, as a density of each of the virtual lines; and a step of obtaining a maximum density among the plural virtual lines to be used as an index for optimization. Thus, the density is used as the index for optimizing the intersections of the wires, and hence, the wire intersections can be definitely optimized.

In still another aspect of the rough routing method, the rough routing method is preferably applied to plural layers each having plural wires, and in a case where the plural wires on one layer cross each other, the rough routing method is preferably further provided with a wire detour step of providing a contact on a wire path of one of the wires, thereby making a detour of the wire to another layer. Thus, a wire path of one of the wires crossing each other is provided with a contact so as to make a detour of the wire to another layer. Accordingly, the wire layout can be more definitely optimized.

The rough routing apparatus of this invention comprises means for abstracting first elements such as a transistor and a contact provided on the transistor and second elements such as a capacitor and a contact by using plural rectangles having terminals in periphery or inner portions thereof; means for setting, in a rectangle layout area where the plural rectangles are disposed, plural virtual lines vertical to one side of the layout area, generating nets each including a set of the rectangles to be connected at the same potential on the terminals and the virtual lines, and generating net targets each having a net identifier for identifying which net each net target belongs to; means for providing a scan line parallel to the virtual lines in the layout area and having a front corresponding to a tip portion of a wire path, and generating a scanning point list by sorting positions of the terminals and the virtual lines for determining a scanning order by the scan line; means for moving the scan line in a vertical direction to the scan line in accordance with the scanning point list, and in a case where two fronts on the scan line are to be proceeded in the same direction, for connecting net targets corresponding to the two fronts with each other, thereby merging the two fronts; in a case where the scan line scans any of the terminals and at least one front belonging to the same net as the scanned terminal is present on the scan line, means for selecting one front closest to the scanned terminal and connecting a net target corresponding to the scanned terminal with a net target corresponding to the selected front; in a case where the scan line scans any of the terminals and a front belonging to the same net as the scanned terminal is not present on the scan line, means for providing a new front on the scan line; in a case where the scan line scans any of the virtual lines, a net target is present on the virtual line scanned by the scan line, and a net including the net target on the virtual line does not include any front on the scan line, means for providing a new front belonging to the same net on the scan line; in a case where the scan line scans any of the virtual lines, a first net target among the net targets is present on the virtual line scanned by the scan line and a front on the scan line belongs to the same net as the first net target, means for connecting a second net target corresponding to the front on the scan line with the first net target; and in a case where the scan line scans any of the virtual lines, a front is present on the scan line and a net target belonging to the same net as the front on the scan line is not present on the virtual line, means for moving the front on the scan line so as to be closer to a net target which is positioned on a side of the virtual line farther from a scanning start point and belongs to the same net, and providing a new net target at the same vertical position as the net target on the virtual line.

According to the rough routing apparatus, the scan line is moved in the vertical direction to the scan line in accordance with the scanning point list, and the net targets and the fronts are dynamically generated or eliminated in accordance with circumstances, so that a straight line formed between the wire junction and the moved front is provided as a wire element. Thus, the number of unnecessary bent portions of the wires can be decreased. As a result, the area occupied by the wires can be minimized.

In one aspect of the rough routing apparatus, the rough routing apparatus is preferably applied to plural layers each having plural wires, and the rough routing apparatus is preferably further provided with cross wire optimizing means for optimizing a number of intersections between the plural wires on one layer to be minimized, by repeating an operation for replacing orders of the net targets on the virtual lines or an operation for moving layer changing points, each of which corresponds to a point where one layer is connected with another layer, on one layer. Thus, the number of the intersections between the plural wires on one layer can be minimized, resulting in attaining a more optimized wire layout.

BRIEF DESCRIPTION OF THE DRAWINGS

FIGS. 1(a) through 1(c) show comparison in results of compaction attained by a compaction method of this invention and a conventional compaction method, wherein FIG. 1(a) shows a state before compaction, FIG. 1(b) shows a typical cell layout attained by the conventional compaction method, and FIG. 1(c) shows a cell layout attained by the compaction method of the invention;

FIGS. 2(a) through 2(e) show the outline of a compaction method and a routing method using a scan line and a front according to a first or second embodiment of the invention, wherein FIG. 2(a) shows generation of the front, FIG. 2(b) shows movement of the front on the scan line, FIG. 2(c) shows compaction of a rectangle, FIG. 2(d) shows update of a covering line, and FIG. 2(e) shows a wire provided in accordance with the movement of the front;

FIG. 4(a) is a layout diagram used as an input for the compaction method of the first embodiment or a rough routing method of a fifth embodiment;

FIG. 4(b) is an abstract diagram of the layout diagram of FIG. 4(a);

FIGS. 13(a) through 13(c) show constraint graphs including a peripheral portion of a layout area used in the compaction method or routing method of the first embodiment, wherein FIG. 13(a) shows transistors and the layout area for the transistors, FIG. 13(b) is a longitudinal constraint graph, and FIG. 13(c) is a latitudinal constraint graph;

FIGS. 14(a) and 14(b) show generation of a wire element extending in the vertical direction in the compaction method or routing method of the first embodiment, wherein FIG. 14(a) shows a state before the routing and FIG. 14(b) shows a state after the routing;

FIGS. 17(a) and 17(b) show generation of a wire element extending in the horizontal direction adopted in the case where a front proceeding to a net target is not present on a scan line in the compaction method and routing method of the first embodiment, wherein FIG. 17(a) shows a state before the routing and FIG. 17(b) shows a state after the routing;

FIGS. 19(a) and 19(b) show generation of a wire element extending in the vertical direction adopted in the case where a wire extending in the vertical direction to the scanning direction is provided to a terminal on a scan line in the compaction method or routing method of the first embodiment, wherein FIG. 19(a) shows connection between terminals and FIG. 19(b) shows connection between the terminals with a wire junction interposed therebetween;

FIGS. 22(a) and 22(b) show compaction realized by abstracting an irregular figure resulting from an impurity diffused area shared by plural MOS transistors by using plural rectangles in the compaction method or routing method of the first embodiment, wherein FIG. 22(a) shows a state before the compaction and FIG. 22(b) shows a state after the compaction;

FIG. 26 is a table listing figure elements used in the compaction method of the second embodiment;

DETAILED DESCRIPTION OF THE INVENTION (Embodiment 1)

Figure 1A:
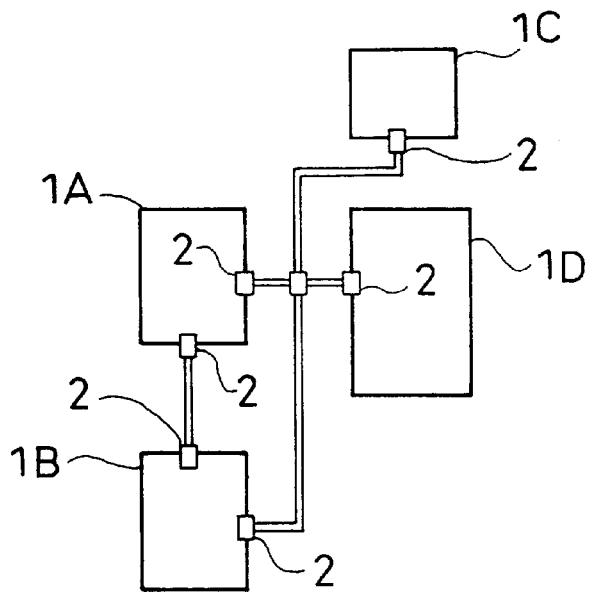
Figure 1B:
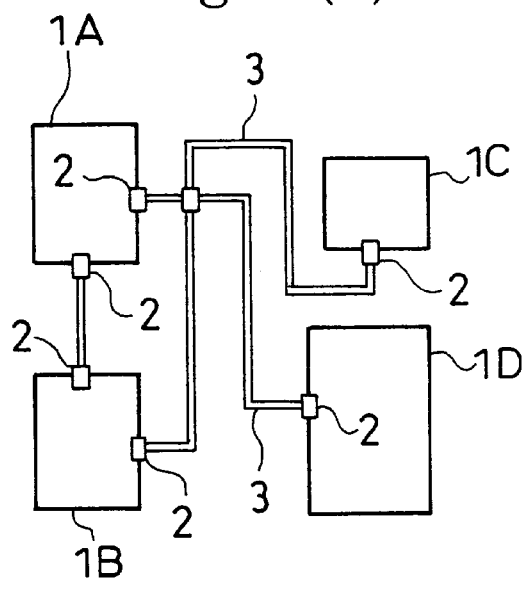
Figure 1C:
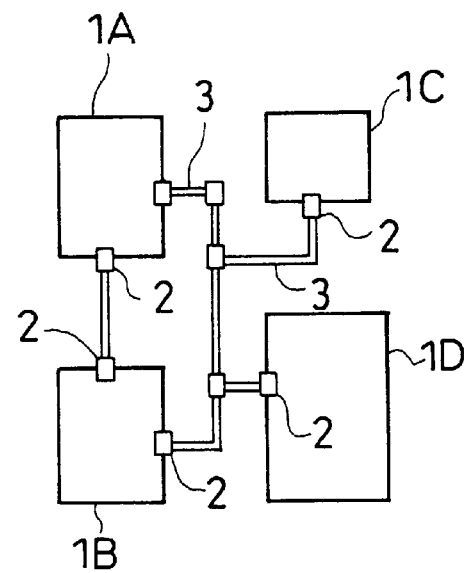

The outline of a first embodiment of the invention will now be described with reference to the drawings. FIGS. 1(a) through 1(c) show comparison of results obtained by compaction of this invention and the conventional compaction, wherein FIG. 1(a) shows a state before the compaction, FIG. 1(b) shows a typical cell layout obtained by the conventional compaction, and FIG. 1(c) shows a cell layout obtained by the present compaction. In FIGS. 1(a) through 1(c), rectangles 1A through 1D formed by abstracting transistors, contacts or the like have terminals 2 at their peripheries, and are connected with one another through wire elements 3 formed by abstracting wires.

As is shown in FIG. 1(c), the compaction method of this invention can make the wire elements 3 free from unnecessary bend and can attain a smaller area as compared with the layout obtained by the conventional compaction shown in FIG. 1(b). This is because local re-routing is simultaneously executed during the compaction so as to avoid unnecessary wire jogs.

As a characteristic of this invention, the compaction is executed while locating local wires.

Figure 2A:
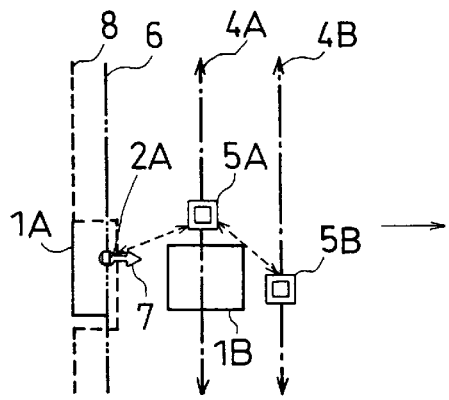

FIGS. 2(a) through 2(e) show the outline of the compaction method of this invention, where the compaction is executed simultaneously with interconnection of wires. As is shown in FIG. 2(a), in an area where rectangles 1A and 1B are aligned, spits 4A and 4B, which are virtual lines vertical to one side of the area (which is a horizontal side on the drawing in this embodiment; and the same applies to the following embodiments), are introduced, and net targets 5A and 5B are respectively provided on the spits 4A and 4B at positions where a wire extending from the rectangle 1A crosses the spits 4A and 4B. Net targets herein mean objects to be connected at the same potential, and the positions of the net targets are used as targets traced by a front described below. The spits introduced at this point will be defined below.

First, in FIG. 2(a), a scan line 6 parallel to the spits 4A and 4B for scanning the area from the left end in the rightward direction is set, and when the scan line 6 is moved to a position corresponding to a terminal 2A provided to the right side of the rectangle 1A, a front 7 is generated on the scan line 6 as a tip portion of a wire. As the fundamental concept of the invention, the front 7 on the scan line 6 is proceeded to the net target 5A, and then is proceeded to the net target 5B as a subsequent target. A covering line 8 is a boundary line for indicating that the compaction has already been completed in an area on its left side.

Figure 2B:
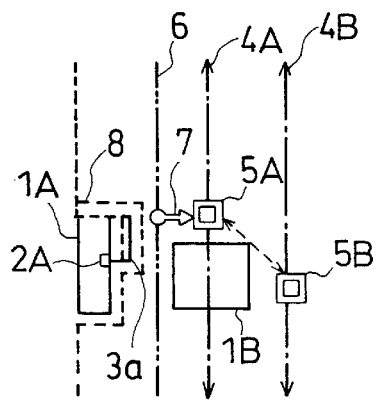

Next, as is shown in FIG. 2(b), the scan line 6 is allowed to scan in the rightward direction, and since the net target 5A serving as a target of the front 7 is positioned at an upper point of the terminal 2A, the front 7 is moved to be at the same vertical level as the net target 5A. At this point, the trace of the front 7 is obtained as a new wire element 3a. The covering line 8 is then updated to extend along the right side of the wire element 3a.

Figure 2C:
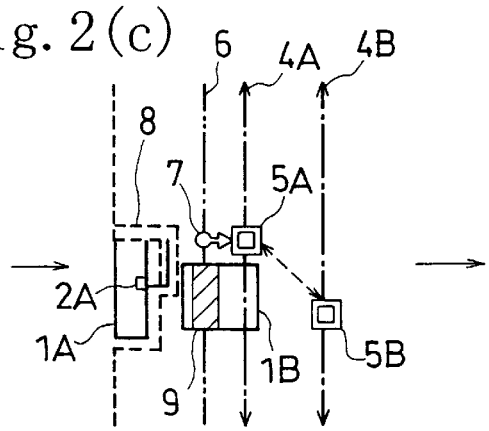

Then, as is shown in FIG. 2(c), when the scan line 6 has completed scanning the left side of the rectangle 1B, the rectangle 1B is moved in the leftward direction to come in contact with the covering line 8, and thus, the compaction is effected. At this point, an area where the scan line 6 and the moved rectangle 1B are overlapped is obtained as a layout inhibited area 9.

Figure 2D:
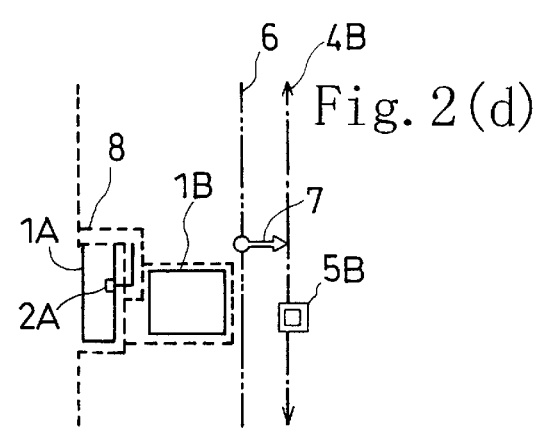

Next, as is shown in FIG. 2(d), when the scan line 6 has completed scanning the right side of the rectangle 1B, or before the front 7 starts to move in the vertical direction to the scanning direction, the covering line 8 is updated to is extend along the right side of the rectangle 1B.

Figure 2E:
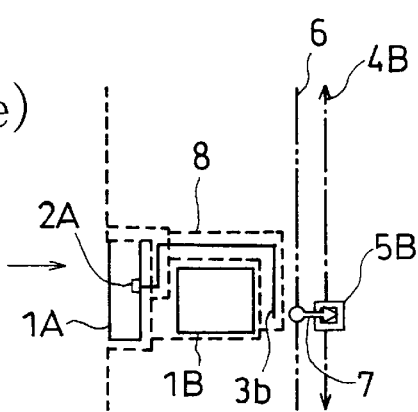

Then, as is shown in FIG. 2(e), the scan line 6 is allowed to scan in the rightward direction, and since the net target 5B serving as a subsequent target of the front 7 is positioned at a lower point of the upper side of the rectangle 1B, the front 7 is moved to be at the same horizontal level as the net target 5B. At this point, the trace of the front 7 is obtained as a new wire element 3b, and the covering line 8 is updated to extend along the right side of the wire element 3b.

In a routing method of this invention, the location of the wires alone is conducted with the compaction shown in FIG. 2(c) omitted.

Now, the first embodiment of the invention will be described in detail with reference to the drawings.

Figure 3:
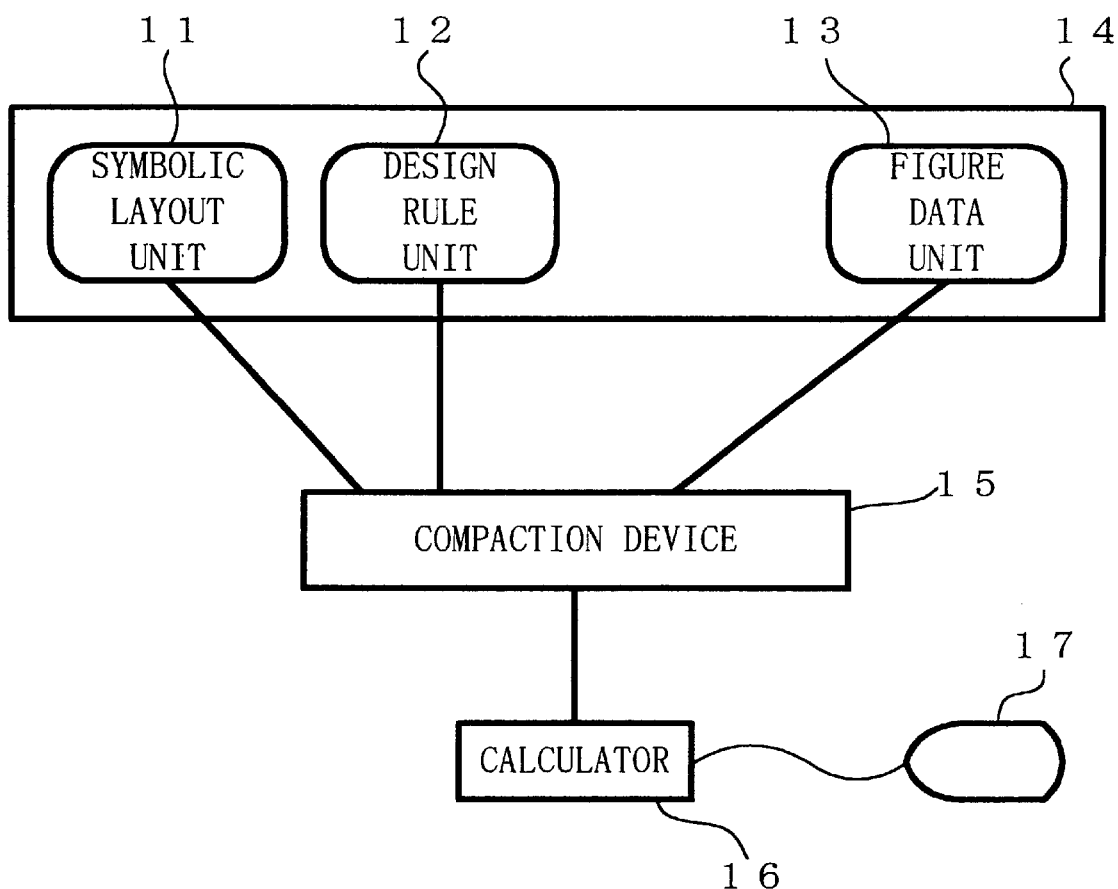
FIG. 3 is a block diagram of an LSI designing apparatus including a compaction apparatus of the first embodiment as a main component.

FIG. 3 is a block diagram of an LSI designing apparatus including a compaction apparatus for realizing the compaction method of the first embodiment as a main component. As is shown in FIG. 3, the LSI designing apparatus comprises a storage device 14 working as storage means including an input unit such as a symbolic layout unit 11 for representing transistors, contacts, wires and the like by symbols and lines, a design rule unit 12 for determining a pattern dimension and layout of an LSI and an output unit such as a figure data unit 13; a compaction device 15 working as cell compaction means for generating results of cell compaction on the basis of data stored by the storage device 14 and outputting the results to the figure data unit 13; a calculator 16 for transferring data or conducting arithmetic processing and the like; and a display apparatus 17 for displaying results of analysis or the arithmetic processing. The compaction apparatus of this invention comprises the storage device 14 and the compaction device 15.

Now, the structure of data used in the compaction method or the routing method of this embodiment will be described.

(Data Structure)

1) Layout object:

FIG. 4(a) is an exemplified layout diagram used as an input for the compaction method or the routing method, and FIG. 4(b) is a diagram obtained by abstracting the layout diagram of FIG. 4(a). As is shown in FIG. 4(a), objects of the layout are transistors 31A, 31B, 31C and 31D of CMOS transistors, and contacts 32 including pins. The transistor 31A and the transistor 31B share an impurity diffused area, and also the transistor 31C and the transistor 31D share an impurity diffused area. Furthermore, a pin is provided to the position of a contact on a different layer to be interconnected with any of the contacts 32.

In FIG. 4(b), a rectangle group 33A representing the transistors 31A and 31B is abstracted and divided into rectangles 33a, 33b and 33c, and similarly, a rectangle group 33B representing the transistors 31C and 31D is abstracted and divided into rectangles 33d, 33e and 33f. A rectangle 33C is obtained by abstracting the contact 32. Terminals 34 for connecting wires are located at the peripheries with regard to the rectangles 33a, etc. representing the transistors and at the center with regard to the rectangle 33C representing the contact. Wires for connecting the rectangles 33a, etc. representing the transistors with the rectangle 33C representing the contact are represented by wire elements 35 in straight-line portions and wire junctions 36 for connecting the wire elements 35. The terminals 34 are also abstracted as the wire junctions 36.

Figure 5:
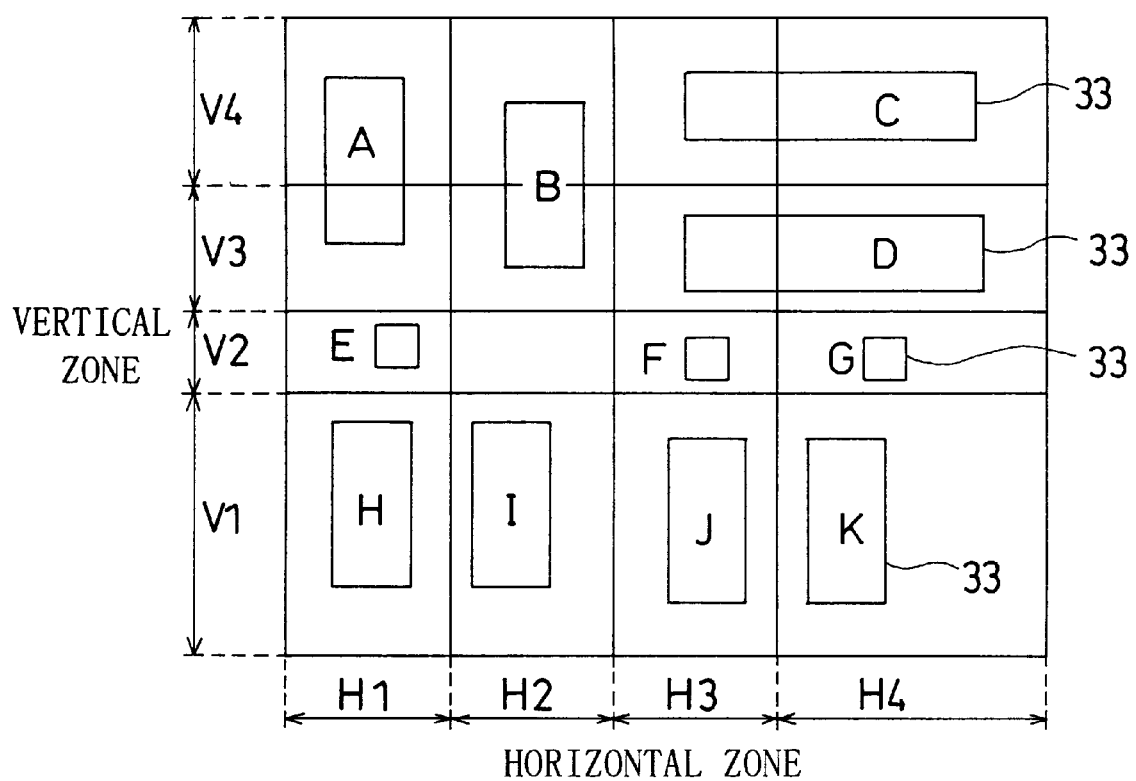
FIG. 5 is a diagram for showing zone expression in an abstracting process of the compaction method and routing method of the first embodiment.

2) Zone expression:

As is shown in FIG. 5, zone expression is data expression used to express partition of an area where a group of rectangles 33 is allocated. The area where the group of the rectangles 33 is allocated is partitioned in the horizontal and vertical directions against one side of the area, into horizontal zones H1, H2, H3 and H4 and vertical zones V1, V2, V3 and V4. Each zone includes, as its members, rectangles at least a part of which belongs to that zone. For example, the horizontal zone H3 includes rectangles C, D, F and J, and the horizontal zone H4 includes rectangles C, D, G and K. The boundaries among the horizontal and vertical zones are set at coordinates for minimizing the number of the members belonging to each zone. For example, with regard to the boundary between the horizontal zones H3 and H4, the boundary is determined to be positioned between the rectangle J and the rectangle K because, in scanning along the direction from the horizontal zone H1 to the horizontal zone H4, the number of the members of the horizontal zone H3 is four (i.e., the rectangles C, D, F and J) at maximum, decreased to two (i.e., the rectangles C and D) and increased to three (i.e., the rectangles C, D and K) again.

Figure 6:
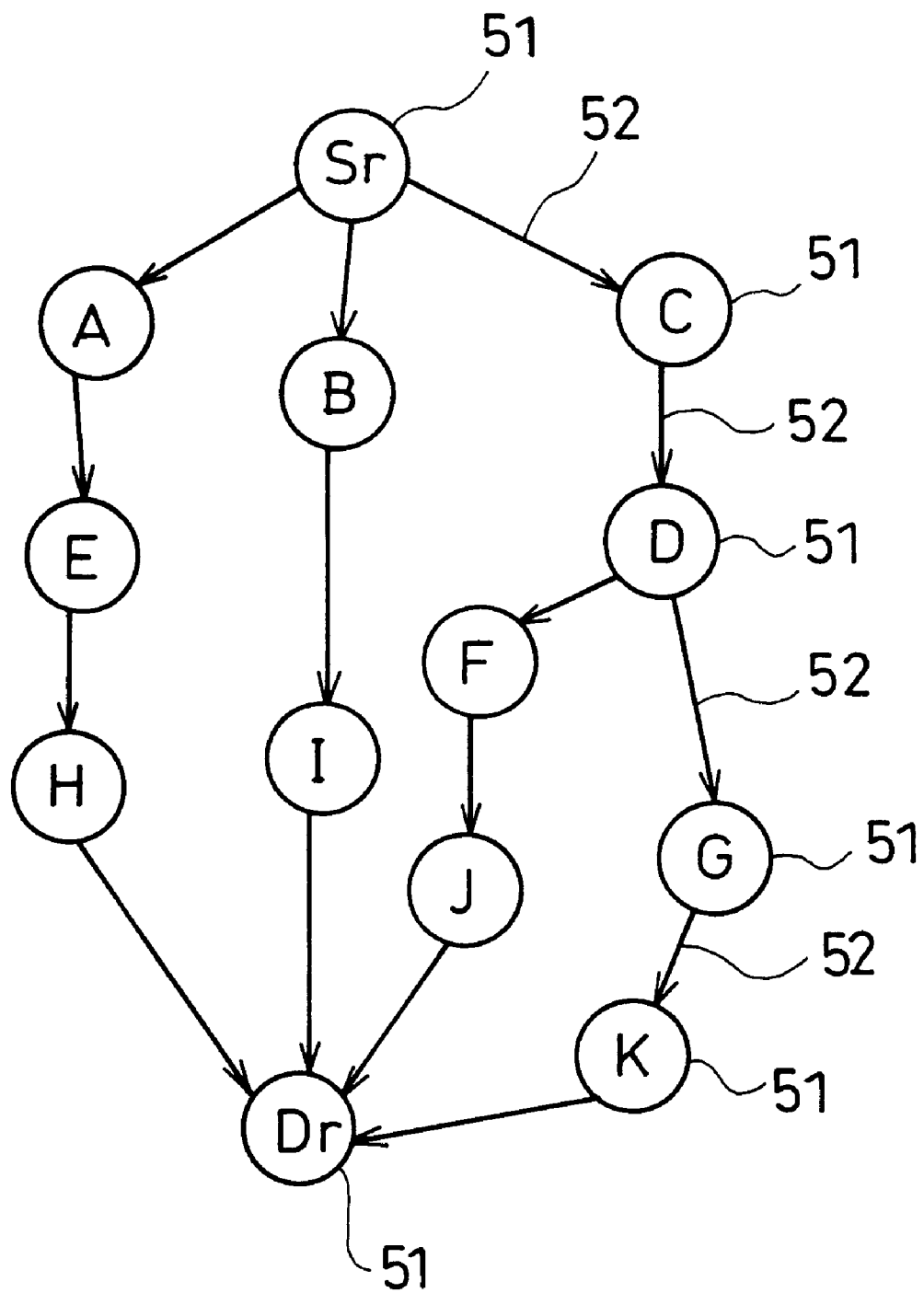
FIG. 6 is a longitudinal constraint graph used in the abstracting process of the compaction method and routing method of the first embodiment.

3) Vertical constraint graph:

FIG. 6 is a graph showing the vertical positional relationship among the rectangles 33 shown in FIG. 5. Each vertex 51 of the graph corresponds to each rectangle 33, and each branch 52 represents constraint that a minimum interval is required to be provided between the rectangles 33. The minimum interval is represented as significance of the branch 52.

Figure 7:
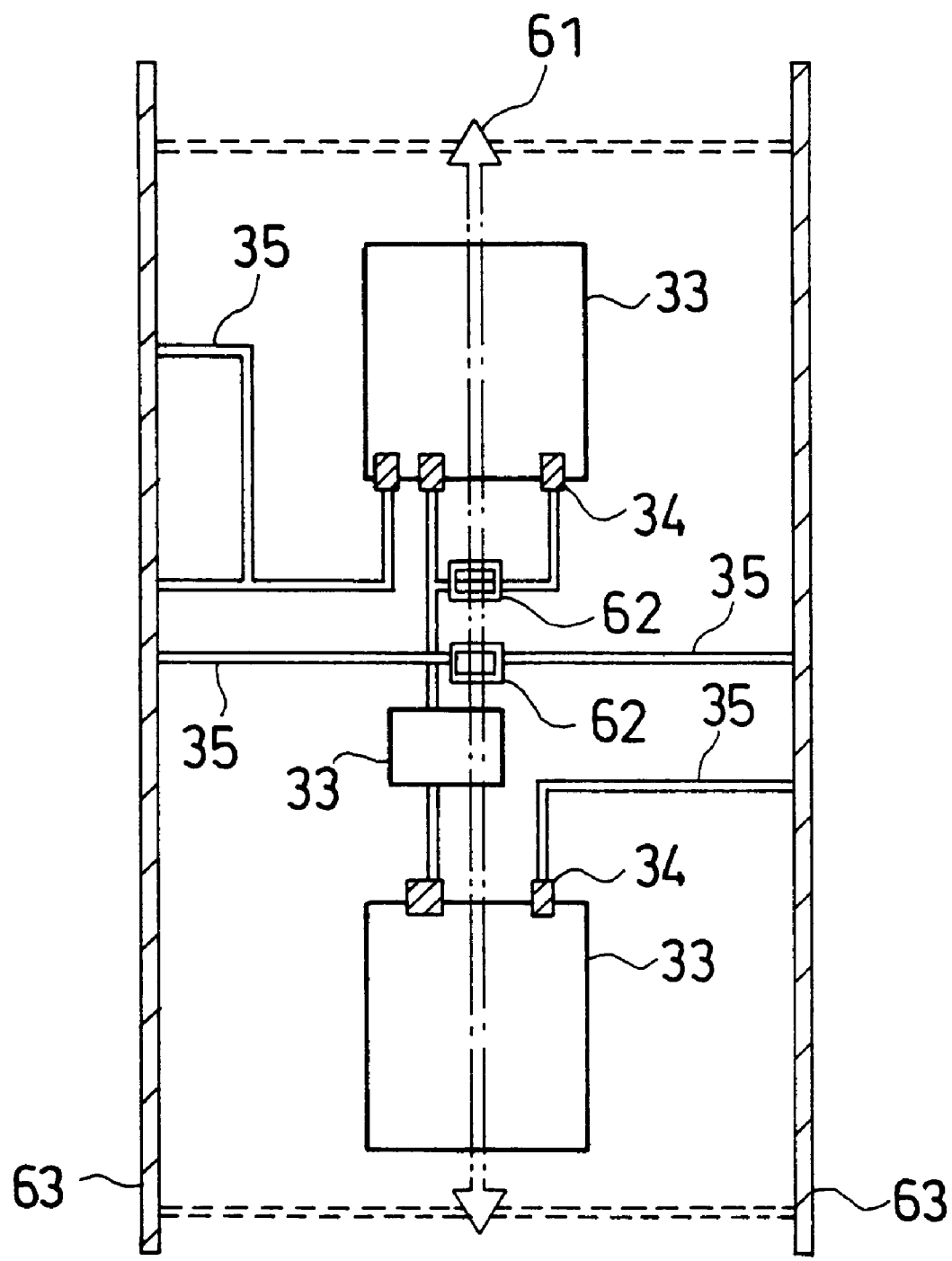
FIG. 7 is a diagram for showing a virtual line (i.e., spit) used in the abstracting process of the compaction method of the first embodiment or the rough routing method of the fifth embodiment.

4) Spit:

As is shown in FIG. 7, a spit 61 is provided in each horizontal zone. The spit 61 is a virtual line parallel to a boundary 63 between the horizontal zones and is located at a position where a maximum number of the rectangles 33 is penetrated by the spit 61 in each horizontal zone. Also, on an intersection between the spit 61 and the wire element 35 crossing the horizontal zone, a net target 62 defined below is provided.

Figure 8:
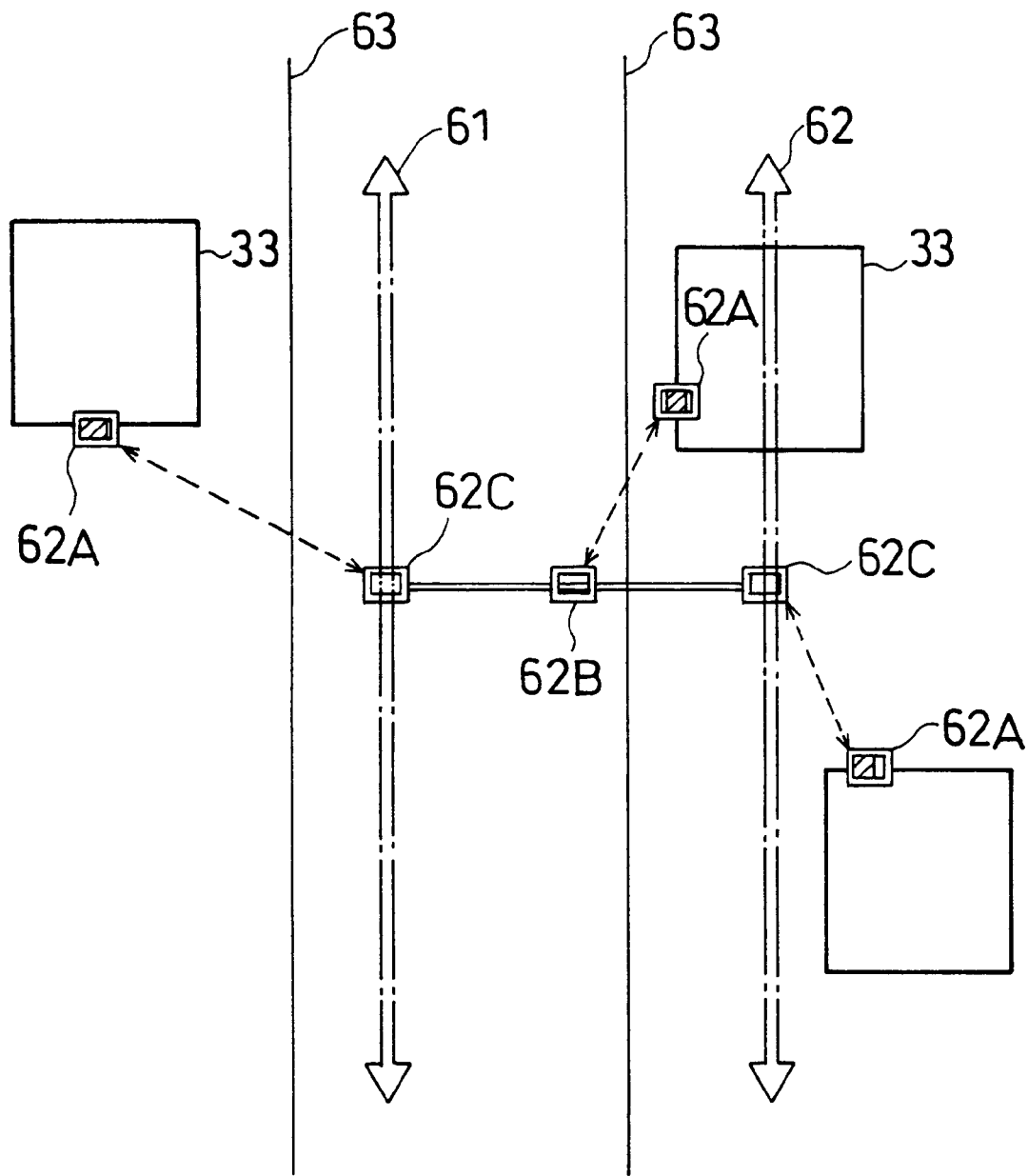
FIG. 8 is a diagram for showing a net target used in the abstracting process of the compaction method of the first embodiment or the rough routing method of the fifth embodiment.

5) Net target list:

As is shown in FIG. 8, net targets 62 are targets for extending a wire toward a subsequent horizontal zone in the routing and compaction process. The net targets 62 are generated on the following three types of positions:

(a) a terminal 62A of each rectangle 33 represented by a wire junction;

(b) a wire branch point 62B represented by a wire junction; and (c) an intersection 62C between a wire element and a spit.

A net target list herein means a set of the net targets 62A, 62B and 62C in each horizontal zone.

Figure 9:
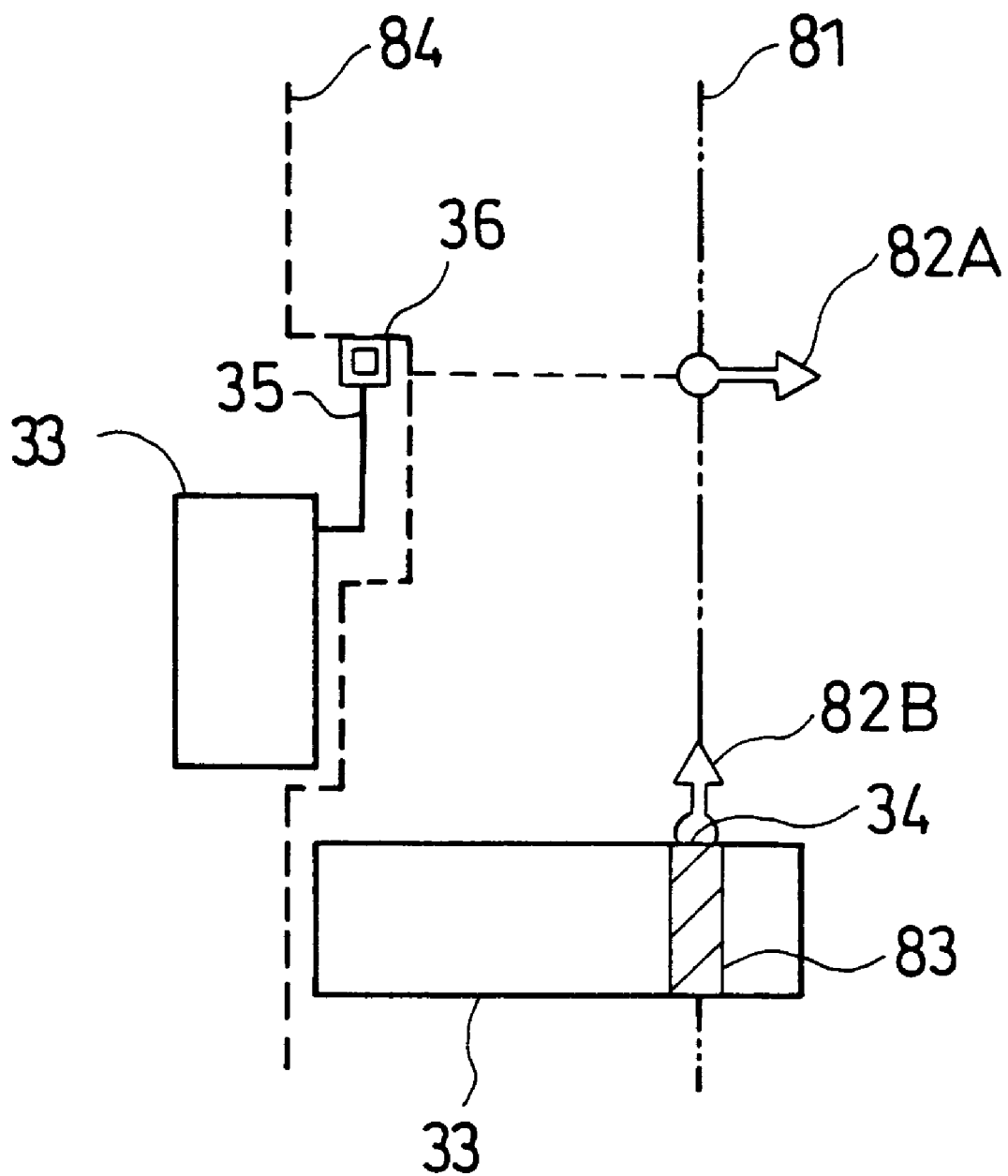
FIG. 9 is a diagram for showing a scan line used in the compaction method of the first embodiment or the rough routing method of the fifth embodiment.

6) Scan line:

As is shown in FIG. 9, a scan line 81 is a virtual line vertical to the scanning direction for scanning an area where the rectangles 33 are allocated from its left end to its right end. On the scan line 81, a front 82 or a layout inhibited area 83 is disposed.

Fronts 82A and 82B are data structures representing a tip portion of an existing wire, and the front 82A proceeding in the horizontal direction is generated on the scan line 81 at a position where a wire junction 36 corresponding to the front 82A is positioned on the side close to a scanning start point, namely, on the left side in this embodiment. Also, the front 82B proceeding in the vertical direction to the scanning direction is generated on a terminal 34 represented by a wire junction or on a wire junction 36. The layout inhibited area 83 where no wire element 35 can be allocated is positioned at an intersection between the scan line 81 and each rectangle 33. A covering line 84 is a virtual line representing a boundary between an area where the routing and compaction process has been completed and an area where it is not completed, and is set on each layer.

Figure 10:
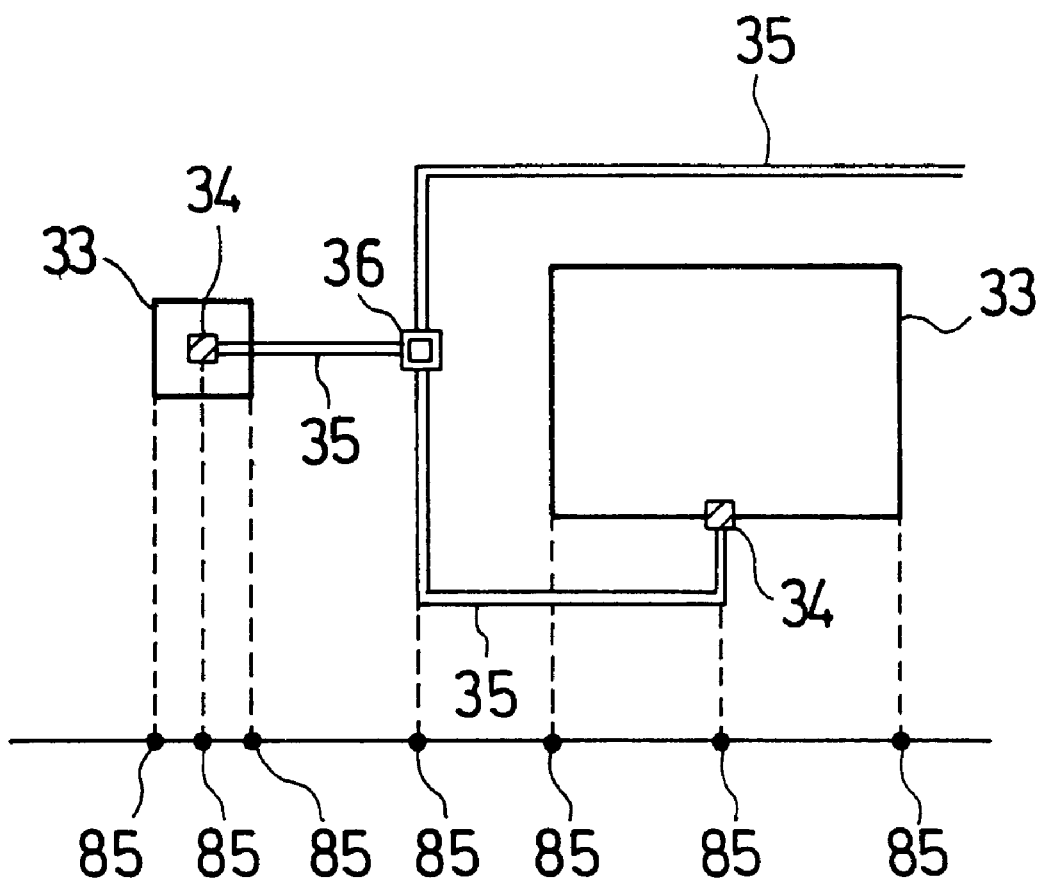
FIG. 10 is a diagram for showing a scanning point list used in the compaction method or routing method of the first embodiment.

7) Scanning point list:

As is shown in FIG. 10, a scanning point 85 corresponds to each position to which the scan line is moved in the horizontal direction for scanning. A scanning point list is a list obtained by sorting the scanning points 85 in the ascending order in the scanning direction, and includes the terminals 34 represented by the wire junctions, the wire branch points represented by the wire junctions 36, and the right and left sides of the rectangles 33. When a terminal 34, the right side of a rectangle 33 and the left side of another rectangle 33 are positioned at the same coordinate, the scanning points 85 are sorted so as to align a leftward terminal 34, the right side of the rectangle 33, the left side of the other rectangle 33 and a rightward terminal 34 in this order, in the case of scanning from the left end to the right end of FIG. 10.

(Process Flow)

Figure 11:
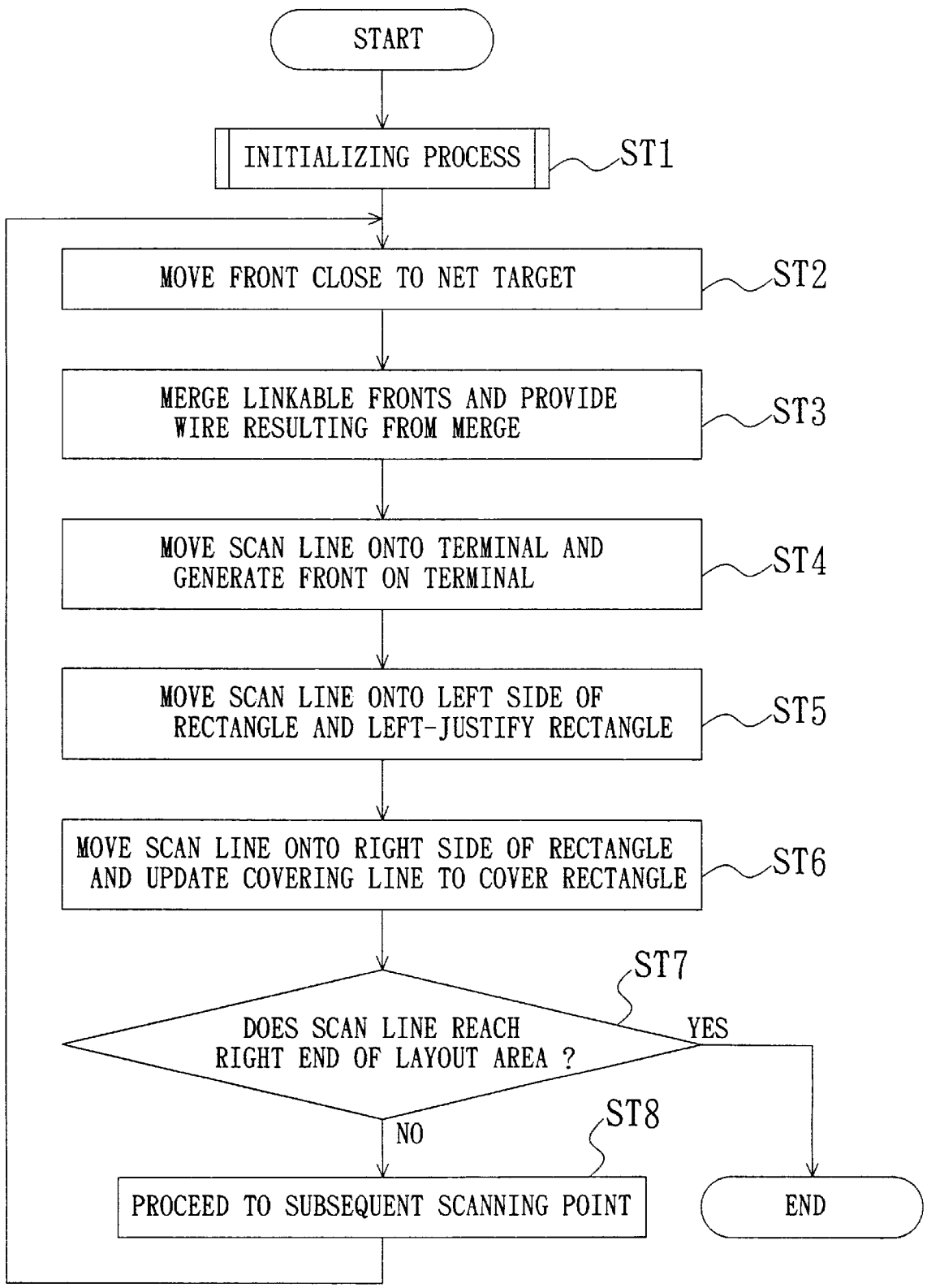
FIG. 11 is a flowchart for the compaction method of the first embodiment.
Figure 12:
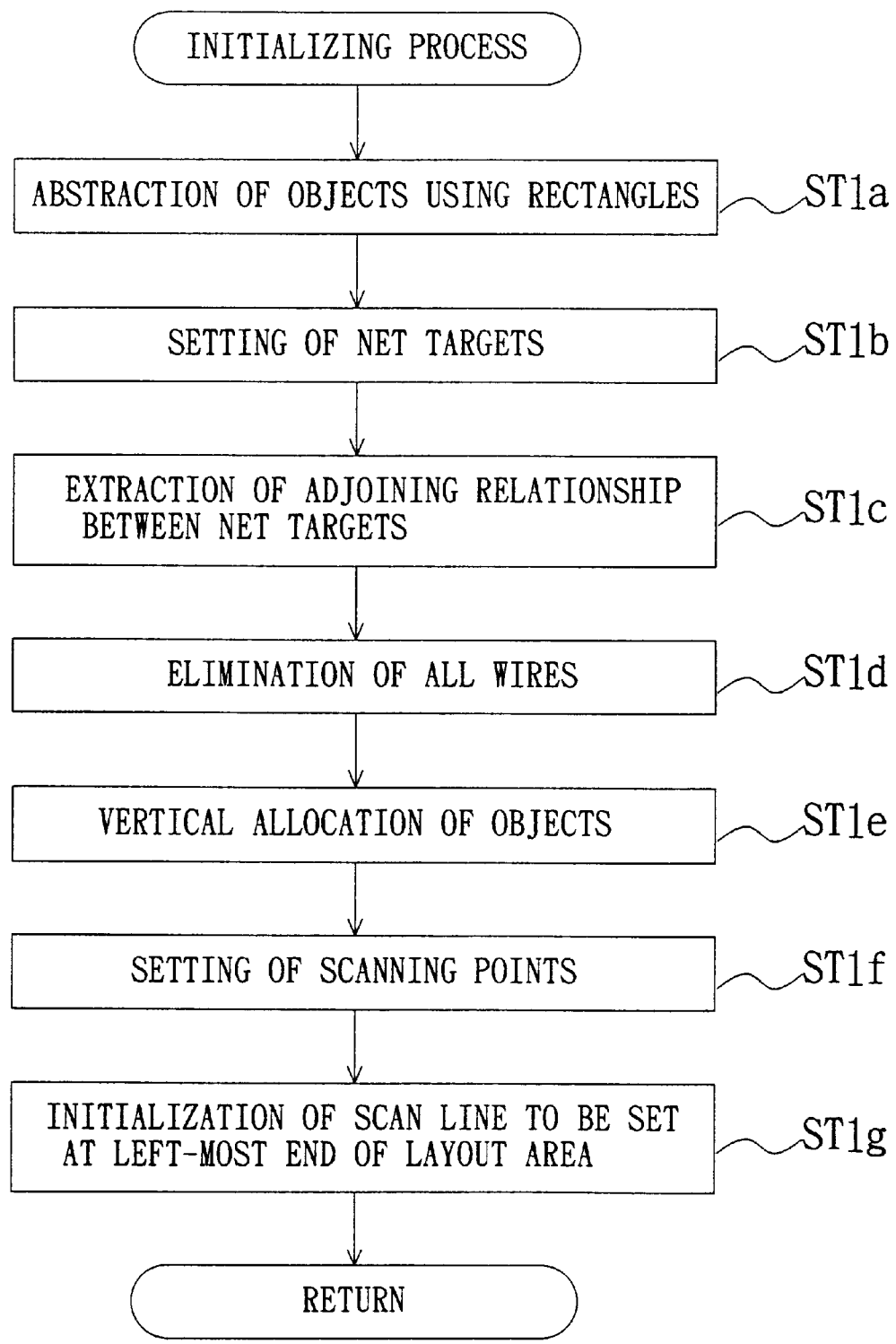
FIG. 12 is a flowchart for an initializing process of the compaction method of the first embodiment.

Process flow of the compaction method will now be described with reference to the drawings. FIGS. 11 and 12 are flowcharts for procedures in the compaction method of the first embodiment.

First, the details of an initializing process in step ST1 of FIG. 11 will be described with reference to FIG. 12.

As is shown in FIG. 12, first in step ST1a, objects of the layout, i.e., elements such as transistors, resistances, capacitors and contacts are abstracted to be represented by rectangles.

Next, in step ST1b, net targets are provided at a wire junction representing a terminal at the periphery or the center of each rectangle, a wire junction representing a wire branch point of a wire element and each intersection between a spit and a wire element. Then, in step ST1c, the adjoining relationship between the net targets are obtained so as to give data for connecting them.

Then, in step ST1d, existing wires are all eliminated, and in step ST1e, the vertical positions of the objects, i.e., the rectangles, are determined.

Next, in step ST1f, scanning points are obtained by sorting terminals 34, wire junctions 35, the left sides and the right sides of the rectangles in the scanning order, so as to generate a scanning point list. Then, in step ST1g, the position of a scan line is initialized, for example, to be set at the leftmost end of the layout area where the rectangles are aligned, and a covering line is also initialized.

Next, as is shown in FIG. 11, in step ST2, respective fronts on the scan line are moved to be closer to the corresponding net targets.

Next, in step ST3, the fronts which can be linked with each other are merged, and wire elements resulting from the merge are added in a routing process. Then, in step ST4, when the scan line is moved to a scanning point corresponding to a terminal, a new front is generated to be proceeded in a direction for extending a wire from this terminal.

Then, in step ST5, when the scan line is moved to a scanning point corresponding to the left side of a rectangle, the rectangle is left-justified. Subsequently in step ST6, when the scan line is moved to a scanning point corresponding to the right side of the rectangle, the covering line is updated so as to cover the rectangle.

Next, in step ST7, it is determined whether or not the scan line has reached the right end of the entire layout area, and in step ST8, the scan line is moved to a subsequent scanning point.

In this embodiment, all the rectangles are left-justified while moving the scan line from the left end of the layout area in the rightward direction successively to the scanning points. However, it goes without saying that the process can be conducted similarly with the rectangles right-justified and the scan line moved in the reverse direction.

Now, the contents of the procedures in the respective steps of the process flow will be described in more details.

(ST1a) Abstraction of objects of layout:

(1) As described with reference to FIGS. 4(a) and 4(b), the elements such as the transistors, the contacts including the pins, the resistances and the capacitors are abstracted by using the rectangles 33, the terminals 34, the wire elements 35 and the wire junctions 36.

(2) As described with reference to FIG. 5, the zone expression is obtained with regard to each set of the rectangles 33.

(3) As described with reference to FIG. 7, the spit 61 is provided at representative coordinates, that is, coordinates for penetrating a maximum number of rectangles in each horizontal zone. The set of the rectangles 33 to be aligned in each horizontal zone is positioned on the spit 61 provided at the center of the horizontal zone.

(4) As described with reference to FIG. 6, a vertical graph, i.e., a vertical constraint graph, is generated.

(4-1) The vertical graph is initialized.

(4-2) The vertexes 51 corresponding to the respective rectangles are added to the vertical graph. The vertexes 51 of the vertical graph respectively correspond to the rectangles, so that the significance of each vertex 51 corresponds to the vertical dimension of the corresponding rectangle.

(4-3) The respective spits are searched for, so that an effective branch 52 is added between the vertexes corresponding to the rectangles which are vertically adjacent to each other on each spit.

(4-4) As is shown in FIG. 13(a), it is assumed that a power supply line is disposed above the layout area for the transistors and that a ground line is disposed below the layout area for the transistors. In the case where p-type transistors Ap, Bp and Cp are disposed in a portion above the center of the layout area and n-type transistors An, Bn and Cn are disposed in a portion below the center, vertexes respectively corresponding to an upper end Sp of the layout area, a lower end Dn of the layout area and central separating portions Sn and Dp are added to the vertical graph. Among all the vertexes of the graph, the vertexes corresponding to the transistors are provided with the branches 52 and their significance in order to represent design rules for the upper end Sp, that is, the source of the transistor, the lower end Dn, that is, the drain of the transistor, and the central separating portions Sn and Dp.

(4-5) The vertexes Ap, Bp and Sn, which have no branch 52 extending from the upper end, the source, Sp, are provided with branches 52 extending from the upper end Sp, and the vertexes An, Bn, Cn and Dp, which have no branch 52 extending therefrom, are provided with branches 52 extending to the lower end, the drain, Dn.

(ST1b) Setting of net targets:

As described with reference to FIG. 8, the following procedures are conducted:

(1) The net target 62A is provided as a wire junction on a position corresponding to the terminal at the periphery of each rectangle 33 obtained by abstracting a transistor or the like;

(2) the net target 62B is provided as a wire junction on a position corresponding to each wire branch point; and (3) the net target 62C is provided on the intersection between the spit 61 and each horizontal wire element 35.

(ST1c) Extraction of adjoining relationship between net targets:

By searching for the existing wires among the respective net targets, the adjoining relationships among the net targets are obtained, so as to generate information for routing.

(ST1d) Elimination of wires:

All the existing wires connected before the compaction are eliminated.

(ST1e) Vertical allocation of objects:

(1) In accordance with the circumstances of the spits, the minimum interval between the adjacent rectangles according to the number of wires extending between the rectangles is provided to each branch between the vertexes corresponding to these rectangles as the significance of the branch. The minimum interval is given as the maximum value of sums of a pitch between a wire and a rectangle, a with of a wire and a pitch between adjacent wires on the respective layers.

Furthermore, as described with reference to FIGS. 13(a) and 13(b), the branches extending from the vertexes corresponding to the source Sp and the drain Dn are provided with their significance in the same manner as the vertexes corresponding to the rectangles.

(2) Initial allocation of the layout objects is obtained by calculating the maximum path length of the vertical graph. In the case of a rectangle representing a transistor, one representing a p-type transistor is justified toward the power supply line as close as possible, and one representing an n-type transistor is justified toward the ground line as close as possible. A rectangle representing a pin or a contact is allocated at the center of the layout area.

(ST1f) Setting of scanning points:

As described with reference to FIG. 10, the list of the scanning points is generated by sorting all the terminals, wire branch points, left and right sides of the rectangles in the ascending order of their coordinates in the horizontal direction.

(ST1g) Initialization of scan line and covering line:

The scan line and the covering line are initialized to be set at the left end of the layout area on each layer.

(ST2) Movement of front toward net target:

Each movable rightward front on the scan line is moved toward its target.

Specifically, the following procedures are executed on each rightward front on the scan line:

(1) When the net target of the front is a terminal on a rectangle or an intersection on the spit, the vertical coordinate value yt of the net target is used as a target y coordinate.

(2) A point yy where the rightward front can be closer to the target y coordinate is obtained in consideration of the layout inhibited area on the scan line, the with of the wire, the design rules and the like, and the obtained point yy is added to a list of possible moving points (each composed of a pair of a front and the coordinate value yy of the moving point).

(3) Among the possible moving points, those that can cause an intersection of wires on the same layer as a result of the movement are notified as errors.

(4) Among the remaining possible moving points, those for moving the front in the upper direction are sorted in the descending order of their vertical coordinates, and those for moving the front in the lower direction are sorted in the ascending order of their vertical coordinates.

(5) In accordance with the order of the sorted possible moving points, the front is moved and the routing resulting from the movement is conducted by executing a process "movefrontr" on the possible moving points.

Now, the operation of the process "movefrontr" will be described with reference to FIGS. 14(a) and 14(b).

<Process "Movefrontr" (Front, Vertical Coordinate yy)>

Figure 14B:
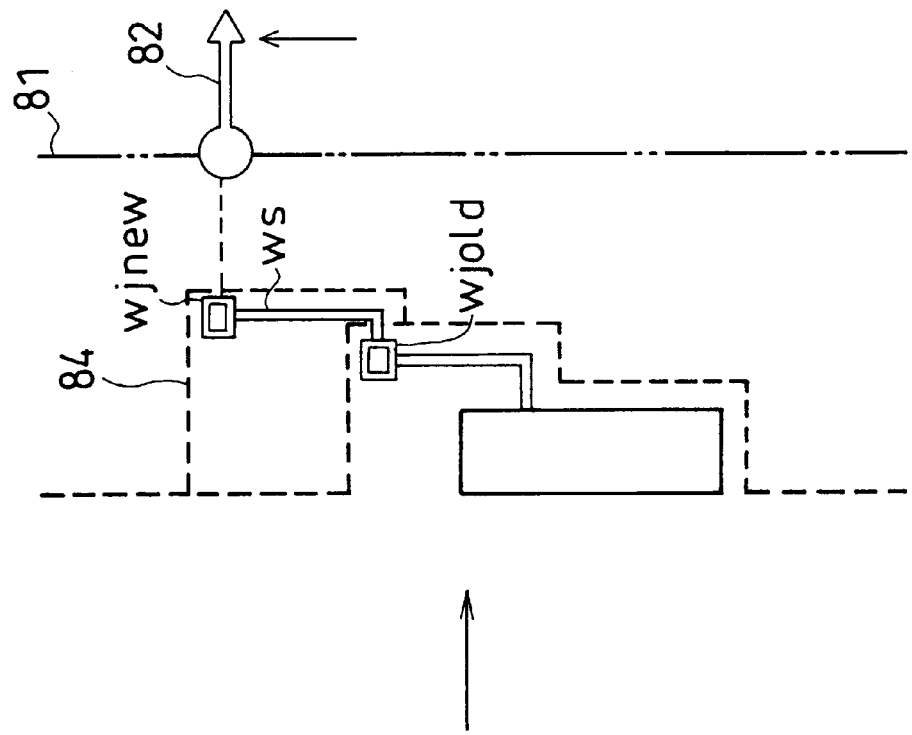
Figure 14A:
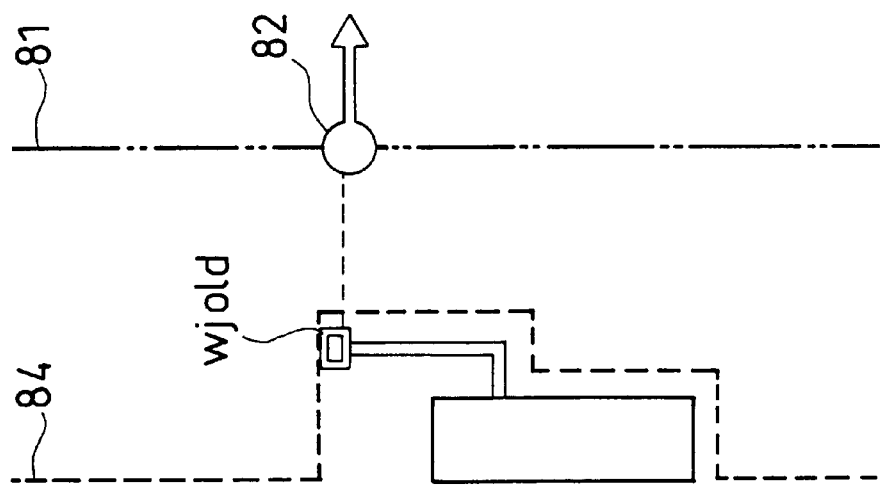

MF1) As is shown in FIG. 14(a), a wire junction which is at the tip of an existing wire corresponding to a front 82 is indicated as wjold.

MF2) As is shown in FIG. 14(b), a wire junction wjnew is newly generated at the y coordinate of the front 82 resulting from its movement.

MF3) A wire element ws is generated so as to vertically extend from the wire junction wjold to the wire junction wjnew.

MF4) The wire element ws is left-justified so as to extend along a covering line 84, and the covering line 84 is updated.

Figure 15:
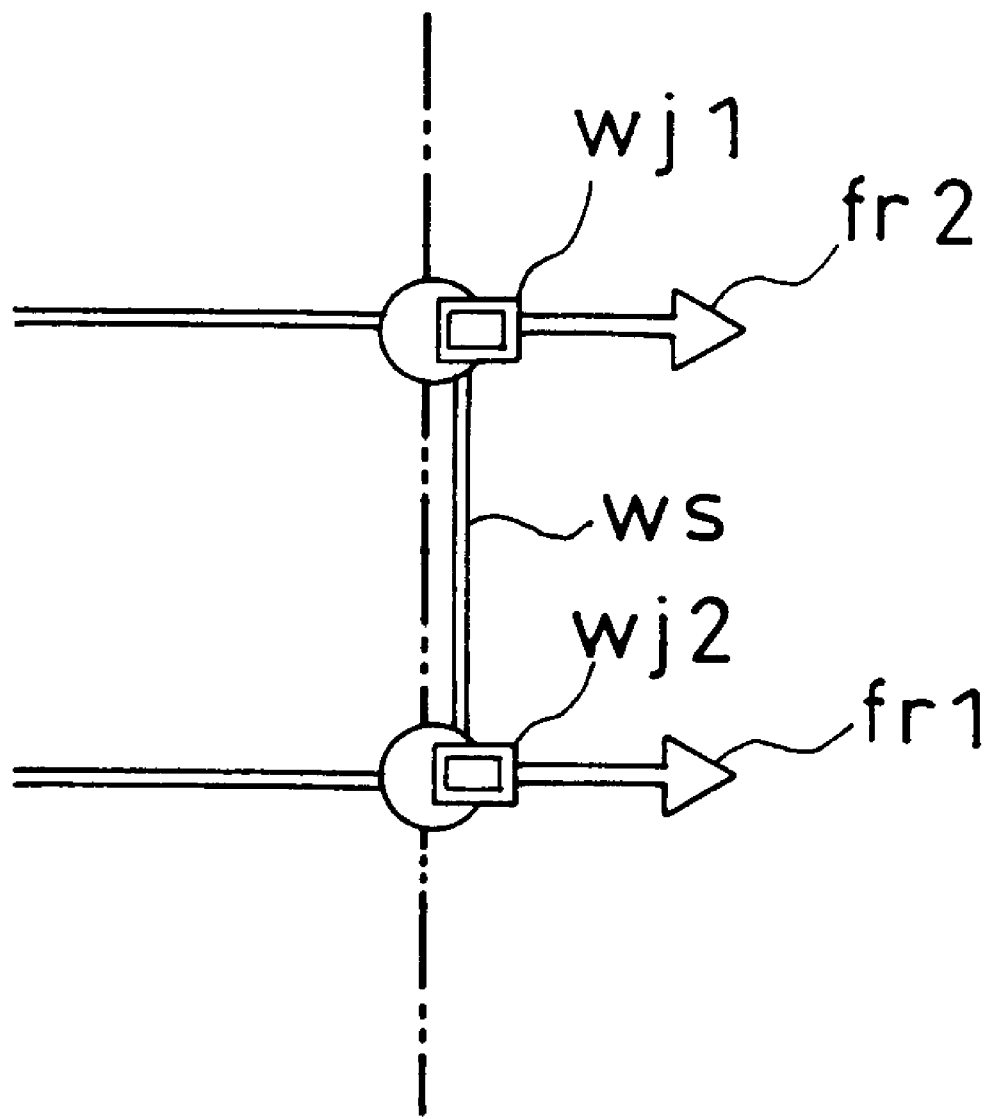
FIG. 15 shows generation of a wire element extending in the vertical direction by merging fronts in the compaction method or routing method of the first embodiment.

(ST3) Merge of fronts:

As is shown in FIG. 15, between a pair of rightward fronts fr1 and fr2 adjacent to each other in the same net, a vertical wire for connecting them is generated by using a process "connectverticalfronts". A net herein means a set of objects to be connected with one another at the same potential.

<Process "Connectverticalfronts" (Front fr1, Front fr2)>

CV1) A wire junction corresponding to the front fr1 is indicated as wj1, and a wire junction corresponding to the front fr2 is indicated as wj2.

CV2) The wire element ws vertically extending from the wire junction wj1 to the wire junction wj2 is generated.

CV3) The wire element ws is left-justified so as to extend along the covering line 84, and the covering line 84 is updated.

(ST4) When the scan line is located on a terminal of a rectangle, a front is generated to proceed in a direction for extending a wire from the terminal.

Figure 16:
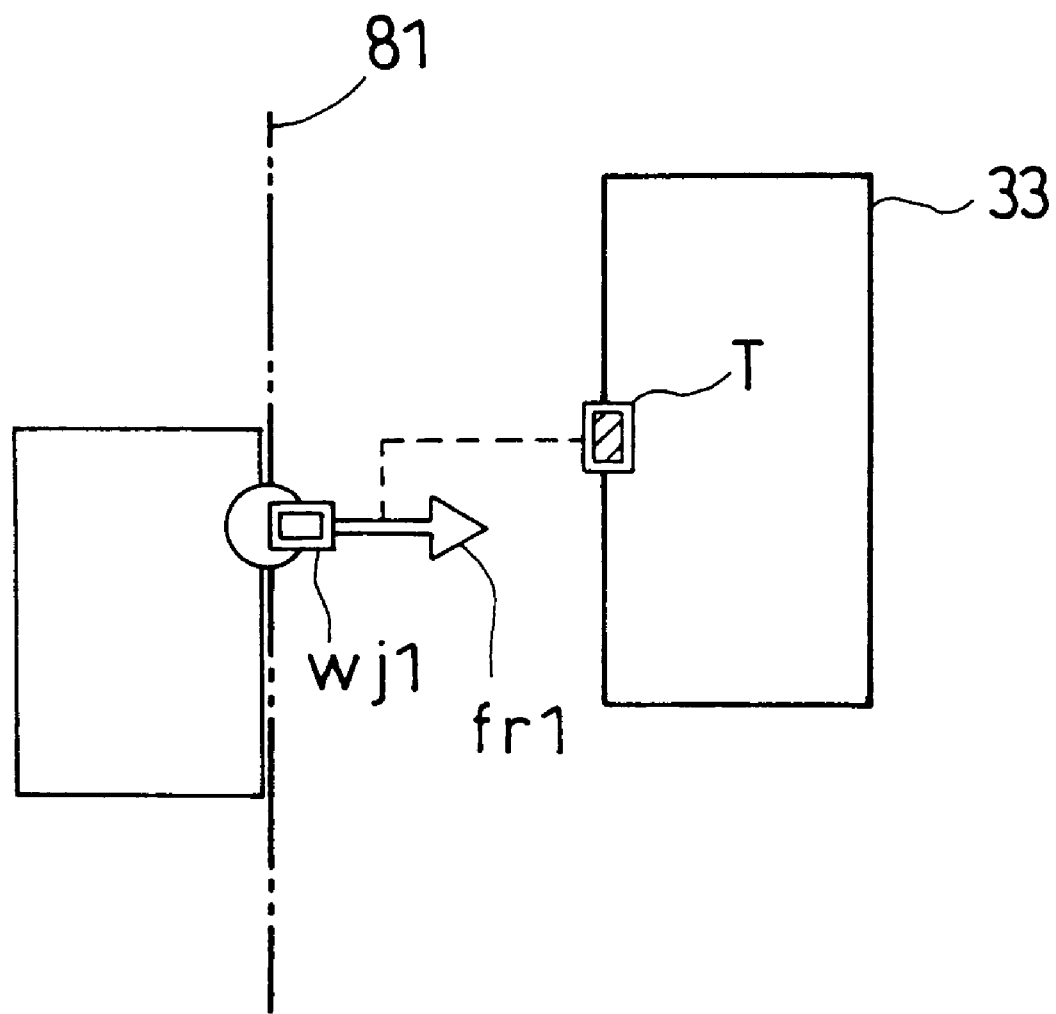
FIG. 16 shows generation of a wire element extending in the horizontal direction in the compaction method and routing method of the first embodiment.

Specifically, the following procedures are conducted on all the wires connected with a terminal T to extend in various directions:

(1) The case where a wire extending in the leftward direction is connected with the terminal T:

(1-1) When a rightward front fr1 having the terminal T of the rectangle 33 as its net target is already present on the scan line 81 as shown in FIG. 16, a wire is disposed from a wire junction wj corresponding to the front fr1 to the terminal T, that is, the net target, by using the aforementioned process "movefrontr".

Figure 17A:
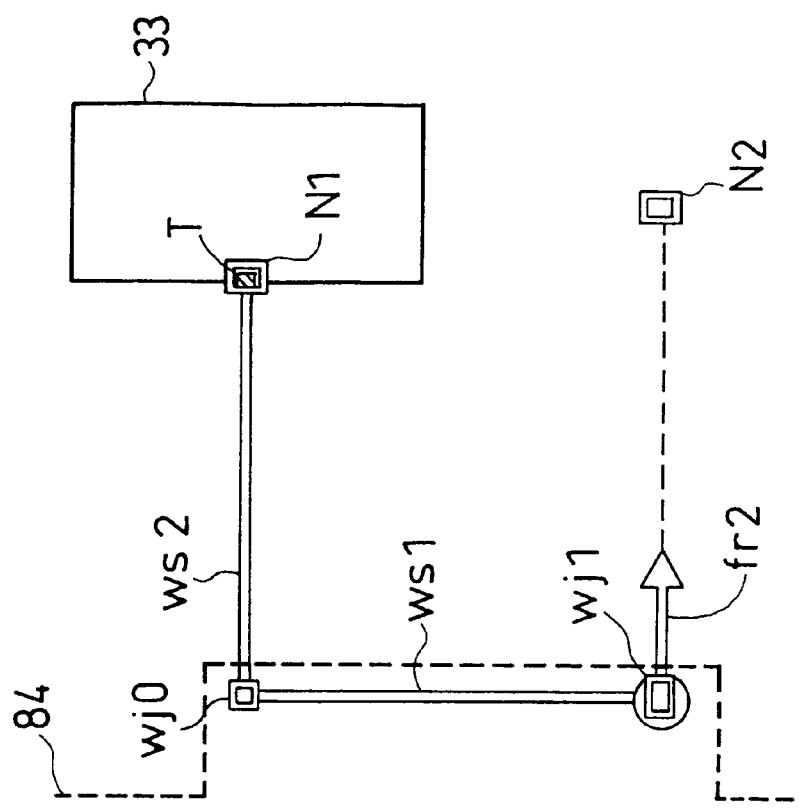

(1-2) When a rightward front having the terminal T of the rectangle 33 as its net target is not present on the scan line as is shown in FIG. 17(a), the net target on the terminal T is indicated as N1.

A new wire junction wj0 is generated so as to be positioned on the left side of the terminal T and have the same vertical coordinate as the terminal T.

A wire element ws2 is generated to extend between the wire junction wj0 and the terminal T.

A subsequent net target on the right side of the net target N1 is indicated as N2.

Figure 17B:
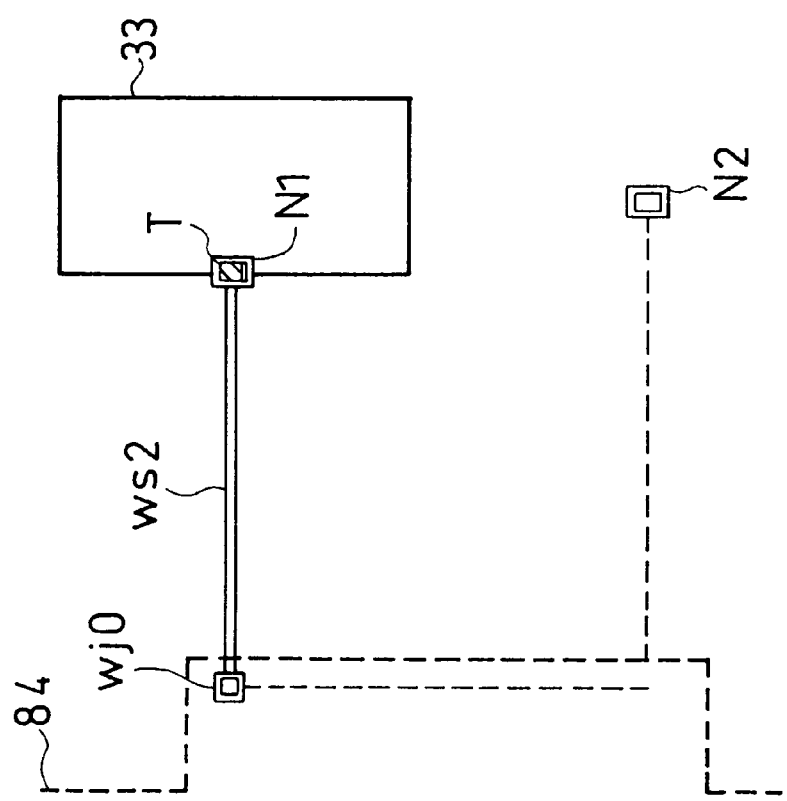

As is shown in FIG. 17(b), a new wire junction wj1 is generated at the same vertical coordinate as the net target N2 and at the same horizontal coordinate as the wire junction wj0, and then a wire element ws1 is generated so as to extend between the wire junction wj0 and the wire junction wj1.

A new rightward front fr2 is provided with the wire junction wj1 as the origin, and the target of the front fr2 is set to be the net target N2.

Figure 18:
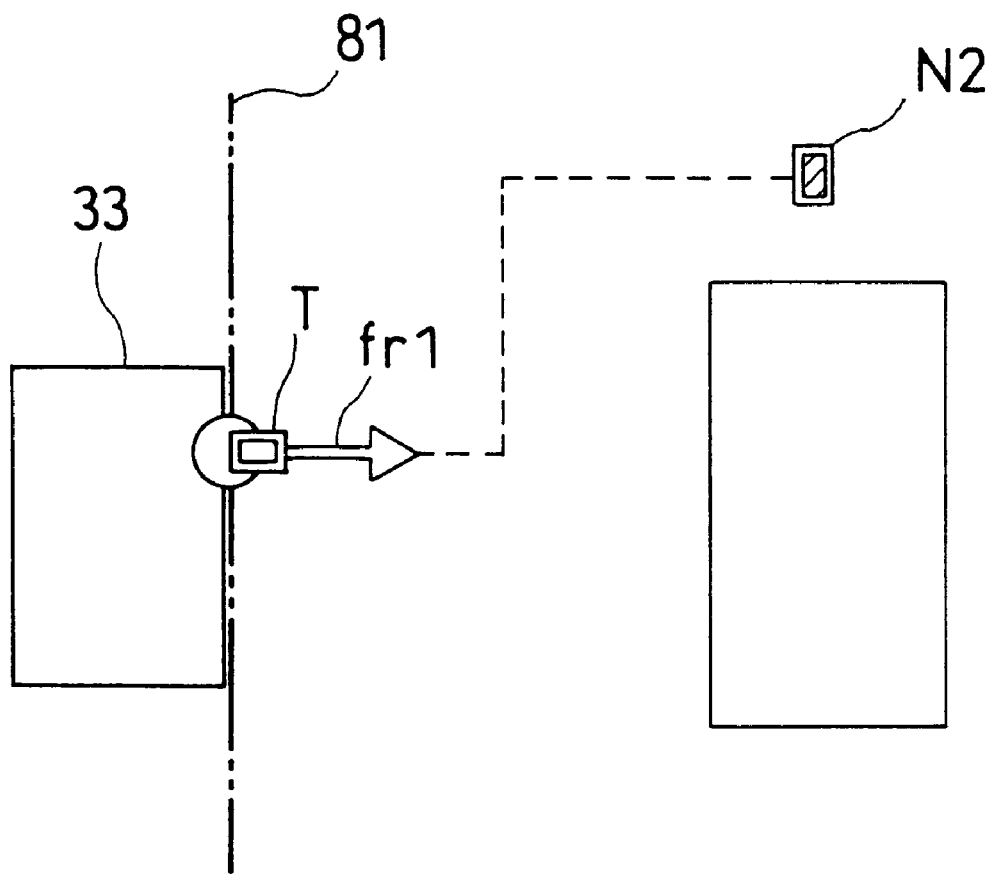
FIG. 18 shows generation of a wire element extending in the horizontal direction adopted in the case where a wire extending in the scanning direction is provided to a terminal on a scan line in the compaction method and routing method of the first embodiment.

(2) The case where a wire extending in the rightward direction is connected with the terminal T:

As is shown in FIG. 18, a rightward front fr1 is generated on the scan line, and a wire junction on which the front fr1 is positioned is set on the terminal T of the rectangle 33.

A target of the front fr1 is changed to a subsequent net target N2 on the right side of the terminal T.

(3) In the case where a wire extending in the vertical direction, for example, in a direction for decreasing its vertical coordinate (i.e., downward), is connected with the terminal T, a downward front fr1 is newly provided on the scan line. The target of the front fr1 is changed to a net target N1 disposed in the downward direction of the net target corresponding to the terminal T.

Figure 19A:
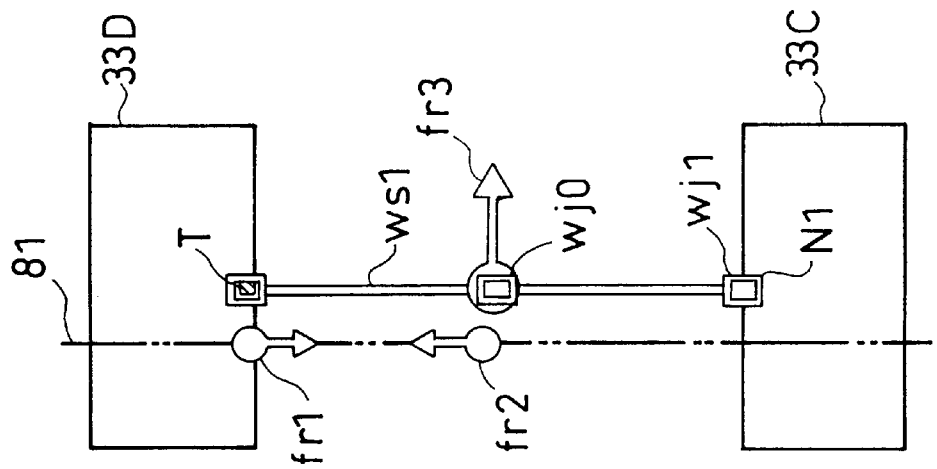

(3-1) The case where a wire connecting a wire junction wj1 corresponding to a net target N1 on a rectangle 33C with the terminal T of a rectangle 33D is required and a front fr2 proceeding from the wire junction wj1 of the rectangle 33C to a net target on the terminal T of the rectangle 33D is present as is shown in FIG. 19(a):

A wire element ws1 is generated so as to extend between the terminal T and the wire junction wj1.

A covering line 84 is updated.

The fronts fr1 and fr2 are eliminated.

Figure 19B:
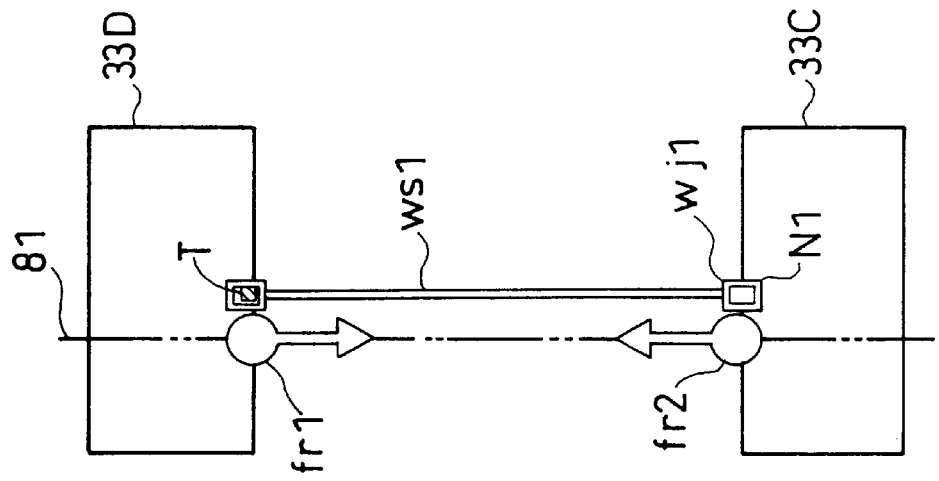

(3-2) The case where a wire for connecting a wire junction wj1 corresponding to a net target N1 on a rectangle 33C with the terminal T of a rectangle 33D is required, a front fr2 proceeding from the wire junction wj1 of the rectangle 33C to the terminal T of the rectangle 33D is present, and a wire junction wj0 corresponding to a wire branch point is present between the terminal T of the rectangle 33D and the wire junction wj1 of the rectangle 33C as is shown in FIG. 19(b):

A wire element ws1 is generated so as to extend between the terminal T and the wire junction wj1.

A covering line 84 is updated.

The fronts fr1 and fr2 are eliminated.

A front fr3 is newly provided on the wire junction wj0.

Figure 20:
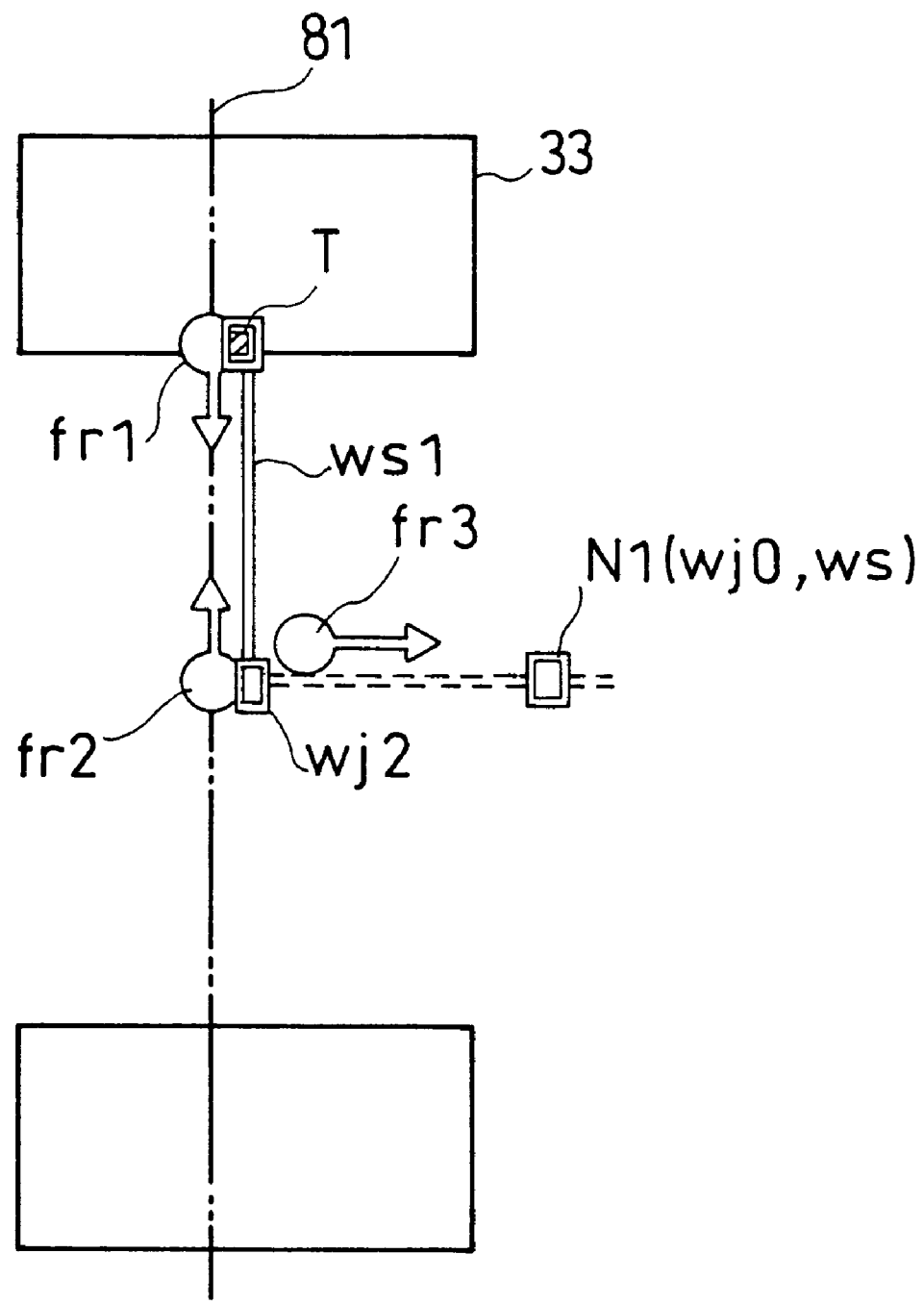
FIG. 20 shows generation of a wire element extending in the vertical direction adopted in the case where a net target is present in the scanning direction beyond a terminal on a scan line in the compaction method or routing method of the first embodiment.

(3-3) The case where a net target N1 is provided on the right side of the terminal T of the rectangle 33 and on a wire junction wj0, and no wire extends upward through the wire junction wj0 or the case where a net target N1 is present on a horizontally extending wire element ws as is shown in FIG. 20:

A new wire junction wj2 is generated at the same horizontal coordinate as the terminal T and at the same vertical coordinate as the net target N1.

An upward front fr2 proceeding to the terminal T is generated on the wire junction wj2, and then a wire element ws1 is generated so as to extend between the front fr1 and the front fr2.

After left-justifying the wire element ws1 so as to extend along a covering line 84, the covering line 84 is updated.

The fronts fr1 and fr2 are eliminated.

A rightward front fr3 is provided on the wire junction wj2.

Figure 21:
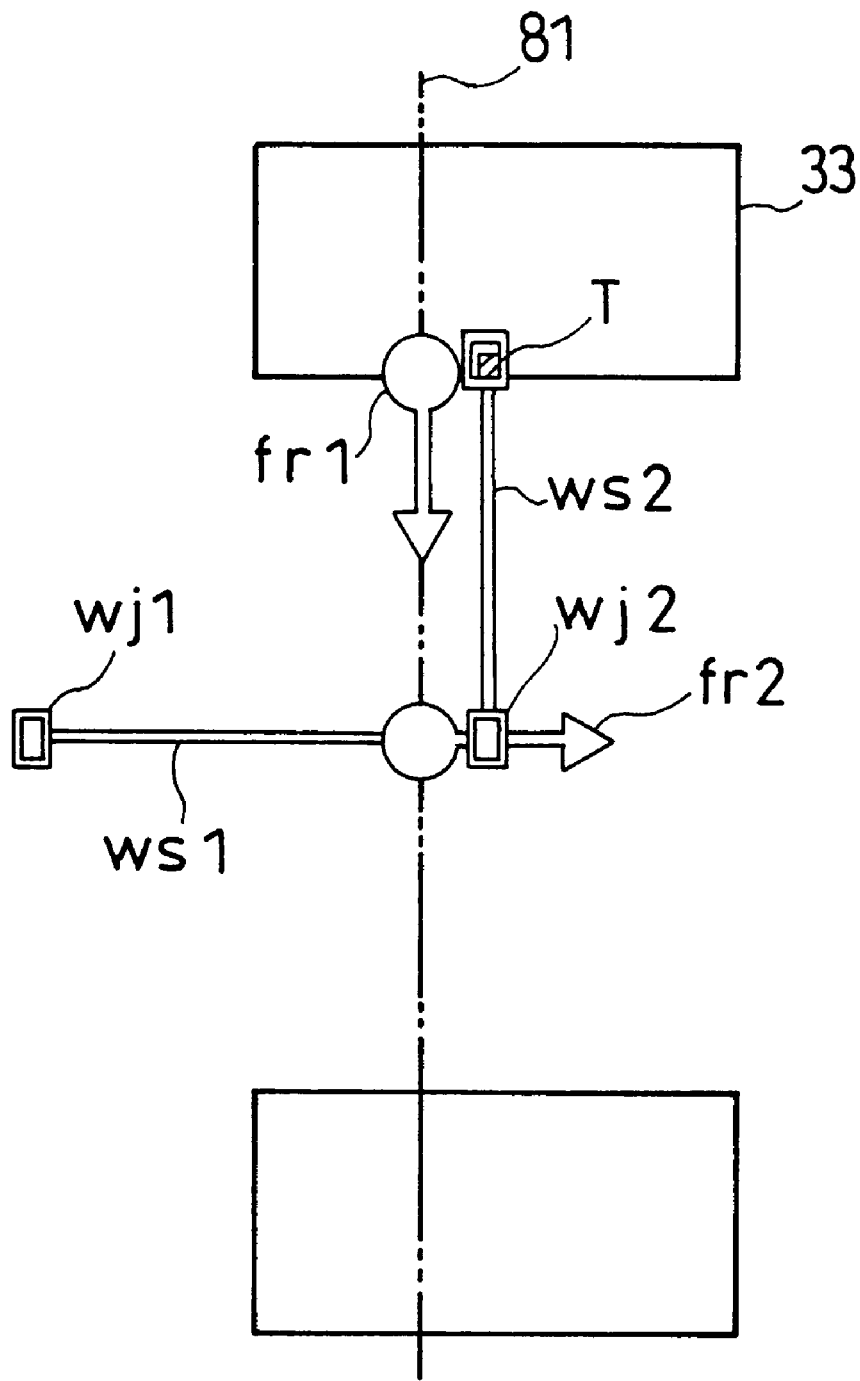
FIG. 21 shows generation of a wire element extending in the vertical direction adopted in the case where a net target is not present in the scanning direction beyond a terminal on a scan line in the compaction method or routing method of the first embodiment.

(3-4) The case where no net target is present on the right side of the terminal T of the rectangle 33, namely, the terminal T is positioned at the right end, as is shown in FIG. 21:

A new wire junction wj2 is generated, so that a front fr2 proceeding to the terminal T is present on a scan line, at the same vertical coordinate as the front fr2 and at the same horizontal coordinate as the terminal T.

A horizontal wire element ws1 is generated so as to extend between wire junctions wj1 and wj2 disposed on a leftward extension line from the front fr2.

A vertical wire element ws2 is generated so as to extend between the terminal T and the wire junction wj2, the wire element ws2 is left-justified so as to extend along a covering line 84, and the covering line 84 is updated.

The fronts fr1 and fr2 are eliminated.

(ST5) When the scan line reaches the left side of a rectangle, the rectangle is left-justified along the covering line 84, and an area where the justified rectangle overlaps the scan line is defined as a layout inhibited area.

(ST6) When the scan line reaches the right side of a rectangle, the covering line 84 is updated so as to cover the rectangle in an area on the left side of the covering line 84. Then, a layout inhibited area which has been occupied by the rectangle on the scan line is eliminated.

Figure 22A:
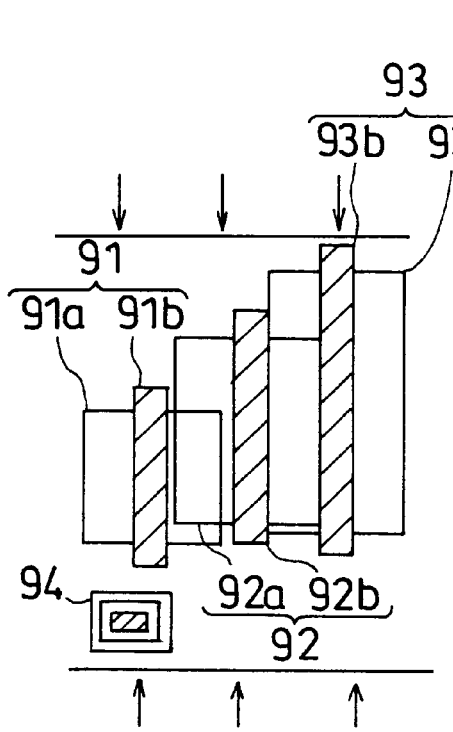
Figure 22B:
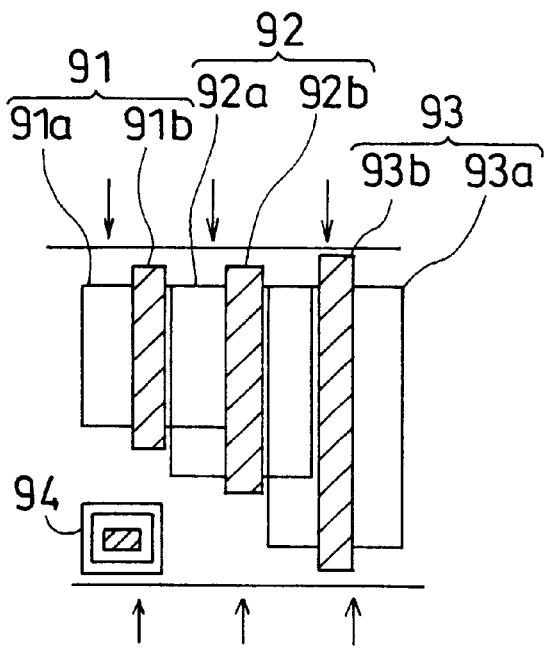

As described above, the compaction method of this embodiment has the following characteristics: It is assumed that three MOS transistors 91, 92 and 93 and one contact 94 are aligned in a layout area as is shown in FIG. 22(a). It is assumed that the MOS transistor 91 including impurity diffused areas 91a and a gate electrode 91b and the MOS transistor 92 including impurity diffused areas 92a and a gate electrode 92b share part of the impurity diffused areas 91a and 92b adjacent to each other. Also, it is assumed that the MOS transistor 93 including impurity diffused areas 93a and a gate electrode 93b and the MOS transistor 92 share part of the impurity diffused areas 93a and 92a adjacent to each other. In such a case, as is shown in FIG. 22(b), according to the compaction method of this embodiment, an irregular figure (rectilinear) formed by sharing part of rectangles is abstracted by using plural rectangles, and the adjoining relationship between the abstracted rectangles is held as data for interconnection. Accordingly, the impurity diffused area 92a of the MOS transistor 92 and the impurity diffused area 93a of the MOS transistor 93 are slid, so as to attain vertical compaction.

A compaction apparatus using the compaction method of this embodiment comprises means for realizing the aforementioned respective steps ST1 through ST8.

Furthermore, in the routing method of this embodiment, the step described as step ST5 alone is omitted, and a routing apparatus of this embodiment comprises means for realizing the remaining steps excluding step ST5.

(Embodiment 2)

A second embodiment of the invention will now be described with reference to the drawings.

The compaction method of this invention is different from the strictly defined conventional compaction method as described above, and movement of the layout objects and detailed routing are executed at the same time. Specifically, in the present compaction method, while a virtual line (scan line) vertical to one side of a layout area is moved from one end of the layout area to the other end, a tip point (front) of a wire is extended as well as the layout objects are justified in the direction toward a scanning start point.

The layout objects include wire contacts, pins, and transistor diffused areas and metal wire drawing contacts on the transistor diffused areas. Each object is provided with a terminal for connecting with a wire at its periphery or inner portion.

A set of a diffused area of single transistor or a diffused area shared by plural transistors and layout objects on the diffused area is designated as a diffusion island. In considering optimization of gate bend where a gate electrode of a transistor is bent, left-justification movement and layout generation are preferably conducted at one time so as to simultaneously consider the positional relationships among the objects included in the diffusion island also in view of a wire on another layer above the diffusion island. Accordingly, in this embodiment, when a scan line reaches the right end of the objects included in a diffusion island, the layout within the diffusion island is generated, and then the entire diffusion island is left-justified.

Now, the entire process for the compaction and the layout generation, and the layout generation within a diffusion island of this embodiment will be described.

(2.1) Entire process:

As the outline of this embodiment, the left-justification movement of layout objects represented by rectangles and the generation of wires conducted at the same time will now be described with reference to FIGS. 2(a) through 2(e).

First, as is shown in FIG. 2(a), a rough wire path is expressed by using net targets 5A and 5B, which are passing points of a wire, and a list of an adjoining relationship between the net targets 5A and 5B. The net targets 5A and 5B are disposed on wire junctions each representing a terminal, a wire branch point or a point where the vertical positional relationship between the objects in the layout area should be expressed. A left-end boundary of an area where rectangles can be disposed is designated as a covering line 8.

As a basic concept, when a scan line 6 scans a new terminal, a new front 7 is disposed on the scan line 6, the front 7 is moved so as to proceed to a subsequent net target on its right side, and a trace resulting from the movement of the front 7 is provided as a wire path.

Points scanned by the scan line 6 are the right and left sides of a rectangle, a wire junction and a wire branch point. The order of scanning these points is determined by their positional relationship before the compaction. Each time the scan line 6 passes a terminal, a new front 7 is provided on the scan line 6.

Then, as is shown in FIG. 2(b), the scan line 6 is moved rightward and the front 7 is moved along the scan line 6 so as to proceed toward the net target 5A at the same time. As the front 7 moves, a vertical wire is formed, and the covering line 8 is updated so as to cover the vertical wire.

Next, as is shown in FIG. 2(c), when the scan line 6 scans the left end of a rectangle 1B, the rectangle 1B is moved leftward toward the covering line 8. At this point, when the rectangle 1B represents a part of a diffusion island, the rectangle 1B is linked with other plural rectangles. Therefore, diffusion island inner layout generating means is notified of information on these plural rectangles and a wire extending on a layer above these plural rectangles, and the layout within the diffusion island is previously generated and then all the figures included in the diffusion island are left-justified. The left-justified rectangles are treated as an obstruction (layout inhibited area 9) against a wire on a specified layer. In other words, a front 7 on the layer specified as the layout inhibited area on the scan line 6 cannot move beyond the layout inhibited area 9.

Next, as is shown in FIG. 2(*d*), when the scan line 6 passes the rectangle 1B, the covering line 8 is updated so as to cover the rectangle 1B. Then, as is shown in FIG. 2(*e*), the front 7 is eliminated when it reaches the net target 5B.

Figure 23:
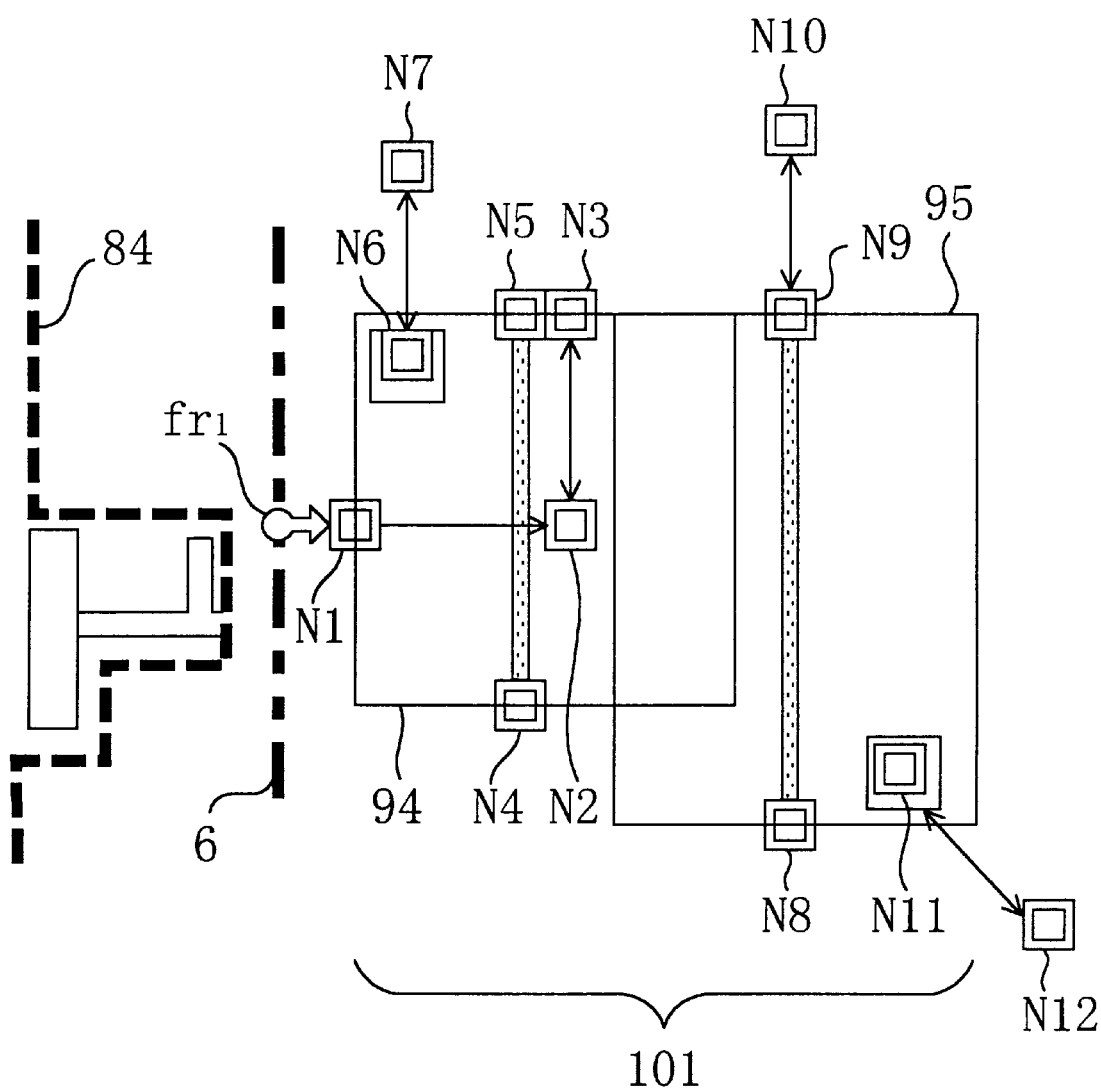
FIG. 23 is a diagram for showing input data for diffusion island inner layout generating means used in a compaction method of a second embodiment.

FIG. 23 shows an example of figure information notified the diffusion island inner layout generating means. In FIG. 23, a reference numeral 84 denotes a covering line, a reference numeral 6 denotes a scan line, and fr1 denotes a front. Also, a reference numeral 94 denotes a first MOS transistor including net targets N4, N5 and N6, and a reference numeral 95 denotes a second MOS transistor including net targets N8, N9 and N11. A reference numeral 101 denotes a diffusion island including the first MOS transistor 94 and the second MOS transistor 95 sharing a diffused area. N7, N10 and N12 respectively denote net targets corresponding to wire junctions.

In this embodiment, a layout model in which a rough wire path can extend above the diffusion island 101 is used so that another layer can be disposed above the transistors. For example, when it is assumed that a metal wire is disposed on one layer, a metal wire drawing contact from a diffused area can be an obstruction, but a layer different from that of the metal wire drawing contact, for example, polysilicon or a diffused area cannot be an obstruction. Therefore, the rough wire path is determined in consideration of a drawing contact from a diffused area alone as an obstruction.

N1, N2 and N3, which are intersections between the rough wire path and the boundaries of the layout objects, are newly provided as net targets, and the diffusion island inner layout generating means for generating the detailed layout within the diffusion island is notified of the figure information on the diffusion island 101.

The diffusion island inner layout generating means does not conduct an actual routing process but transfers a list of rectangles which can be obstructions against a metal wire and a polysilicon wire to a unit from which the figure information is received, so that wires can be formed by moving a front in the subsequent compaction process.

The relative positions of the set of rectangles generated at this point are already determined, and hence, they are not moved afterward. However, a front is moved and a covering line is updated in accordance with the scanning order determined before the compaction, so that the wires can be formed at positions specified through rough routing.

(Process flow)

Figure 24:
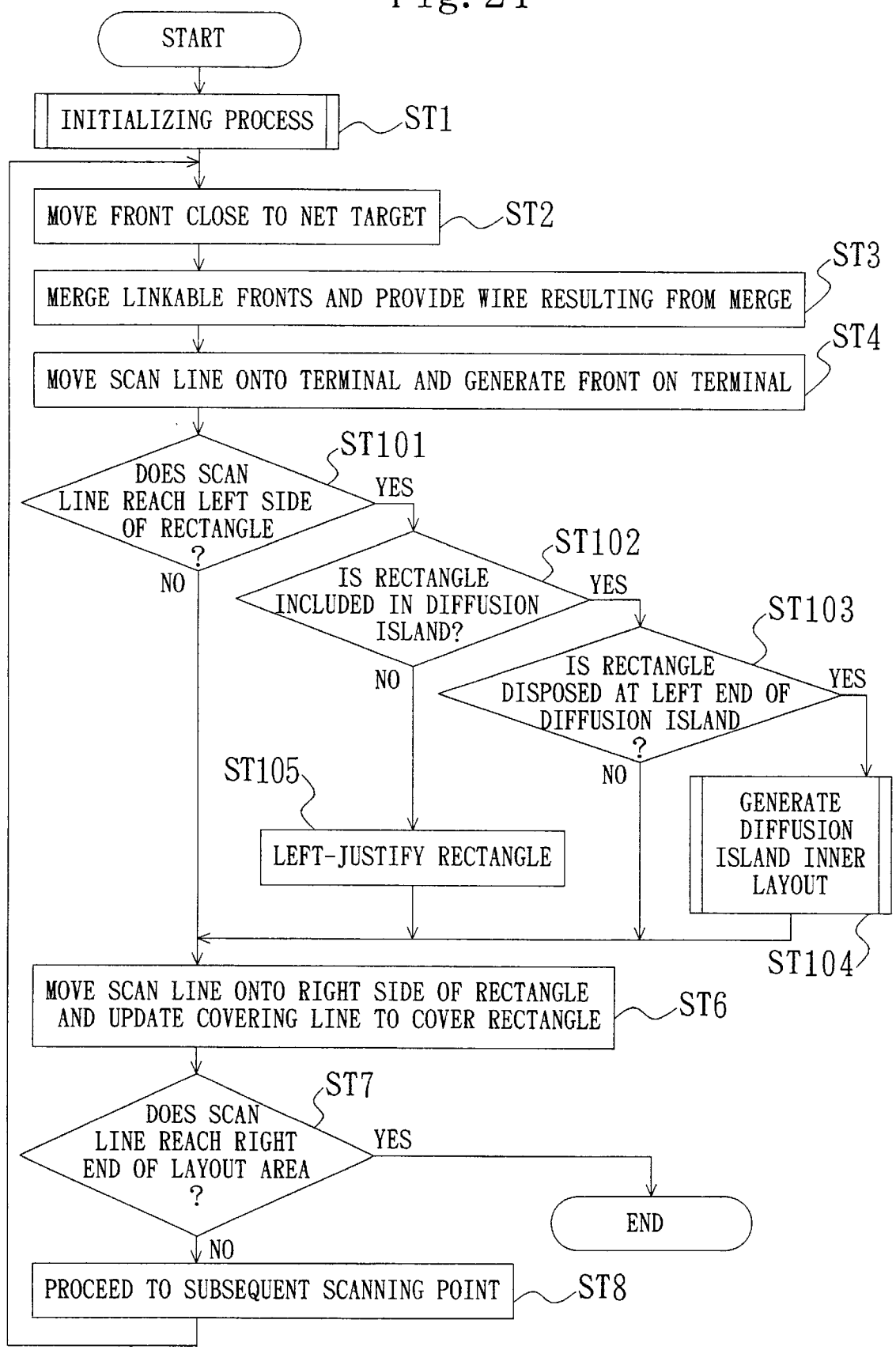
FIG. 24 is a flowchart for the compaction method of the second embodiment.

FIG. 24 is a flowchart for the compaction method of the second embodiment. As compared with the process flow of the first embodiment shown in FIG. 11, steps ST1 through ST8 are the same except that step ST5 for left-justifying the rectangles is replaced with steps ST101 through ST104.

Specifically, when the left end of a rectangle is scanned, the subsequent process is switched in accordance with the following three cases:

(1) the case where the rectangle is included in a diffusion island and is positioned at the left end of the diffusion island;

(2) the case where the rectangle is included in a diffusion island except for the case (1); and (3) the case where the rectangle is not included in a diffusion island and is an object which can be singly processed to move or the like.

In the case (1), a layout area for a wire on a layer above the diffusion island is secured and a layout pattern within the diffusion island is generated in a diffusion island inner layout generating step ST104.

In the case (2), no process is conducted.

In the case (3), the rectangle is left-justified as far as possible.

(2.2) Generation of layout within diffusion island:

The generation of a layout within a diffusion island is a subsystem of the compaction which is executed when the scan line reaches the right side of a rectangle in the diffusion island. Now, the function and the process procedures of the diffusion island inner layout generating means will be described.

Figure 25A:
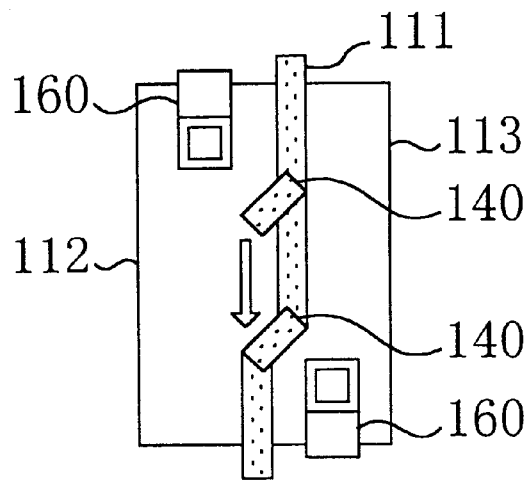
FIGS. 25(a) through 25(c) are diagrams for showing a method of generating a layout within a diffusion island in the compaction method of the second embodiment.
Figure 25B:
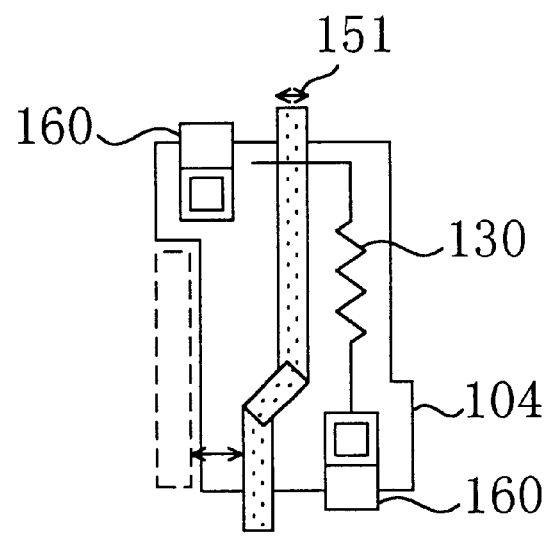
Figure 25C:
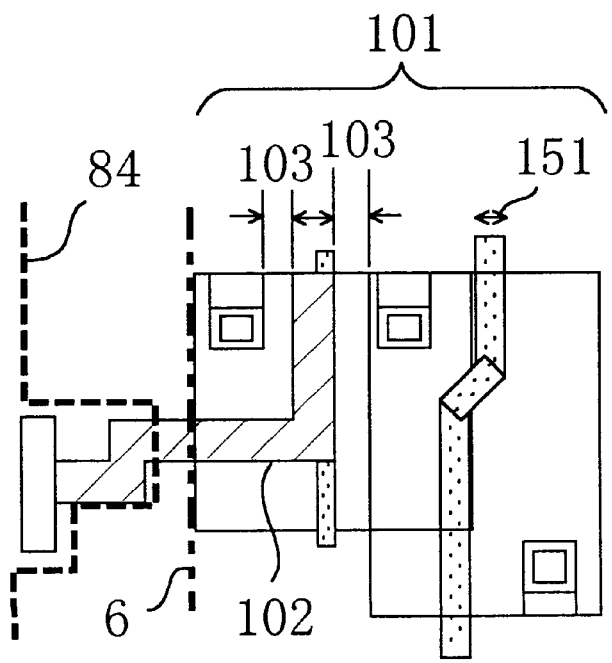

FIGS. 25(*a*) through 25(*c*) show a layout method adopted in the diffusion island inner layout generating step. In FIG. 25(*a*), a reference numeral 111 denotes a bent gate of a MOS transistor having a bent portion 140, a reference numeral 112 denotes a source of the MOS transistor, a reference numeral 113 denotes a drain of the MOS transistor, and a reference numeral 160 denotes a diffusion contact disposed in the diffused area of the MOS transistor.

(Function)

(1) Generation of bent gate:

As is shown in FIG. 25(*a*), the layout objects in the diffusion island can be independently moved from an object aligned outside of the diffusion island, and hence, the bent gate 111 having a bent shape can be provided to the MOS transistor. Accordingly, by moving the bent portion 140, the capacitance of the drain 113 can be decreased.

(2) Control of figure of diffused area:

As is shown in FIG. 25(*b*), the layout objects in the diffusion island can be independently moved from an object aligned outside of the diffusion island, and hence, a width along a gate length 151 of the diffused area 104 where the diffusion contact 160 is not disposed can be decreased as compared with that where the diffusion contact 160 is disposed. Furthermore, the dimension along the gate width can be controlled so that a series resistance 130 cannot exceed its upper limit. As a result, the area occupied by the transistor and the capacitance of the drain can be both decreased.

(3) Security of space for wire on upper layer of diffusion island:

As is shown in FIG. 25(*c*), after generating the layout within the diffusion island, an upper layer wire 102 is disposed so as to extend on a layer above the diffusion island. At this point, it is possible to previously secure a space 103 for the upper layer wire in a direction along the gate length 151.

(Data structure)

Figure 27:
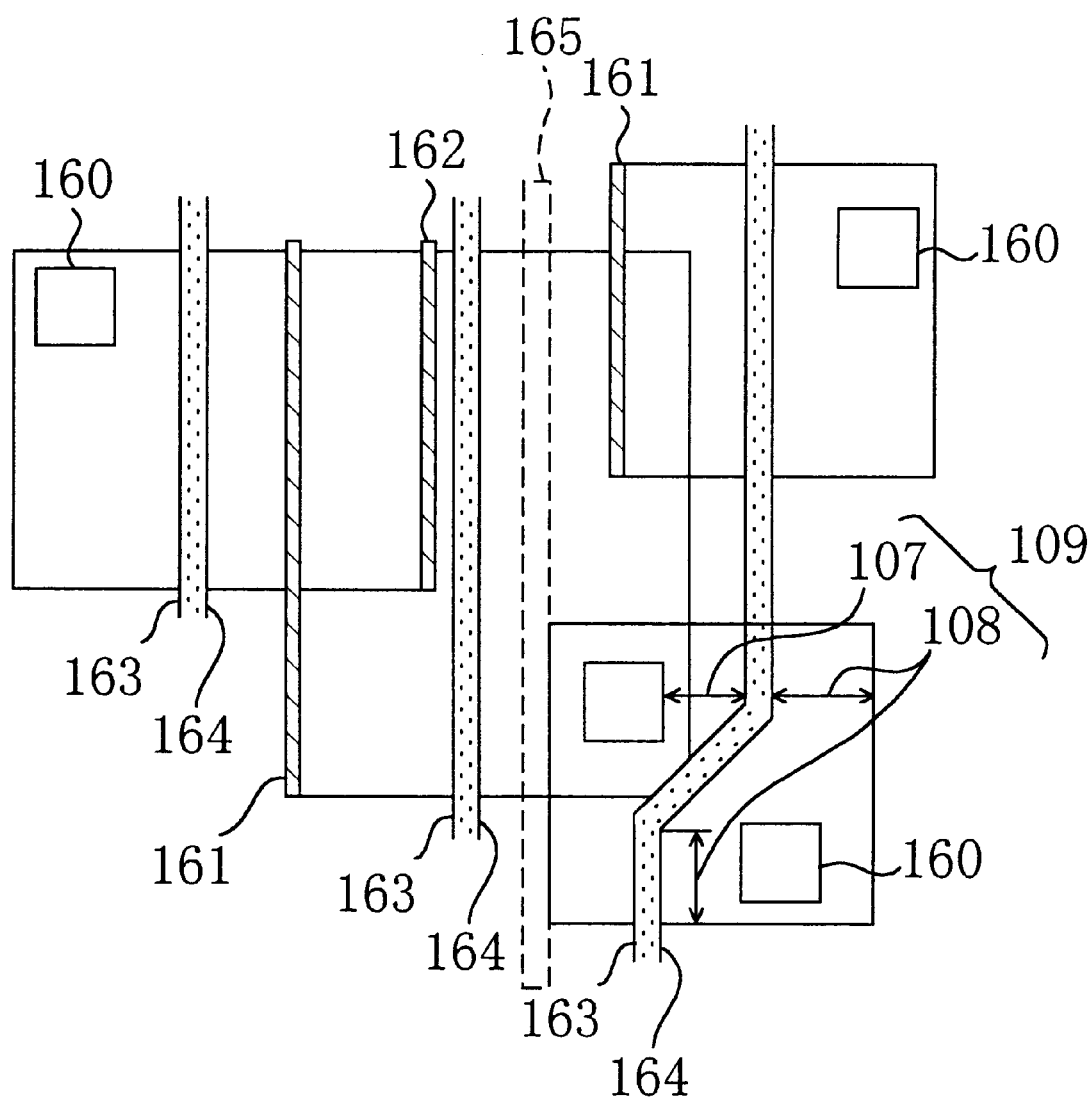
FIG. 27 shows the relationship between figure elements and design rules in the compaction method of the second embodiment.

(1) Figure components:

FIG. 26 is a table listing figure components included in a diffusion island. FIG. 27 shows an example of the diffusion island and figure components belonging to this diffusion island. In FIG. 27, a reference numeral 160 denotes a diffusion contact listed as No. 5 in FIG. 26, a reference numeral 161 denotes a diffusion left end listed as No. 1 in FIG. 26, a reference numeral 162 denotes a diffusion right end listed as No. 2 in FIG. 26, a reference numeral 163 denotes a gate left end listed as No. 3 in FIG. 26, and a reference numeral 164 denotes a gate right end listed as No. 4 in FIG. 26. A deformable gate and diffused area are an area disposed in the direction along the gate length from the gate left end 163 and an area extending in the direction along the gate length from the gate right end 164. The diffusion contact 160 with a fixed shape is represented by a rectangle, and a net target, which is a wire disposed on a layer above the diffusion island, is represented by a virtual figure component of a rectangle 165.

(2) Design rules:

As is shown in FIG. 27, design rules 109 which are required to be taken into consideration in this embodiment are a minimum space 107, a minimum overlap 108, and in the case of a bent gate, another minimum overlap 108 disposed in a direction along the width of the transistor between the end of the diffused area and the bent portion.

Figure 28A:
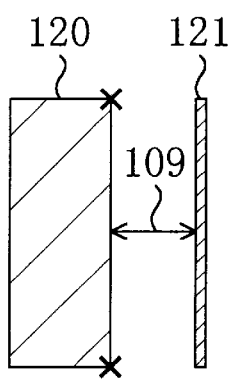
FIGS. 28(a) through 28(c) show layout inhibited areas in the compaction method of the second embodiment.
Figure 28B:
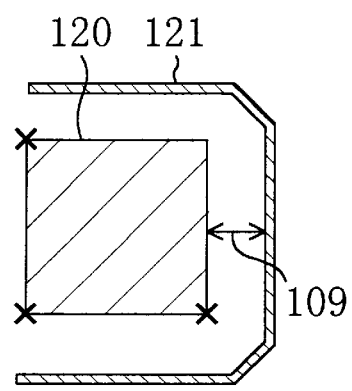
Figure 28C:
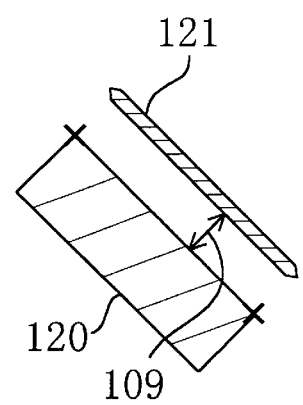

(3) Layout inhibited area:

As is shown in FIGS. 28(a) through 28(c), a layout inhibited area 121 is obtained as a figure formed by enlarging a figure component 120 to the outward directions by a distance corresponding to the design rule 109 of the minimum space or the minimum overlap. The layout inhibited area is disposed for the purpose of preventing invasion of other figure components. The layout inhibited area 121 is provided to each figure component 120 on its layer in accordance with all the design rules 109.

Figure 29:
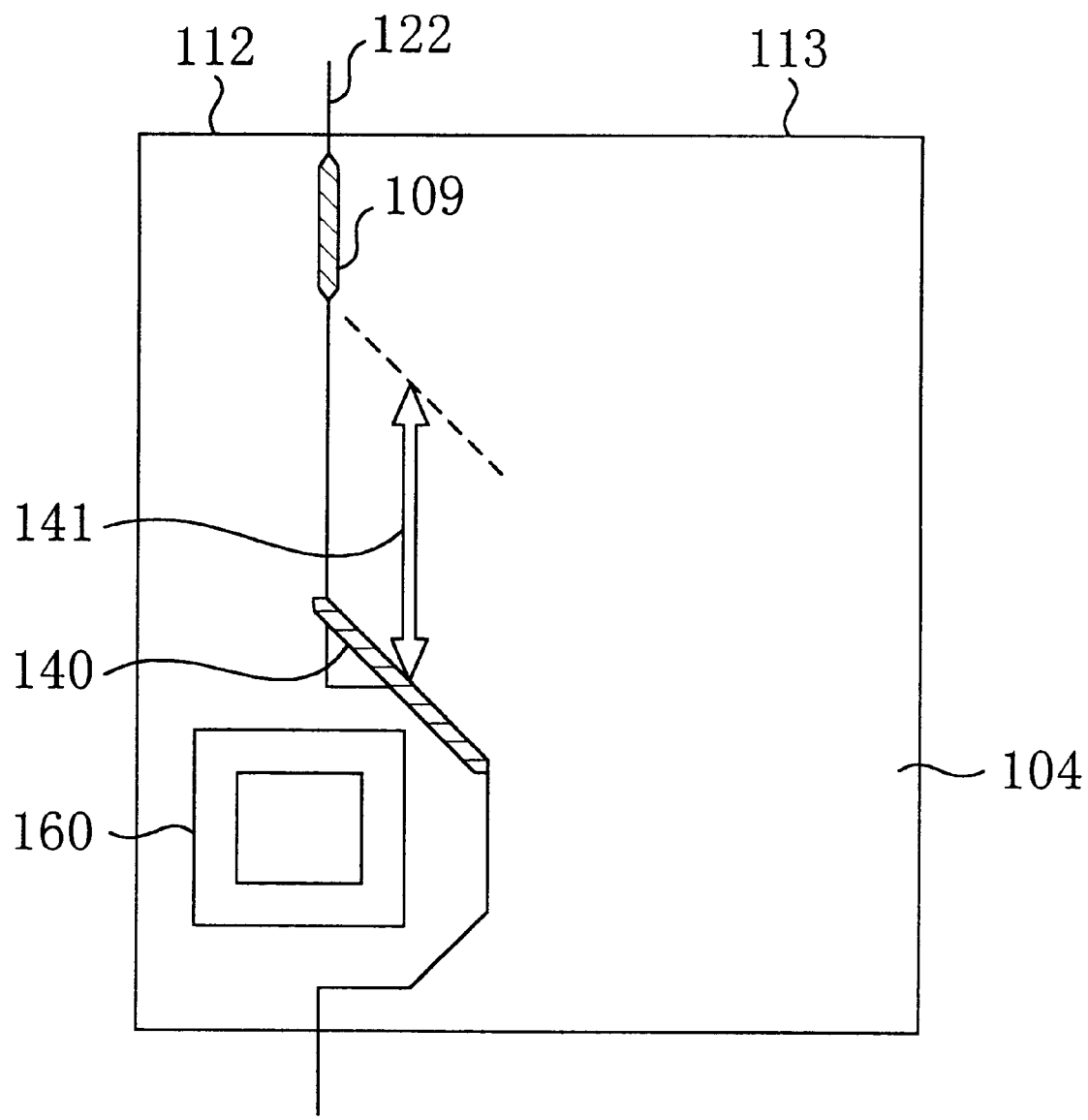
FIG. 29 shows a generation method for a bent gate used in the compaction method of the second embodiment.

(4) Wall:

A wall herein means a boundary of leftward movement of a figure component as is shown in FIG. 29. Each layer is provided with a wall 122. The wall 122 is a common concept through the present compaction process.

Now, the process procedures of the diffusion island inner layout generating means will be described.

The following procedures are repeated on the respective figure components representing transistors included in a diffusion island successively from one at the left end:

(STEP1) Generation of figure components:

The figure components listed in FIG. 26 are generated with regard to the figures representing the transistors and an upper layer wire. In the case where the diffusion contact 160 is present on a diffused area, a figure component representing the diffusion contact is generated, and figure components corresponding to the left and right ends of the diffused area are not generated. Successively from the figure component at the left end of the diffusion island, the following procedures (STEP2) through (STEP5) are repeatedly conducted.

(STEP2) Initialization of wall:

It is assumed that the scanning direction for the figure components is the X-axis direction and that the direction vertical to the X-axis direction is the Y-axis direction. In the case where a diffused area is shared by another transistor on the left side of the diffused area, information on the shared portion along the Y-axis direction is succeeded from information on a wall 122 of that other transistor. In the case where the diffused area is not shared and with regard to a portion not shared, an initial wall 122 is generated at the leftmost X coordinate in the figure components 120 representing the transistors.

(STEP3) Left-justification of figure component 120:

(Case 1) In the case where the figure component 120 has a fixed shape, a distance between the wall 122 and the figure component 120 is calculated, and the figure component 120 is left-justified by that distance. When the figure component 120 includes plural layers, the distance is calculated in each layer, and the figure component 120 is left-justified by the minimum distance.

(Case 2) In the case where the figure component is the gate left end or the gate right end, for example, the bent gate as shown in FIG. 29 is to be generated, the following procedures are conducted:

(STEP3.1) A bent portion 140 of the wall 122 is corrected so as to determine the bent shape of the gate.

(STEP3.2) On the basis of the minimum overlap at the gate left or right end and the presence and position of the diffusion contact 160 on the right side of the gate, a layout possible range 141 in the vertical direction where the bent portion 140 can be disposed is obtained.

(STEP 3.3) On the basis of the latitudinal relationship of the gate 111 with the source 112 and the drain 113, the bent portion 140 is disposed within the layout possible range 141 at a point where an area between the gate 111 and the drain 113 can be minimized, thereby determining the shape of the gate left end. (STEP 3.4) The gate right end is determined as a figure obtained by moving the gate left end in the rightward direction by the gate length 151.

(Case 3) In the case where the figure component 120 is the left or right end of the diffused area, the procedures described below as procedures for generating a diffusion figure (i.e., a rectangle representing the diffused area in the diffusion island) are conducted.

(STEP4) Generation of layout inhibited area 121:

With regard to the left-justified figure component 120, the layout inhibited area 121 is generated. In order to enable the formation of the bent gate, a layout inhibited area generated with regard to the diffusion contact 160 on a polysilicon layer can extend at an angle of 45 degrees against the X-axis direction.

(STEP5) Update of wall 122:

The wall 122 is updated so as to cover the layout inhibited area 121. The wall 122 in each layer is updated.

Now, the procedures for generating a diffusion figure within a diffusion island will be described.

Figure 30:
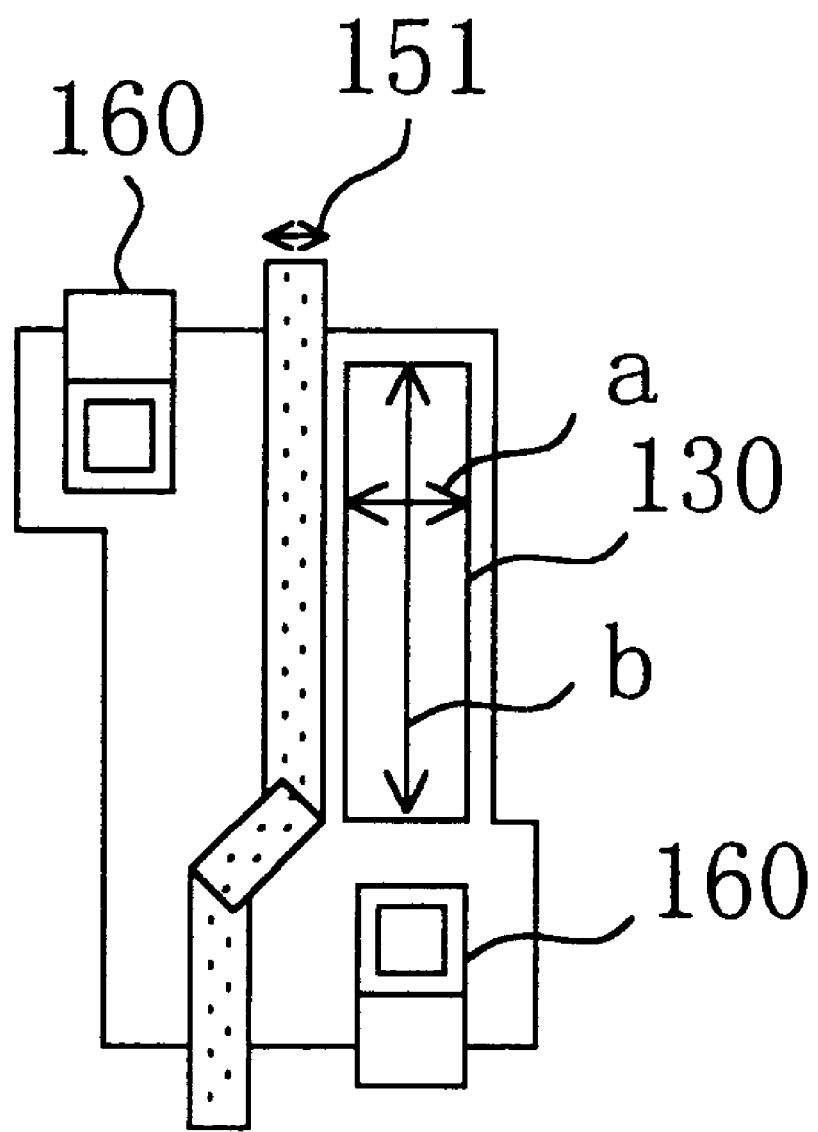
FIG. 30 shows optimization for a diffused area used in the compaction method of the second embodiment.

As is shown in FIG. 30, a width a along the gate length 151 of a diffused area where the diffusion contact 160 is not formed is decreased.

At this point, a series resistance Rs (130) in the area where the diffusion contact 160 is not disposed is approximately given as follows:

$$Rs = r \times b / a$$

wherein "r" indicates a sheet resistance of the diffused area, "a" indicates the width of the diffused area along the gate length, and "b" indicates a transistor width along the gate width in the diffused area where the contact is not disposed.

The layout inhibited area 121 is generated by using a larger value among the width "a" of the diffused area and the minimum overlap 108 of the design rules, so that the series resistance Rs cannot exceed a predetermined upper limit, thereby generating a diffusion figure.

Figure 31:
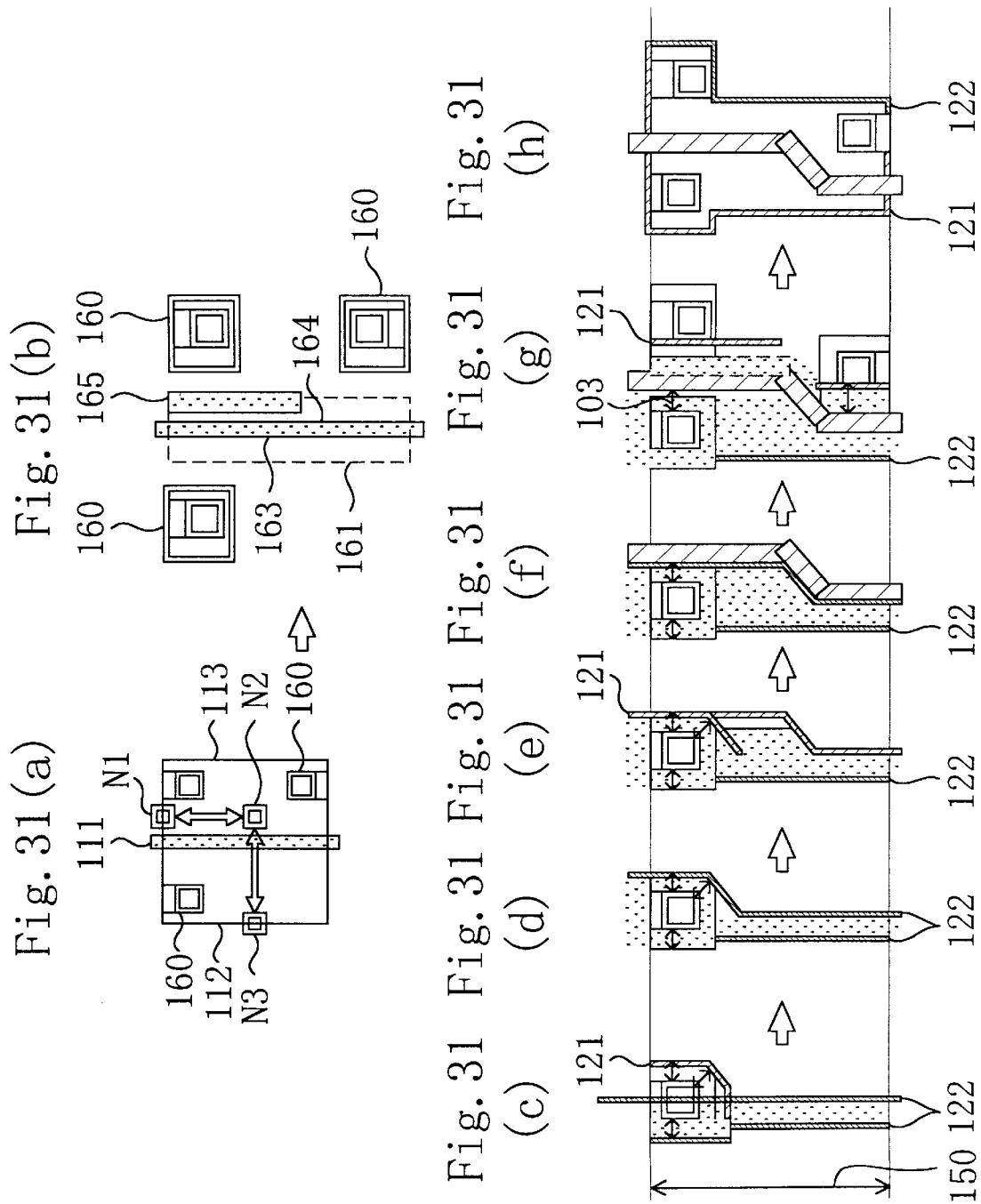
FIGS. 31(a) through 31(h) show a diffusion figure generating method used by the diffusion island inner layout generating means of the second embodiment.

FIGS. 31(a) through 31(h) show an exemplified flow of the process by the diffusion island inner layout generating means. As is shown in FIG. 31(a), input data are a gate 111, a source 112, a drain 113, a diffusion contact 160 disposed on the source 112 or the drain 113, and net targets N1, N2 and N3 which are intersections between a rough wire path and a boundary between layout objects.

In FIG. 31(b), figure components are extracted from the input data. As is shown in FIG. 31(b), a gate left end 163 and a gate right end 164 are extracted from the gate 111, a diffusion left end 161 is extracted from the source 112, and a diffusion right end 162 is extracted from the drain 113. Furthermore, a rectangle 165 derived from a wire disposed on an upper layer of the diffusion island is extracted to be disposed between the gate right end 164 and the diffusion contact 160.

Next, as is shown in FIG. 31(c), a wall 122 is initialized, and the wall 122 is updated to extend along a layout inhibited area 121 as is shown in FIG. 31(d). Then, as is shown in FIGS. 31(e) and 31(f), after the position of a bent portion of the gate is determined to be located at an optimal position for decreasing the capacitance of the drain, an area for an upper layer wire above the diffusion island is secured as is shown in FIG. 31(g), and the wall 122 is updated by moving it in the rightward direction from the right end of the area for the upper layer wire by a distance in accordance with the design rules. Then, the diffusion contact 160 on the right side of and adjacent to the area for the upper layer wire is left-justified. Thus, the layout shown in FIG. 31(h) can be attained within the diffusion island.

In this manner, according to this embodiment, a diffusion shared area in which a diffused area is shared by transistors is defined as a diffusion island, and the layout within the diffusion island can be independently generated. Accordingly, even when the design rules adopted within the diffusion island are different from those adopted outside of the diffusion island, the layout within the diffusion island can be definitely optimized.

In addition, since the upper layer wire above the diffusion island is taken into consideration, the resultant compaction can be more optimized.

A compaction apparatus using the compaction method of this embodiment comprises means for realizing respective procedures described as steps ST1 through ST8 and ST101 through ST104.

(Embodiment 3)

A third embodiment of the invention will now be described with reference to the drawings.

At the point of completing generating the layout within a diffusion island, the layout within the diffusion island itself naturally satisfies the design rules. In this embodiment, when a design rule error occurs between the layout and a wire around the diffusion island thereafter, the layout within the diffusion island is corrected in order to overcome the design rule error.

Figure 32:
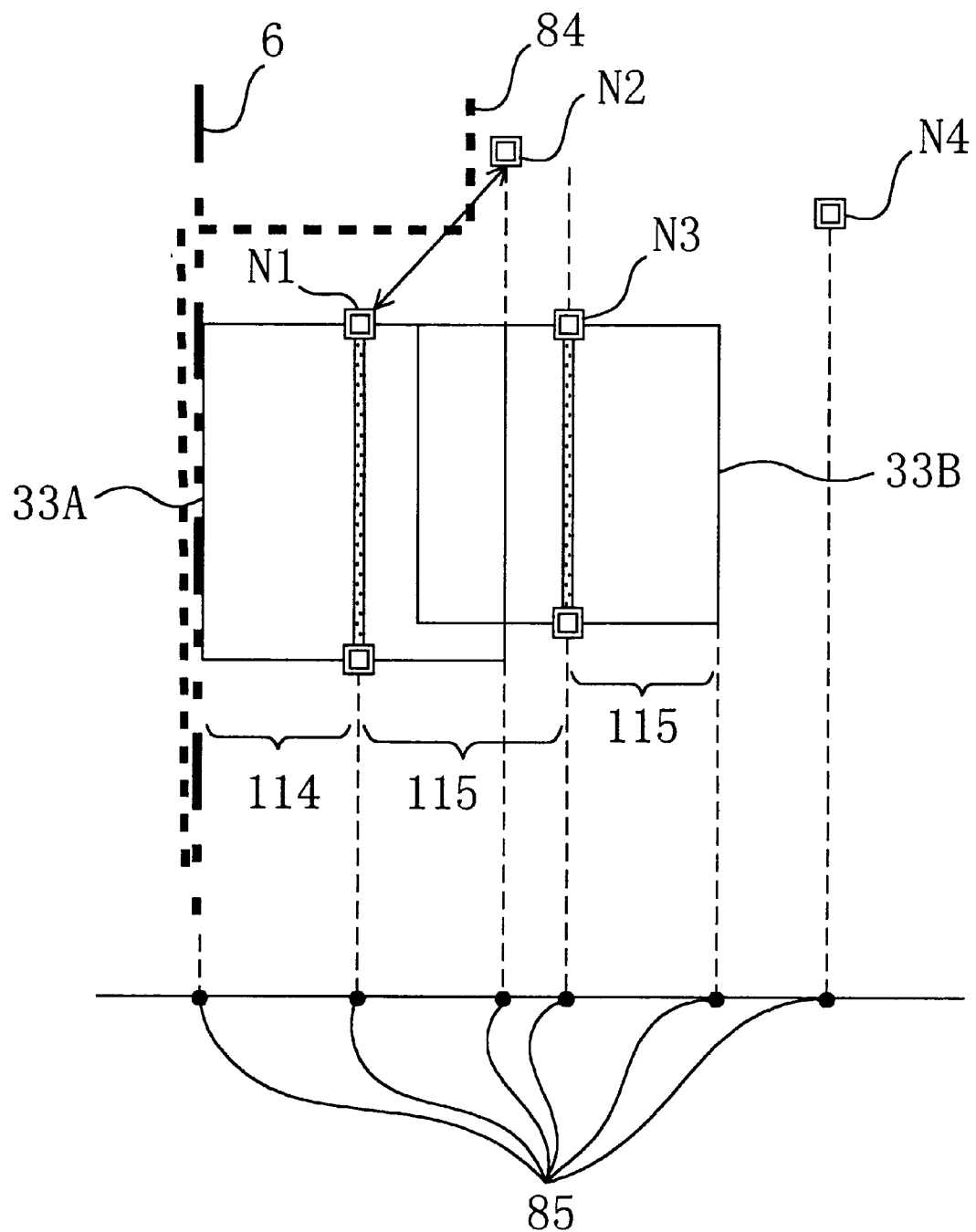
FIG. 32 is a diagram for showing a method of solving a design rule error in the order of procedures used in a compaction method of a third embodiment.

FIGS. 32, 33(a), 33(b), 34(a) and 34(b) show a compaction method of the third embodiment. In FIG. 32, rectangles 33A and 33B respectively represent transistors, whose diffused area is shared, resulting in forming a diffusion island. N1 through N6 denote net targets. Scanning points 85 are positions where a scan line 6 is successively stopped. A first diffused area 114 is a diffused area to be connected with a power supply, and second diffused areas 115 are diffused areas not to be connected with the power supply. For the sake of simplification, a covering line 84 on a polysilicon layer alone is shown in FIG. 32.

Figure 33A:
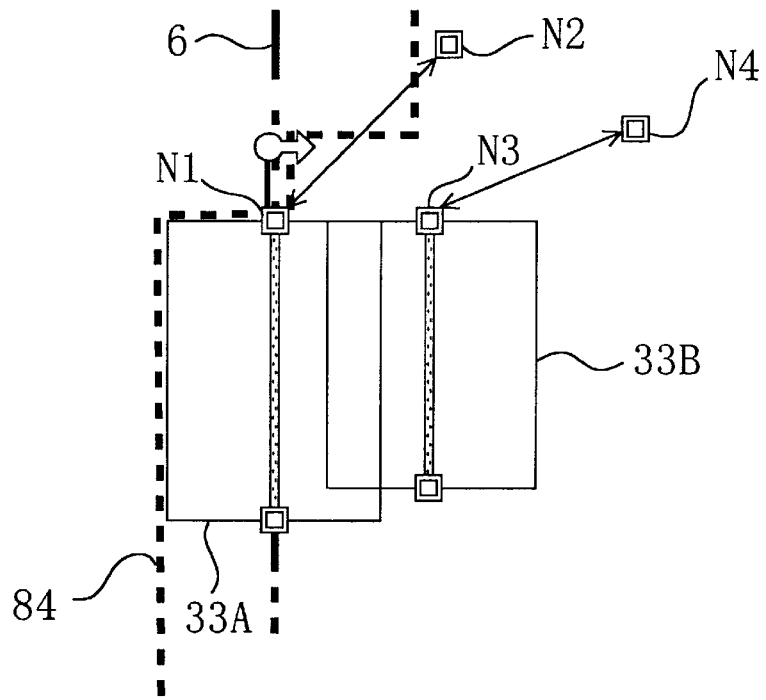
FIGS. 33(a) and 33(b) are diagrams for showing the method of solving a design rule error in the order of procedures used in the compaction method of the third embodiment.

Description will be first made on the generation of the layout within the diffusion island. As is shown in FIG. 32, the scan line 6 starts to scan the left side of the rectangle 33A. The result of the compaction at this point is shown in FIG. 33(a). As compared with the diffusion island of FIG. 32, the with of the entire diffusion island in the scanning direction is decreased in FIG. 33(a). Furthermore, the net target N1 is scanned by the scan line 6 in FIG. 33(a). After generating a front fr1 on the net target N1, the front fr1 is vertically moved on the scan line 6 so as to be closer to the net target N2 to be linked with the net target N1. The vertical trace of the front fr1 is added as a wire path, and the covering line 84 is updated so as to cover this wire path.

Figure 33B:
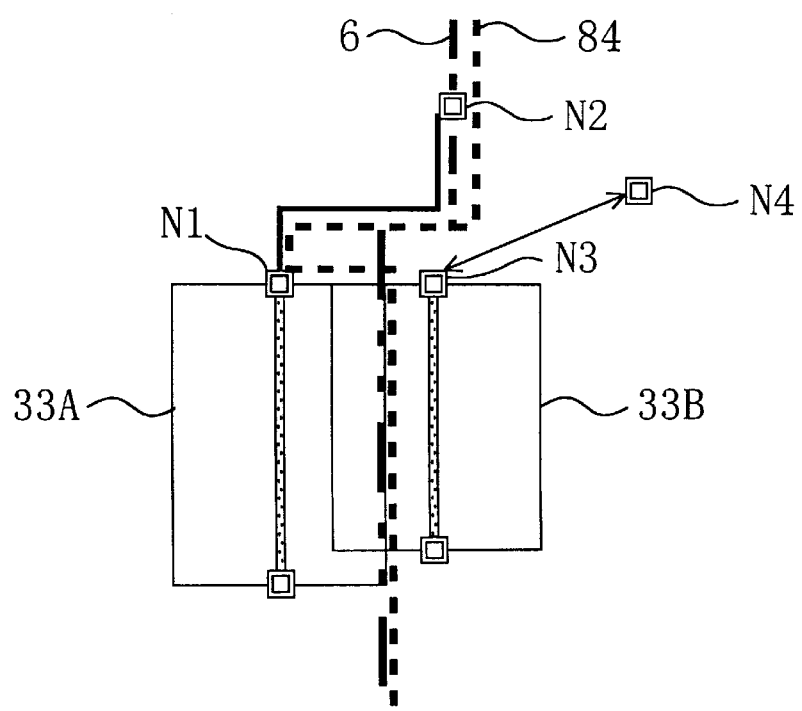

Then, the scan line 6 of FIG. 33(b) scans the right side of the rectangle 33A and the net target N2, and the covering line 84 is updated so as to cover the rectangle 33A. Also, the front fr1 is vertically moved on the scan line 6 to be closer to the net target N2. The vertical trace of the front fr1 is added as a new wire path, and the covering line 84 is updated.

Figure 34A:
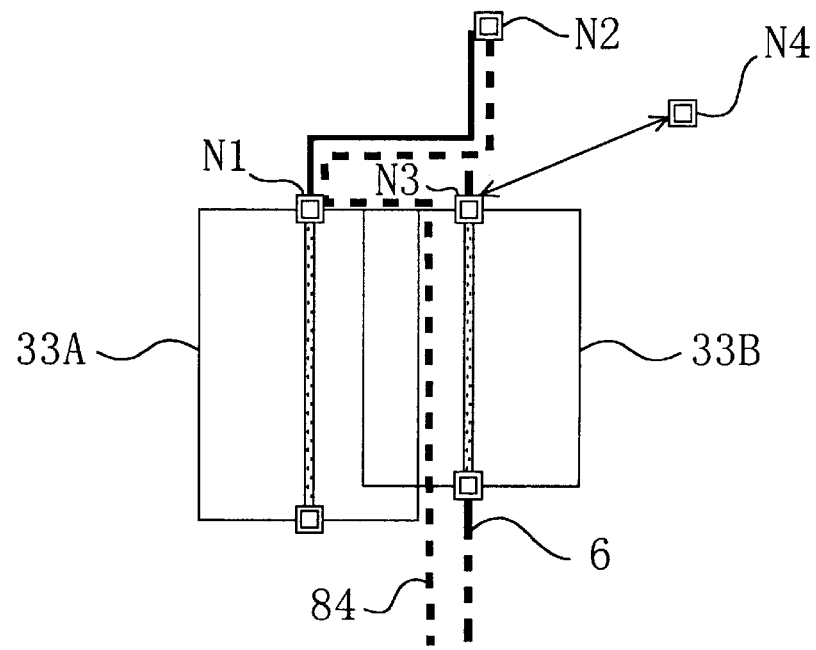
FIGS. 34(a) and 34(b) are diagrams for showing the method of solving a design rule error in the order of procedures used in the compaction method of the third or a fourth embodiment.

The scan line 6 of FIG. 34(a) scans the net target N3. A front is generated on the net target N3, and the front should be moved toward the net target N4 to be linked with the net target N3. However, a design rule error occurs at this point since the wire path between the net target N1 and the net target N2 is to close to the net target N3.

In order to solve this design rule error, the net target N3 and all the composing elements of the diffusion island disposed on the right side of the net target N3 are moved in the rightward direction by the same distance to positions where the design rule error can be solved. As a result, the second diffused area 115 is expanded, thereby solving the design rule error.

Now, another example using the compaction method of this embodiment will be described with reference to FIGS. 35(a) and 35(b). A diffusion island 101 includes net targets N1 through N4 and rectangles 33C and 33D respectively representing contacts. The rectangles 33C and 33D are once located in generating the layout within the diffusion island 101. A covering line 84 is that on a metal wire layer in this example.

Figure 35A:
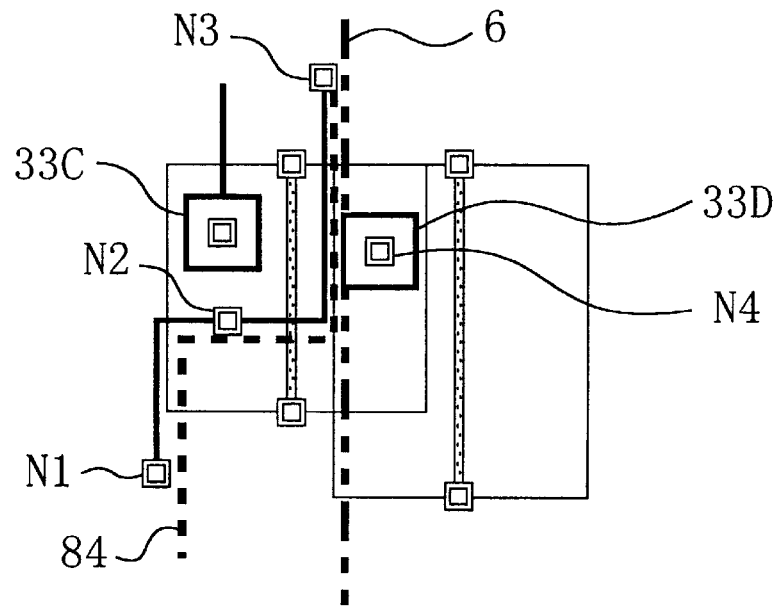
FIGS. 35(a) and 35(b) are diagrams for showing the method of solving a design rule error in the order of procedures used in the compaction method of the third embodiment.

In FIG. 35(a), a scan line 6 scans the left side of the rectangle 33D, and a design rule error occurs because of a too short distance between a wire path between the net targets N2 and N3 and the left side of the rectangle 33D.

Figure 35B:
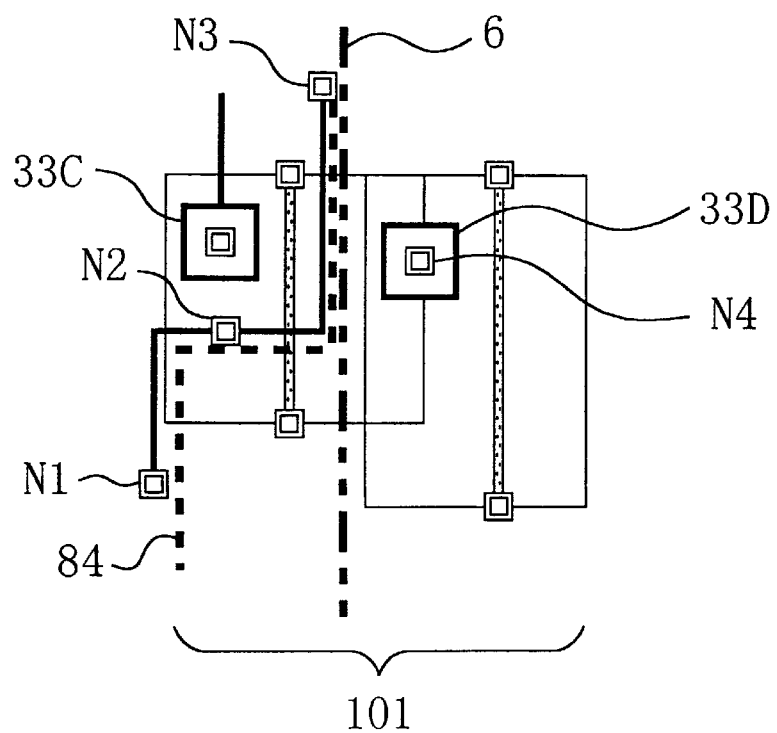

As is shown in FIG. 35(b), the rectangle 33D and all the composing elements of the diffusion island disposed on the right side of the rectangle 33D are moved in the rightward direction by the same distance to positions where the design rule error can be solved.

In this manner, a diffusion shared area in which a diffused area is shared by transistors is defined as a diffusion island in this embodiment. Accordingly, the layout within the diffusion island can be independently generated, and hence, even when the design rules adopted within the diffusion island are different from those adopted outside the diffusion island, the layout within the diffusion island can be definitely optimized.

In addition, since an upper layer wire above the diffusion island is taken into consideration, the resultant compaction can be more optimized.

Moreover, since the compaction method of this embodiment comprises a step of solving a design rule error occurring within the diffusion island, the result of the compaction can be satisfactory similarly to that attained by human design.

A compaction apparatus using the compaction method of this embodiment comprises means for solving a design rule error occurring within a diffusion island as described above.

(Embodiment 4)

A compaction method according to a fourth embodiment of the invention will now be described with reference to the drawings.

In general, delay time of a CMOS circuit is increased in proportion to a product of a resistance and a capacitance in the circuit. A parasitic capacitance of a transistor is increased in proportion to the area of the diffused area of the transistor. Therefore, a circuit is required to be designed so as to make the diffused area of a transistor as small as possible. As an exception, the area of a diffused area connected with a power supply does not affect the delay time.

In this embodiment, when a design rule error is detected during compaction, the procedure of the compaction is retroacted to a point where the design rule error can be solved by merely increasing the area of a diffused area connected with a power supply. Then, a rectangle or a wire junction scanned at the retroacted point and all the composing elements of the diffusion island on the right side of the rectangle or the wire junction are moved in the rightward direction by the same distance, so as to satisfy the design rules.

With reference to FIGS. 34(a), 34(b), 36(a), 36(b), 37(a) and 37(b), the method of solving a design rule error of this embodiment will now be described.

As is shown in FIG. 34(a), a scan line 6 scans a net target N3. A front is generated on the net target N3, and the front should be proceeded toward a net target N4 to be linked with the net target N3, but, as described above, a design rule error occurs because of the too short distance between the wire path connecting net targets N1 and N2 and the net target N3.

Figure 34B:
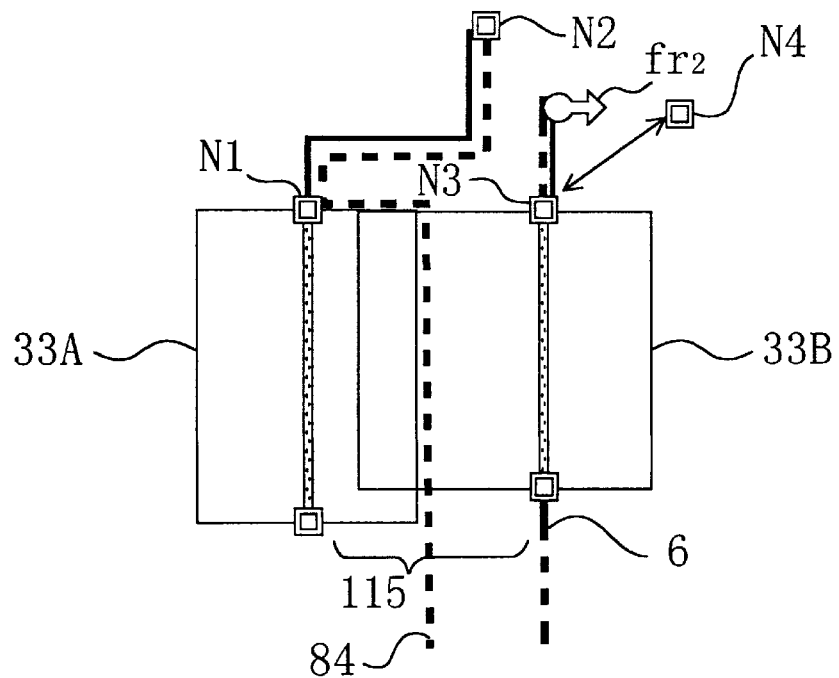

In order to solve this design rule error, when the net target N3 and all the composing elements of the diffusion island on the right side of the net target N3 are moved in the rightward direction to the positions where the design rule error can be solved as is shown in FIG. 34(b), the area of the second diffused area 115 which is not connected with the power supply is increased, resulting in increasing the delay time of this circuit.

Accordingly, the compaction procedure of this embodiment is retroacted to a point where the design rule error can be solved by merely increasing the diffused area connected with the power supply, without adopting the method shown in FIG. 34(b).

Figure 36A:
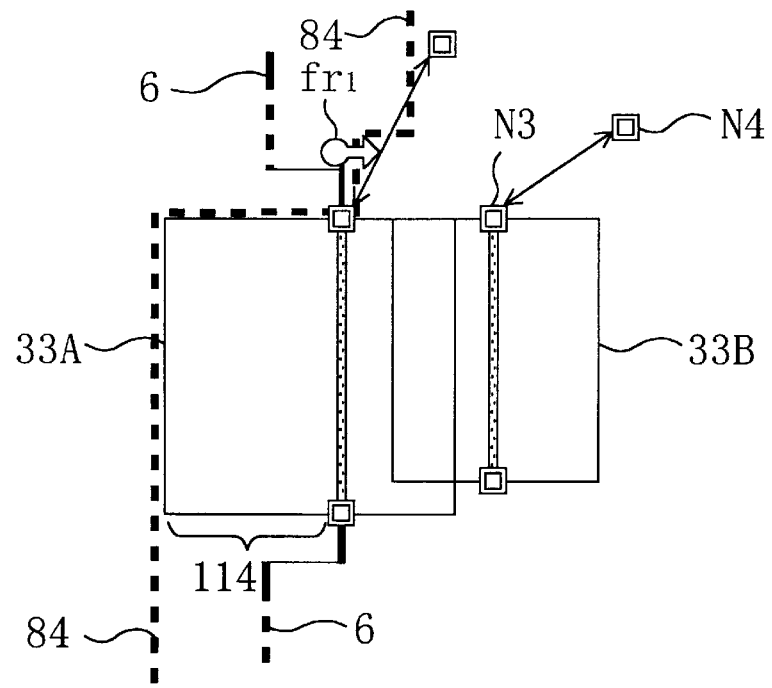
FIGS. 36(a) and 36(b) are diagrams for showing the method of solving a design rule error in the order of procedures used in the compaction method of the fourth embodiment.

In this embodiment, the procedure is retroacted to a time point when the scan line 6 scans the net target N1 as is shown in FIG. 36(a). Then, the net target N1 and all the composing elements of the diffusion island on the right side of the net target N1 are moved in the rightward direction by the same distance. FIG. 36(a) shows the result of this movement.

This movement increases the area of the first diffused area 114 connected with the power supply as compared with the original area. However, this area increase does not harmfully affect the delay time.

Figure 36B:
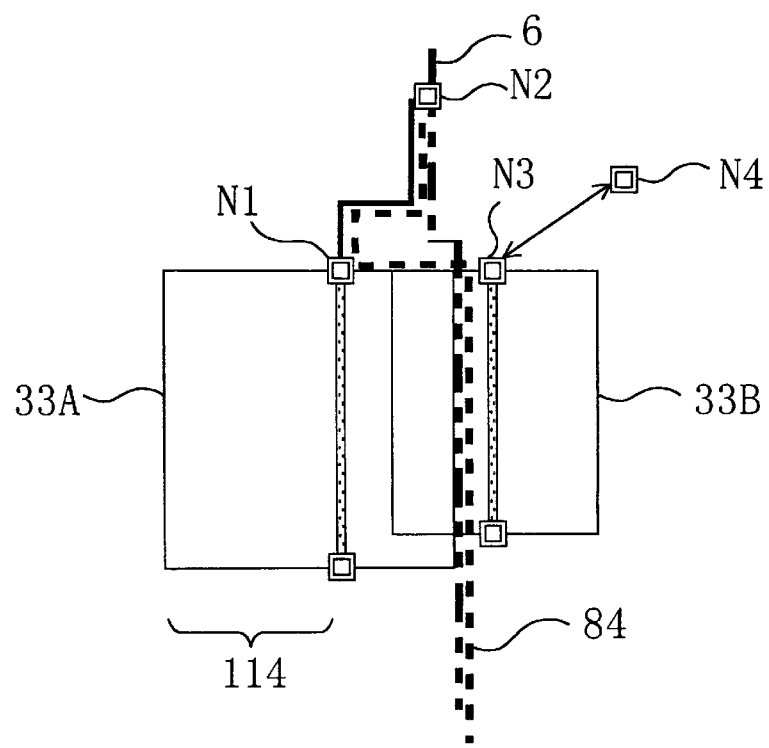

Next, the scan line 6 of FIG. 36(b) scans the right side of the rectangle 33A and the net target N2, and the covering line 84 is updated so as to cover the rectangle 33A. Then, the front fr1 is vertically moved on the scan line 6 so as to be closer to the net target N2. This vertical trace of the front fr1 is added as a wire path, and the covering line 84 is updated.

Figure 37A:
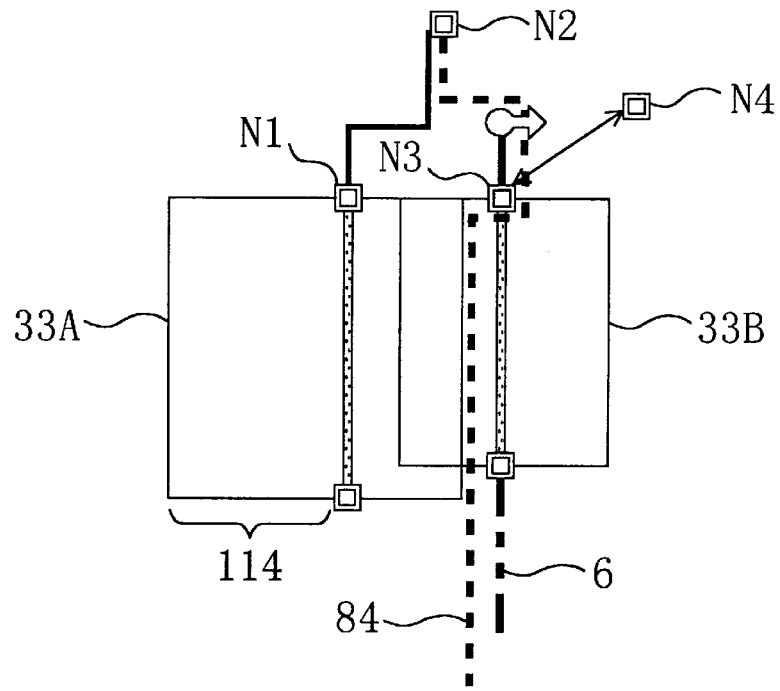
FIGS. 37(a) and 37(b) are diagrams for showing the method of solving a design rule error in the order of procedures used in the compaction method of the fourth embodiment.
Figure 37B:
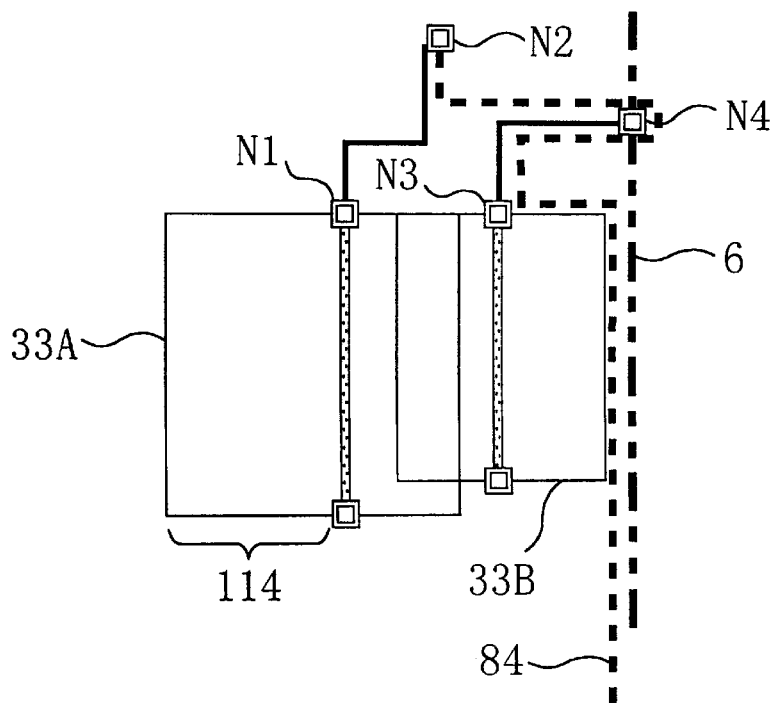

Then, the scan line 6 of FIG. 37(a) scans the net target N3. After generating a front fr2 on the net target N3, the front fr2 is vertically moved on the scan line 6 so as to be closer to a net target N4 to be linked with the net target N3. This vertical trace of the front fr2 is added as a new wire path, and the covering line 84 is updated. Then, the scan line 6 of FIG. 37(b) scans the net target N4.

In this manner, since a diffusion shared area in which a diffused area is shared by transistors is defined as a diffusion island in this embodiment, the layout within the diffusion island can be independently generated. Therefore, when the design rules adopted within the diffusion island are different from those adopted outside of the diffusion island, the layout within the diffusion island can be definitely optimized.

In addition, since an upper layer wire above the diffusion island is also taken into consideration, the resultant compaction can be more optimized.

Moreover, when a design rule error occurs within the diffusion island, the design rule error can be solved by increasing the area of the first diffused area 114 connected with the power supply through the retroactive process without harmfully affecting the delay time of the circuit. Thus, the result of the compaction can be further satisfactory similarly to that attained by human design.

A compaction apparatus using the compaction method of this embodiment comprises means for solving a design rule error occurring within a diffusion island as described above.

(Embodiment 5)

A rough routing method according to a fifth embodiment of the invention will now be described with reference to the drawings. This embodiment describes a rough routing method of obtaining an abstracted rough wire path through connection of net targets as is shown in FIG. 8.

The method of this embodiment is effective in realizing the compaction method of the first or second embodiment in the case where transistors alone are allocated with no existing wire present or in the case where an existing wire path is required to be re-routed because the layout of the transistors is changed. In the method of obtaining a rough wire path, a scan line is used basically as in the compaction method of the first or second embodiment. While the scan line is scanning a layout area where objects are aligned from the left end to the right end, a net target is generated on a spit, which is a virtual line vertical to the scanning direction, at an intersection with a wire required to cross the spit.

Figure 38:
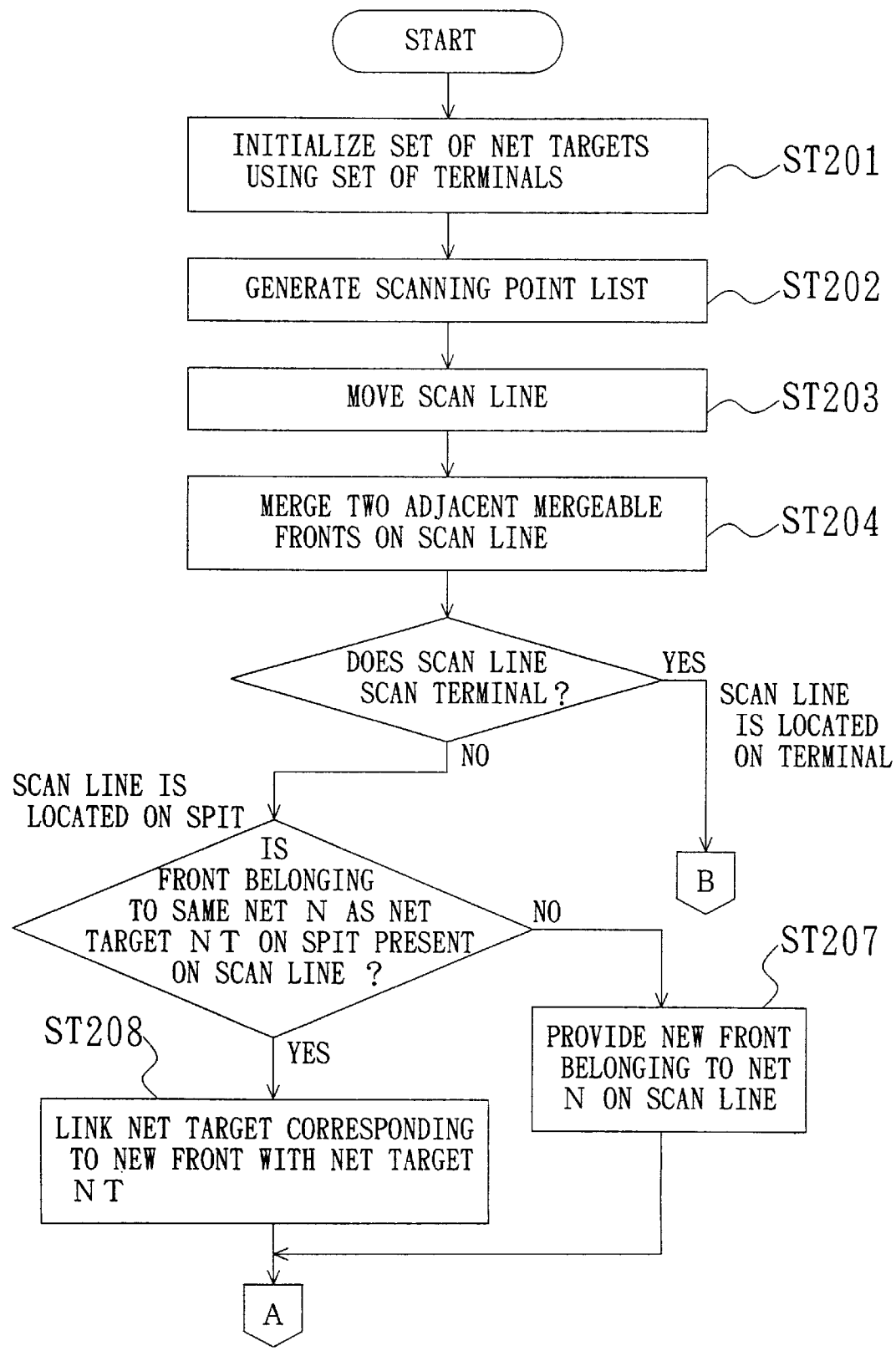
FIG. 38 is a flowchart for the rough routing method of the fifth embodiment.
Figure 39:
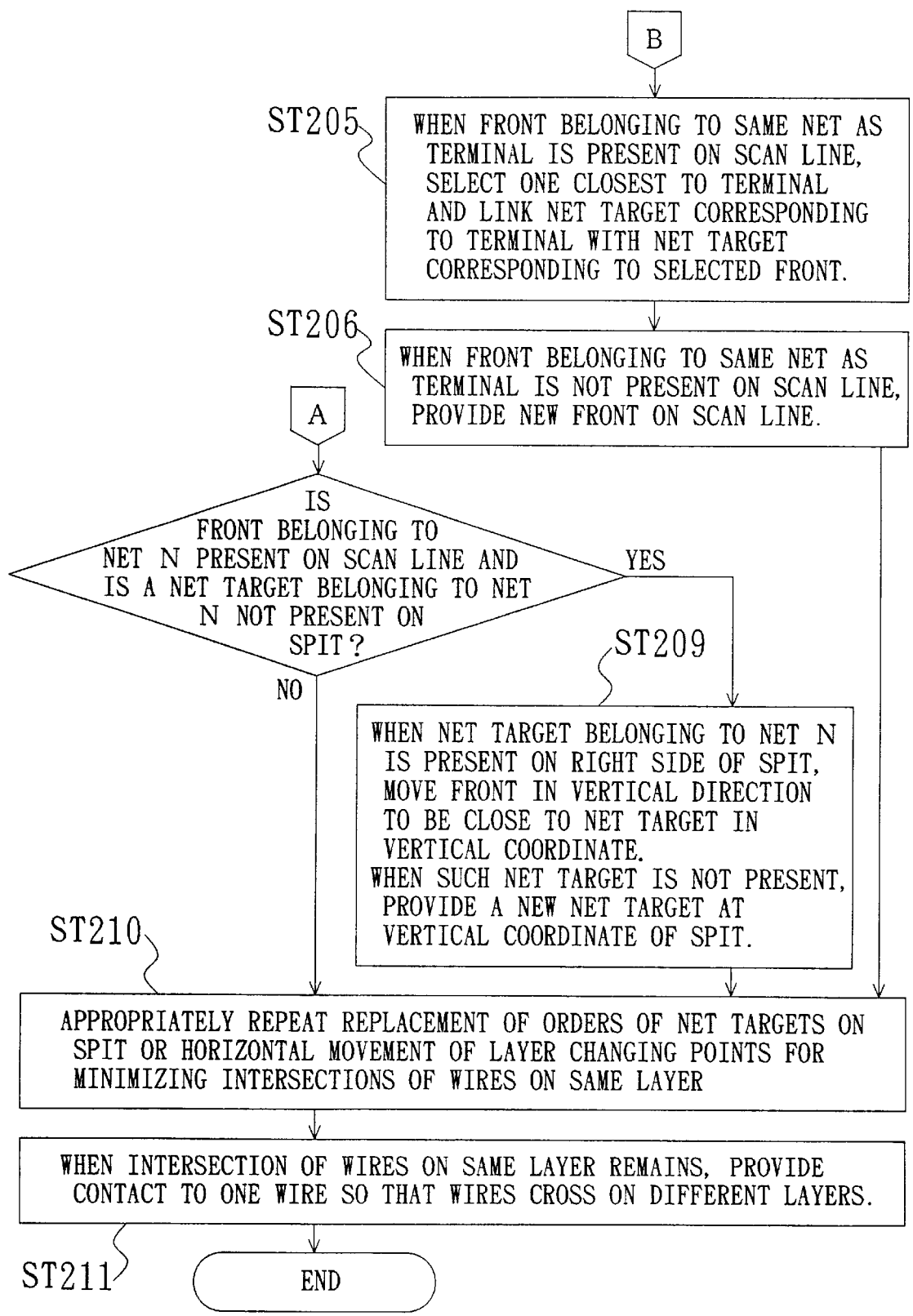
FIG. 39 is a flowchart for the rough routing method of the fifth embodiment.

FIGS. 38 and 39 are flowcharts for the rough routing method of the fifth embodiment.

First, an initial state as shown in FIG. 4(a) is attained. Rectangles representing transistors 31A, 31B, etc. or contacts 32 and terminals 34 provided on the rectangles are obtained. Each terminal 34 is provided with a net identifier for identifying a set of terminals to be connected at the same potential. Existing wires are represented by wire elements 35 or wire junctions 36, but when the rough routing is to be obtained, information on the existing wires are all eliminated as the initial state.

Next, in step ST201 of FIG. 38, a net target is provided on each terminal 34 correspondingly to each rectangle 33. The value the net identifier of each net target is set at the value of the net identifier of the corresponding terminal.

Then, in step ST202, a scan line 81 as shown in FIG. 9 is set at the left end of the layout area, and a group of points to be scanned by the scan line 81, i.e., a scanning point list, is obtained. The scanning point list is generated by successively sorting the positions of the respective terminals 34 and spits 61, which are vertical virtual lines as shown in FIG. 7 or 8, from the left end of the layout area.

Next, in steps ST203 and thereafter, while the scan line 81 is being successively moved in the rightward direction in accordance with the positions of the scanning points of the scanning point list, the following procedures are conducted:

In step ST204, in the case where two adjacent fronts on the scan line 81 are to be proceeded to the same direction, are disposed on the same layer and included in the same net, a pointer for linking net targets corresponding to these two fronts is provided so as to merge the two fronts. Then, one of these two fronts is eliminated from the scan line 81. A linkage of the net targets is represented by a bidirectional arrow shown with a broken line, for example, a bidirectional arrow linking net targets 62 A and 62C shown in FIG. 8.

Then, in step ST205 of FIG. 39, in the case where the scan line 81 scans a scanning point corresponding to a terminal 34 and at least one front belonging to the same net as this terminal 34 is present on the scan line 81, when the number of such fronts on the scan line 81 is plural, one closest to the terminal 34 is selected as a front F. Then, the net target corresponding to the terminal 34 and a net target corresponding to the selected front F are linked.

Next, in step ST206, in the case where the scan line 81 scans a scanning point corresponding to a terminal 34 and a front belonging to the same net as this terminal 34 is not present on the scan line 81, a front is newly provided on the scan line 81. Then, the same net identifier as that of the terminal 34 is given to the new front, so as to have the new front correspond to the net target on the terminal 34.

Furthermore, in step ST207 or ST208 of FIG. 38, in the case where the scan line 81 scans a scanning point corresponding to a spit 61, the following procedures are conducted on a net target NT on the spit 61:

In step ST207, in the case where the net target NT belongs to a net N and a front belonging to the net N is not present on the scan line 81, a new front belonging to the net N is provided on the scan line 81. The same net identifier as that of the terminal 34 is given to the new front, so as to have the front correspond to the net target on the terminal 34.

In step ST208, in the case where a front belonging to the net N is present on the scan line 81, a net target corresponding to the front is linked with the net target NT on the spit 61.

Next, in step ST209 of FIG. 39, in the case where a front F belonging to the net N is present on the scan line 81 and a net target belonging to the net N is not present on the spit 61, a net target belonging to the net N and disposed on the right side of the spit 61 is searched for. When such a net target is found, the front F is moved on the scan line 81 so that the front F can be closer to the vertical coordinate, which indicates a vertical position against the scanning direction, of the found net target. When such a net target cannot be found, without changing the vertical coordinate of the front F, a new net target NT with the same vertical coordinate as the front F is provided on the spit 61, so as to have the front F correspond to the new net target NT.

Then, in a cross wire optimizing step, i.e., step ST210, the position of an intersection where plural wires cross each other on the same layer is optimized. Specifically, the optimization can be attained by a replacing operation for replacing the orders of the net targets or by a moving operation for moving a layer changing point, such as a contact, where one layer and another different layer are connected with each other. These operations are conducted by using a repeated improving method such as a simulated annealing method or a greedy method for minimizing the value of an evaluation function Fc. As an evaluation index for the optimization used in the repeated improving method, the following evaluation function Fc is used.

(Evaluation Function Fc)

A spit S has a value of a density Ds of a layout area on a layer calculated on the basis of the numbers of rectangles and net targets present on the spit on the same layer. However, when there is an intersection of wires in an adjacent area on the right side of the spit, it is necessary to form a contact for the intersection of the wires, and hence, the increase of the density caused by forming the contact is calculated to be added to the density Ds. As an evaluation function adopted in improvement by re-routing, the following value Fc is used:

$$Fc = \mathrm{Max}(Ds) \tag{1}$$

Figure 40A:
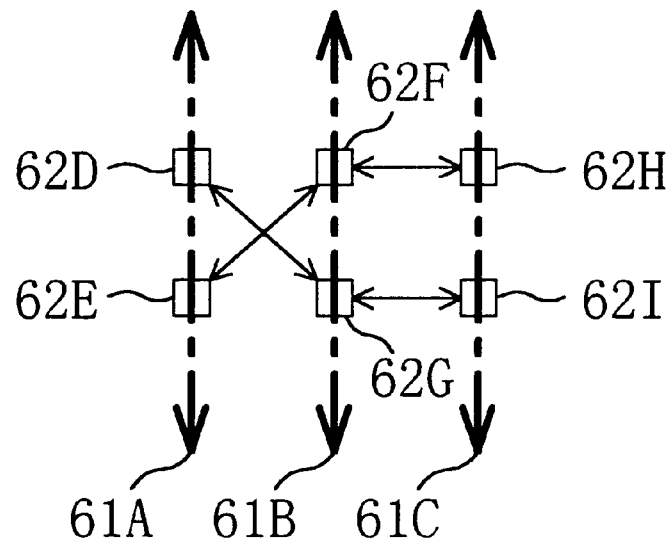
FIGS. 40(a) and 40(b) show procedures for replacing net targets in the rough routing method of the fifth embodiment.
Figure 40B:
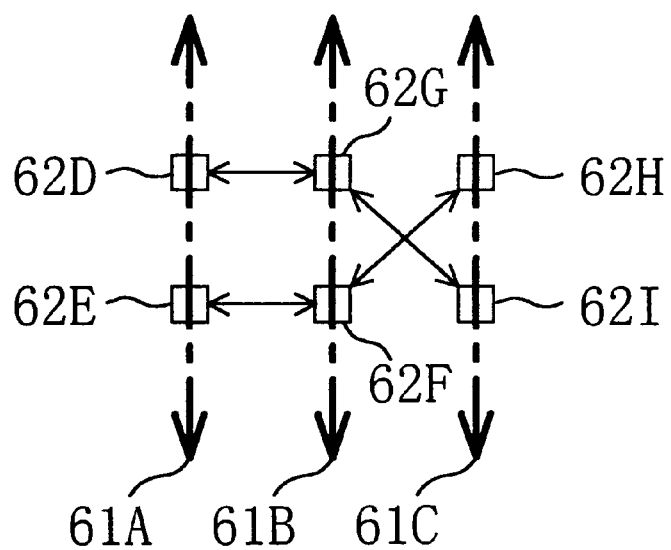

FIGS. 40(*a*) and 40(*b*) show the procedures of the replacing operation for net targets in the rough routing method of this embodiment. In FIG. 40(*a*), net targets 62D and 62E are present on a spit 61A, net targets 62F and 62G are present on a spit 61B, and net targets 62H and 62I are present on a pit 61C. As is shown in FIG. 40(*a*), in an area on the left side of the spit 61B, there is an intersection between a wire for connecting the net target 62D and the net target 62G and a wire for connecting the net target 62E and the net target 62F. On the other hand, when the net target 62F and the net target 62G are replaced with each other on the spit 61B, in an area on the right side of the spit 61B, there is an intersection between a wire for connecting the net target 62G and the net target 62I and a wire for connecting the net target 62F and the net target 62H. In such a case, selection between the replacements shown in FIGS. 40(*a*) and 40(*b*) depends upon the densities in the right side and left side areas of the spit 61B. Specifically, an intersection is preferably provided in an area with a density Ds as small as possible. By using the formula (1), such optimization can be obviously evaluated.

Figure 41A:
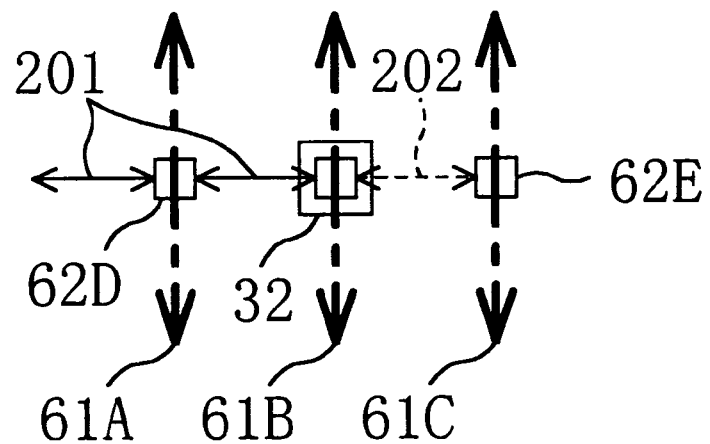
FIGS. 41(a) and 41(b) show procedures for moving layer changing points in the rough routing method of the fifth embodiment.
Figure 41B:
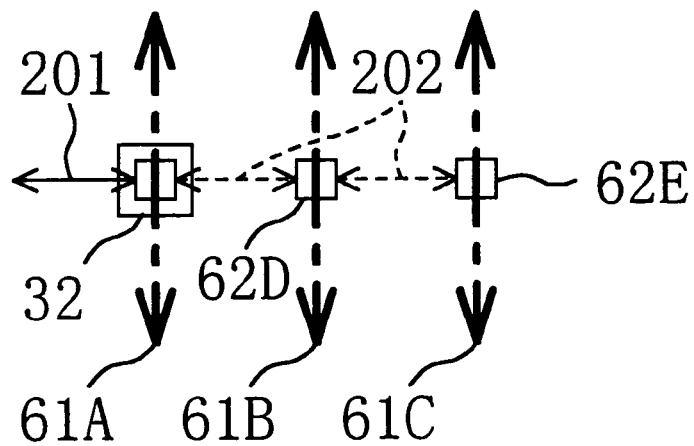

FIGS. 41(*a*) and 41(*b*) show the procedures of the moving operation for layer changing points in the rough routing method of this embodiment. In FIG. 41(*a*), a net target 62D is present on a spit 61A, a contact 32 corresponding to a layer changing point for changing a layer is present on a spit 61B, and a net target 62E is present on a spit 61C. In an area on the left side of the spit 61A, a metal wire 201 connected with the net target 62D is disposed and a metal wire for connecting the net target 62D and the contact 32 is also disposed. The contact 32 and the net target 62E are connected with each other through a polysilicon wire 202 on a different layer from that of the metal wire 201. On the other hand, as is shown in FIG. 41(*b*), by moving the contact 32 onto the spit 61*b* on the left side of the spit 61B, the metal wire 201 connected with the contact 32 is disposed in the left side area of the spit 61B. Furthermore, the contact 32 and the net target 62D are connected with each other through the polysilicon wire 202 on the different layer from that of the metal wire 201, and the net target 62D and the net target 62E are connected with each other through the polysilicon wire 202. As a result, the layer is changed between the spit 61A and the spit 61B, and hence, the densities Ds of the spits 61A and 61B are changed. Accordingly, by using the formula (1), the optimization can be obviously evaluated.

Next, in step ST211, in the case where an intersection of wires on the same layer still remains, a contact is provided to one of the wires so as to make a detour to be connected with a wire on a different layer.

In this manner, in this embodiment, every time a scan line, which is parallel to spits in a layout area and has a front corresponding to a tip portion of a line where a wire element is allocated, scans a new net target, a new front is provided on the scan line, so that the front is proceeded to an adjacent net target on its right side, and the trace of the front is provided with a wire path. As a result, even when re-routing is conducted owing to the change of layout objects, wires are prevented from being bent as far as possible. Therefore, the area occupied by the wires can be minimized.

A rough routing apparatus using the rough routing method of this embodiment comprises means for realizing the aforementioned steps ST201 through ST211.

What is claimed is:

1. A compaction method comprising:
    a first abstracting step of abstracting elements such as a transistor, a resistor, a capacitor and a contact by using rectangles respectively having terminals at peripheral or inner portions, and abstracting said terminals and wires connecting said terminals by using wire junctions and wire elements;
    a second abstracting step of, in a rectangular layout area where a plurality of said rectangles are disposed, abstracting wire paths connecting said elements by using net targets each having a net identifier for identifying a set of said rectangles to be connected at the same potential on said wire junctions and by using connection information regarding which net targets among said net targets are connected with one another; and
    a routing and compacting step of connecting and compacting said rectangles on the basis of said net targets and said connection information,
    wherein said routing and compacting step includes:
        a step of extracting, from said connection information, a net target which is to be headed by a front on a scan line, said front being a tip portion of a line where any of said wire elements is allocated; and
        a step of scanning said layout area by moving said scan line to said net target extracted from said connection information and moving said front on said scan line to be closer to said extracted net target, thereby obtaining another wire path on the basis of a trace of said front, said step of scanning being conducted after said step of extracting.

2. The compaction method of claim 1, wherein said first abstracting step includes, in a case where said first elements are CMOS transistors and each of said CMOS transistors is represented by plural rectangles, a step of relatively moving said plural rectangles in a horizontal or vertical direction.

3. The compaction method of claim 1, wherein said elements in said first abstracting step are contacts, and said contacts are represented by plural rectangles on different layers, each rectangle having a terminal in an inner portion, and said wire junctions are connected with said wire elements on the same layer alone.

4. The compaction method of claim 1, wherein said second abstracting step includes a step of setting a virtual line vertical to one side of said layout area, and setting said net targets on said wire junctions and said vertical line.

5. The compaction method of claim 4, wherein said second abstracting step includes a step of disposing said abstracted wire elements and wire junctions in said layout area, setting any of said wire junctions corresponding to wire branch points, at which said wire elements are branched, and intersections between said virtual line and said wire elements as further net targets, and defining adjoining relationships among said net targets on the basis of said connection information.

6. The compaction method of claim 1, wherein said routing and compacting step further includes:

a step of generating a scanning point list by sorting positions of said wire junctions, and positions of one side, which is parallel to said scan line, and the other opposing side of each of said rectangles for determining an order of scanning by said scan line;

a step of moving said scan line in a direction vertical to said scan line in accordance with said scanning point list, moving said front on said scan line to be closer to said net target extracted from said connection information, compacting a straight line formed between corresponding one of said wire junctions and said moved front in a direction toward a scanning start point which is first scanned by said scan line, and providing said straight line as a wire element;

in a case where two fronts on said scan line are to be proceeded to the same direction, a step of merging said two fronts to be connected with each other, compacting, in the direction toward the scanning start point, a straight line formed by connecting said two fronts, and providing said compacted straight line as a wire element;

in a case where said scan line scans any of said wire junctions, a step of providing a new front on said wire junction, providing a wire element extending toward a net target traced by said new front, and eliminating said front not required any more extension of said wire element;

in a case where said scan line scans one of the sides, which is closer to the scanning start point, of any of said rectangles, a step of compacting said rectangles in the direction toward the scanning start point; and in a case where said scan line scans the other side, which is farther from the scanning start point, of any of said rectangles, a step of setting said rectangle as a layout inhibited area.

7. A compaction apparatus comprising:

first abstracting means for abstracting elements such as a transistor, a resistor, a capacitor and a contact by using rectangles respectively having terminals at peripheral or inner portions, and abstracting said terminals and wires connecting said terminals by using wire junctions and wire elements;

second abstracting means for, in a rectangular layout area where a plurality of said rectangles are disposed, abstracting wire paths connecting said elements by using net targets each having a net identifier for identifying a set of said rectangles to be connected at the same potential on said wire junctions and by using connection information regarding which net targets among said net targets are connected with one another: and routing and compacting means for connecting and compacting said rectangles on the basis of said net targets and said connection information, wherein said routing and compacting means includes:

means for extracting, from said connection information, a net target which is to be headed by a front on a scan line, said front being a tip portion of a line where any of said wire elements is allocated; and means for scanning said layout area by moving said scan line to said net target extracted from said connection information and moving said front on said scan line to be closer to said extracted net target, thereby obtaining another wire path on the basis of a trace of said front.

8. A compaction method comprising:

a diffusion island setting step of setting a diffusion shared area formed by sharing a diffused area by plural transistors as a diffusion island;

a first abstracting step of abstracting elements such as said diffusion island, a transistor, a resistor, a contact, and a capacitor by using rectangles having terminals at peripheral or inner portions, and abstracting said terminals and wires for connecting said terminals by using wire junctions and wire elements;

a second abstracting step of, in a rectangular layout area where a plurality of said rectangles are disposed, abstracting wire paths connecting said elements by using net targets each having a net identifier for identifying a set of said rectangles to be connected at the same potential on said wire junctions and by using connection information regarding which net targets among said net targets are connected with one another; and a routing and compacting step of connecting and compacting said rectangles on the basis of said net targets and said connection information, wherein said routing and compacting step includes:

a step of extracting, from said connection information, a net target which is to be headed by a front on a scan line, said front being a tip portion of a line where any of said wire elements is allocated; and a step of scanning said layout area by moving said scan line to said net target extracted from said connection information and moving said front on said scan line to be closer to said extracted net target, thereby obtaining another wire path on the basis of a trace of said front, said step of scanning being conducted after said step of extracting.

9. The compaction method of claim 8, wherein said second abstracting step includes a step of setting a virtual line vertical to one side of said layout area, and setting said net targets on said wire junctions and said vertical line.

10. The compaction method of claim 8, wherein said routing and compacting step further includes:
- a scanning point list generating step of generating a scanning point list by sorting positions of said wire junctions, and positions of one side, which is parallel to said scan line, and the other opposing side of each of said rectangles for determining an order of scanning by said scan line:
- a wire element adding step of moving said scan line in a direction vertical to said scan line in accordance with said scanning point list, moving said front on said scan line to be closer to said net target extracted from said connection information, compacting a straight line formed between corresponding one of said wire junctions and said moved front in a direction toward a scanning start point which is first scanned by said scan line, and providing said straight line as a wire element;
- in a case where two fronts on said scan line are to be proceeded to the same direction, a step of merging said two fronts to be connected with each other, compacting, in the direction toward the scanning start point, a straight line formed by connecting said two fronts, and providing said compacted straight line as a wire element;
- in a case where said scan line scans any of said wire junctions, a step of providing a new front on said wire junction, providing a wire element extending toward a net target traced by said new front, and eliminating said front not required any more extension of said wire element;
- in a case where said scan line scans one of the sides, which is closer to the scanning start point, of any of said rectangles, said rectangle is included in said diffusion island including plural composing elements, and said side closer to the scanning start point is closer to the scanning start point than other composing elements of said diffusion island, a diffusion island inner layout generating step of generating a layout pattern within said diffusion island;
- a diffusion island inner compacting step of compacting said layout pattern within said diffusion island in the direction toward the scanning start point;
- in a case where said scan line scans one of the sides, closer to the scanning start point, of any of said rectangles and said rectangle represents a single transistor or any of said elements, a rectangle compacting step of compacting said rectangle in the direction toward the scanning start point; and
- in a case where said scan line scans the other side, which is farther from the scanning start point, of said rectangle, a layout inhibited area setting step of setting said rectangle as a layout inhibited area.

11. The compaction method of claim 10, wherein said diffusion island in said diffusion island setting step includes, as the composing elements, a gate, a diffused area, a diffusion contact provided in said diffused area and an upper wire area for a wire on an upper layer, and said diffusion island inner layout generating step includes:
- a step of abstracting said diffusion island by using rectangles formed by abstracting each one side of said gate and said diffused area, each of the other opposing sides of said gate and said diffused area, said diffusion contact, and a vertical component of said upper wire area against said scan line; and
- a step of successively compacting the composing elements in the direction toward the scanning start point in an order from one composing element closest to the scanning start point in accordance with design rules.

12. The compaction method of claim 10, wherein said diffusion island in said diffusion island setting step includes, as the composing elements, plural rectangles representing a gate, a diffused area and a diffusion contact provided in said diffused area, said diffusion island inner layout generating step includes:
- a step of successively compacting said plural rectangles in the direction toward the scanning start point in an order from one rectangle closest to the scanning start point in accordance with design rules; and
- in a case where said scan line scans any of said rectangles of said diffusion island and a design rule error occurs between said rectangle scanned by said scan line and a wire around said diffusion island, a step of moving said rectangle scanned by said scan line and other rectangles disposed on a side farther from the scanning start point by the same distance in the direction away from the scanning start point, thereby solving the design rule error.

13. The compaction method of claim 10, wherein said diffusion island in said diffusion island setting step includes, as the composing elements, plural rectangles representing a gate, a diffused area and a diffusion contact provided in said diffused area, said routing and compacting step includes a storage step of storing procedures and results of each of said respective steps, and said diffusion island inner layout generating step includes:
- a step of successively compacting said plural rectangles in the direction toward the scanning start point in an order from one rectangle closest to the scanning start point in accordance with design rules; and
- in a case where said scan line scans any of said rectangles of said diffusion island and a design rule error occurs between said rectangle scanned by said scan line and a wire around said diffusion island, a step of retroacting, on the basis of the procedures and the results stored in said storage step, said storage step to a time point where the design rule error is solved by increasing an area of one rectangle representing said diffused area connected with a power supply line, and moving one rectangle scanned by said scan line at the retroacted time point and other rectangles disposed on a side farther from the scanning start point in a direction away from the scanning start point by the same distance.

14. A compaction apparatus comprising:

diffusion island setting means for setting a diffusion shared area formed by sharing a diffused area by plural transistors as a diffusion island;

first abstracting means for abstracting elements such as said diffusion island, a transistor, a resistor, a contact and a capacitor by using rectangles having terminals at peripheral or inner portions, and abstracting said terminals and wires for connecting said terminals by using wire junctions and wire elements;

second abstracting means for, in a rectangular layout area where a plurality of said rectangles are disposed, abstracting wire paths connecting said elements by using net targets each having a net identifier for identifying a set of said rectangles to be connected at the same potential on said wire junctions and by using connection information regarding which net targets among said net targets are connected with one another; and routing and compacting means for connecting and compacting said rectangles on the basis of said net targets and said connection information, wherein said routing and compacting means includes:

means for extracting, from said connection information, a net target which is to be headed by a front on a scan line, said front being, a tip portion of a line where any of said wire elements is allocated; and means for scanning said layout area by moving said scan line to said net target extracted from said connection information and moving said front on said scan line to be closer to said extracted net target, thereby obtaining another wire path on the basis of a trace of said front.

15. A compaction method comprising:

a first abstracting step of abstracting elements by using rectangles respectively having terminals, and abstracting said terminals and wires connecting said terminals by using wire junctions and wire elements;

a second abstracting step of, in a layout area where a plurality of said rectangles are disposed, abstracting rough wire paths obtained by connecting said elements by using net targets each composed of an aggregation of some of said wire junctions which are to be connected at the same potential and by using positional relationships among said net targets; and a routing and compacting step of connecting and compacting said rectangles on the basis of said net targets and said positional relationships, wherein said routing and compacting step comprises:

a step of scanning said layout area by moving a scan line to any of said net targets and moving a front on said scan line to be closer to said net target, thereby obtaining complete wire paths on the basis of a trace of said front, and in a case where said scan line is located on one of the sides, which is closer to the scanning start point, of any of said rectangles, said routing and compacting step further includes a rectangle compacting step of compacting said rectangle in a direction toward the scanning start point.

16. The compaction method of claim 15, wherein said routing and compacting step further comprises:

a step of generating a scanning point list by sorting positions of said wire junctions, and positions of one side, which is parallel to said scan line, and the other opposing side of each of said rectangles for determining an order of scanning by said scan line;

a step of moving said scan line in a direction vertical to said scan line in accordance with said scanning point list, moving said front on said scan line to be closer to said net target, compacting a straight line formed between corresponding one of said wire junctions and said moved front in a direction toward a scanning start point which is first scanned by said scan line, and providing said straight line as a wire element;

in a case where two fronts on said scan line are to be proceeded to the same direction, a step of merging said two fronts to be connected with each other, compacting, in the direction toward the scanning start point, a straight line formed by connecting said two fronts, and providing said compacted straight line as a wire element;

in a case where said scan line is located on any of said wire junctions, a step of providing a new front on said wire junction, providing a wire element extending toward a net target traced by said new front, and eliminating said front not required any more extension of said wire element; and in a case where said scan line is located on the other side, which is farther from the scanning start point, of any of said rectangles, a step of setting said rectangle as a layout inhibited area.

17. The compaction method of claim 16, wherein said routing and compacting step further comprises:

in a case where said scan line is located one of the sides, which is closer to the scanning start point, of any of said rectangles, said rectangle is included in a diffusion island defining a diffused area of a transistor, and said side closer to the scanning start point is closer to the scanning start point than other composing elements of said diffusion island, a diffusion island inner layout generating step of generating a layout pattern within said diffusion island; and a diffusion island inner compacting step of compacting said layout pattern within said diffusion island in the direction toward the scanning start point.

18. The compaction method of claim 17, wherein said diffusion island includes, as the composing elements, plural rectangles representing a gate, a diffused area and a diffusion contact provided in said diffused area, and said diffusion island inner compacting step includes;

a step of successively compacting said plural rectangles in the direction toward the scanning start point in an order from one rectangle closest to the scanning start point in accordance with design rules; and in a case where said scan line is located on any of said rectangles of said diffusion island and a design rule error occurs between said rectangle scanned by said scan line and a wire around said diffusion island, a step of moving said rectangle scanned by said scan line and other rectangles disposed on a side farther from the scanning start point by the same distance in the direction away from the scanning start point, thereby solving the design rule error.

19. The compaction method of claim 17, wherein said diffusion island includes, as the composing elements, plural rectangles representing a gate, a diffused area and a diffusion contact provided in said diffused area, said routing and compacting step further includes a storage step of storing procedures and results of each of said respective steps, and said diffusion island inner compacting step comprises:

a step of successively compacting said plural rectangles in the direction toward the scanning start point in an order from one rectangle closest to the scanning start point in accordance with design rules; and in a case where said scan line is located on any of said rectangles of said diffusion island and a design rule error occurs between said rectangle scanned by said scan line and a wire around said diffusion island, a step of retroacting, on the basis of the procedures and the results stored in said storage step, said storage step to a time point where the design rule error is solved by increasing an area of one rectangle representing said diffused area connected with a power supply line, and moving one rectangle scanned by said scan line at the retroacted time point and other rectangles disposed on a side farther from the scanning start point in a direction away from the scanning start point by the same distance.

20. A compaction apparatus comprising;

a first abstracting means of abstracting elements by using rectangles respectively having terminals, and abstracting said terminals and wires connecting said terminals by using wire junctions and wire elements;

a second abstracting means of, in a layout area where a plurality of said rectangles are disposed, abstracting rough wire paths obtained by connecting said elements by using net targets each composed of an aggregation of some of said wire junctions which are to be connected at the same potential and by using positional relationships among said net targets; and a routing and compacting means of connecting and compacting said rectangles on the basis of said net targets and said positional relationships, wherein said routing and compacting means comprises:
  a means of scanning said layout area by moving a scan line to any of said net targets and moving a front on said scan line to be closer to said net target, thereby obtaining complete wire paths on the basis of a trace of said front, and
  wherein in a case where said scan line is located on one of the sides, which is closer to the scanning start point, of any of said rectangles, said routing and compacting means further includes a rectangle compacting means of compacting said rectangle in a direction toward the scanning start point.

21. A routing method comprising:

a first abstracting step of abstracting elements by using rectangles respectively having terminals, and abstracting said terminals and wires connecting said terminals by using wire junctions and wire elements;

a second abstracting step of, in a layout area where a plurality of said rectangles are disposed, abstracting rough wire paths connecting obtained by said elements by using net targets each composed of an aggregation of some of said wire junctions which are to be connected at the same potential and by using positional relationships among said net targets; and a routing step of connecting said rectangles on the basis of said net targets and said positional relationships, wherein said routing step comprises:
  a step of scanning said layout area by moving a scan line to any of said net targets and moving a front on said scan line to be closer to said net target, thereby obtaining complete wire paths on the basis of a trace of said front.

22. A routing apparatus comprising:

a first abstracting means of abstracting elements by using rectangles respectively having terminals, and abstracting said terminals and wires connecting said terminals by using wire junctions and wire elements;

a second abstracting means of, in a layout area where a plurality of said rectangles are disposed, abstracting rough wire paths obtained by connecting said elements by using net targets each composed of an aggregation of some of said wire junctions which are to be connected at the same potential and by using positional relationships among said net targets; and a routing means of connecting said rectangles on the basis of said net targets and said positional relationships, wherein said routing means comprises:
  a means of scanning said layout area by moving a scan line to any of said net targets and moving a front on said scan line to be closer to said net target, thereby obtaining complete wire paths on the basis of a trace of said front.

* * * * *